(12) United States Patent
Huang et al.

(10) Patent No.: US 12,356,870 B2
(45) Date of Patent: Jul. 8, 2025

(54) MEMORY DEVICE

(71) Applicant: Taiwan Semiconductor Manufacturing Company, Ltd., Hsinchu (TW)

(72) Inventors: Yen-Lin Huang, Menlo Park, CA (US); Ming-Yuan Song, Hsinchu (TW); Chien-Min Lee, Hsinchu County (TW); Shy-Jay Lin, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/355,385

(22) Filed: Jul. 19, 2023

(65) Prior Publication Data
US 2023/0363290 A1  Nov. 9, 2023

Related U.S. Application Data

(63) Continuation of application No. 17/355,146, filed on Jun. 22, 2021, now Pat. No. 11,765,984.

(60) Provisional application No. 63/156,949, filed on Mar. 5, 2021.

(51) Int. Cl.
| H10N 52/80 | (2023.01) |
| H10B 61/00 | (2023.01) |
| H10N 50/85 | (2023.01) |
| H10N 52/00 | (2023.01) |
| H10N 52/01 | (2023.01) |

(52) U.S. Cl.
CPC ............. *H10N 52/80* (2023.02); *H10B 61/22* (2023.02); *H10N 50/85* (2023.02); *H10N 52/00* (2023.02); *H10N 52/01* (2023.02)

(58) Field of Classification Search
CPC ........ H10B 61/22; H10B 61/00; H10N 52/80; H10N 52/00; H10N 50/85; H10N 50/80; H10N 52/01; H10N 52/85; H10N 59/00; G11C 11/1673; G11C 11/161; G11C 11/18; G11C 11/15; G11C 11/16; G11C 11/22; G11C 11/5607
See application file for complete search history.

(56) References Cited

U.S. PATENT DOCUMENTS

| 2020/0350364 | A1* | 11/2020 | Wan ...................... H10B 61/22 |
| 2021/0343321 | A1* | 11/2021 | Wang ................... G11C 11/161 |
| 2022/0216396 | A1* | 7/2022 | Huang ................... H10B 61/10 |

* cited by examiner

*Primary Examiner* — Latanya N Crawford Eason
(74) *Attorney, Agent, or Firm* — JCIPRNET

(57) ABSTRACT

A memory device is provided. The memory device includes a substrate, a spin-orbit torque layer and a magnetic tunneling junction (MTJ). The MTJ stacks with the spin-orbit torque layer over the substrate and includes a synthetic free layer, a barrier layer and a reference layer. The synthetic free layer includes a synthetic antiferromagnetic structure, a first spacer layer and a free layer, wherein the synthetic antiferromagnetic structure is disposed between the spin-orbit torque layer and the free layer. The barrier layer is disposed beside the synthetic free layer. The reference layer is disposed beside the barrier layer.

20 Claims, 31 Drawing Sheets

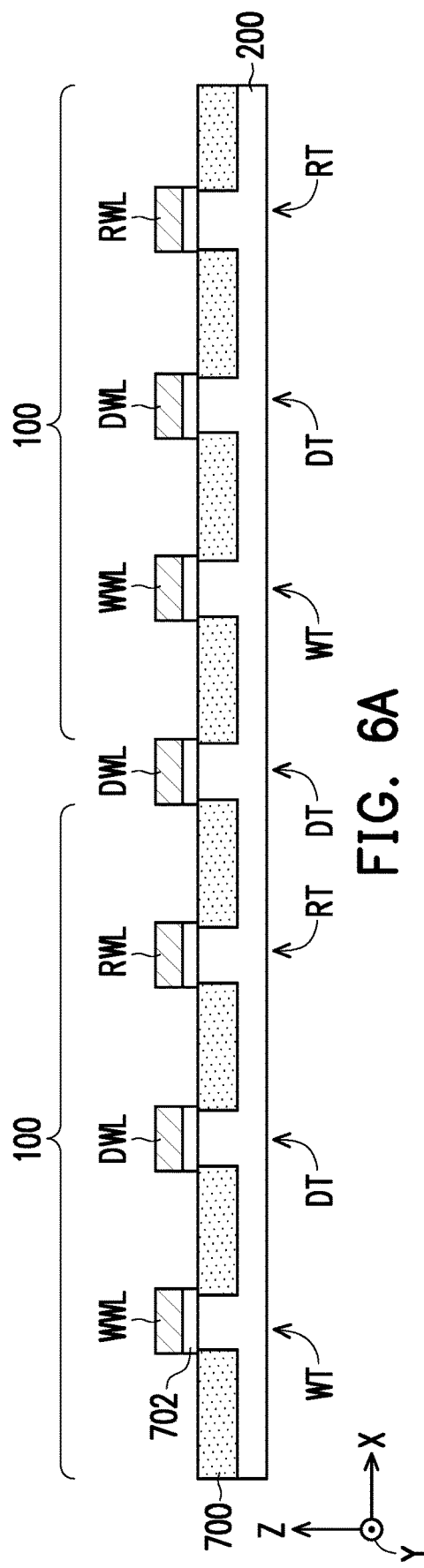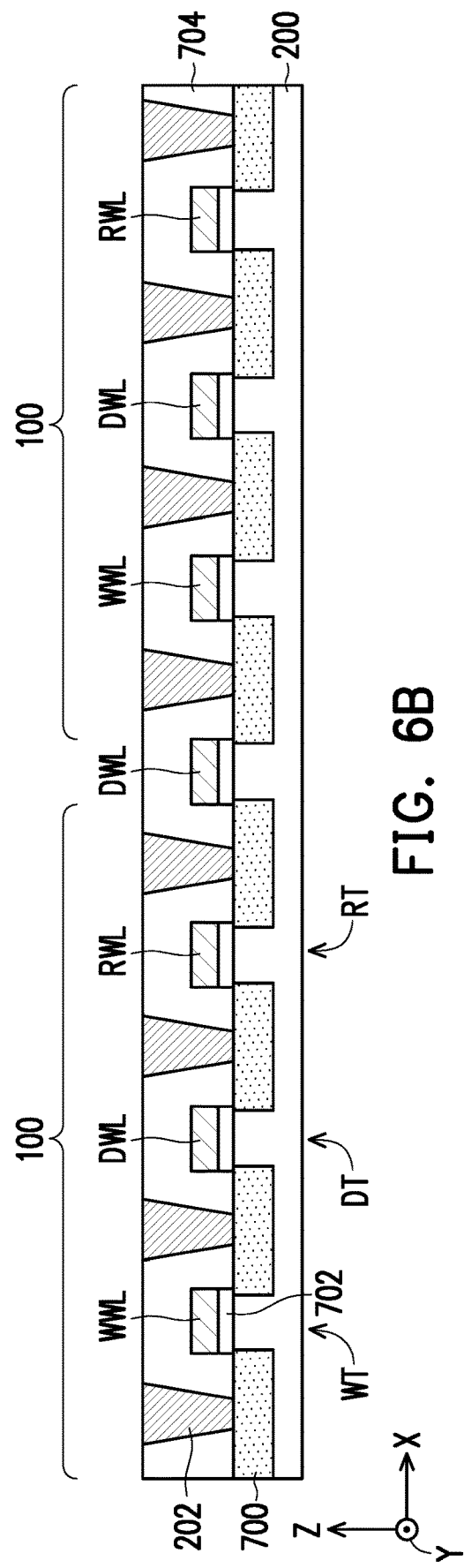

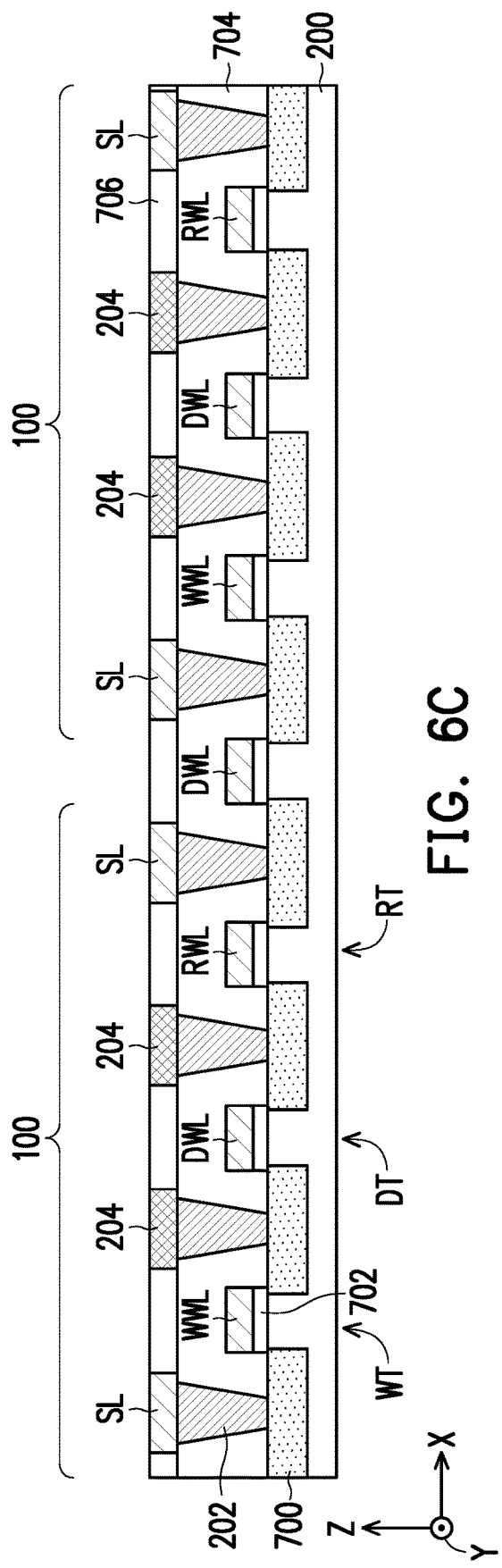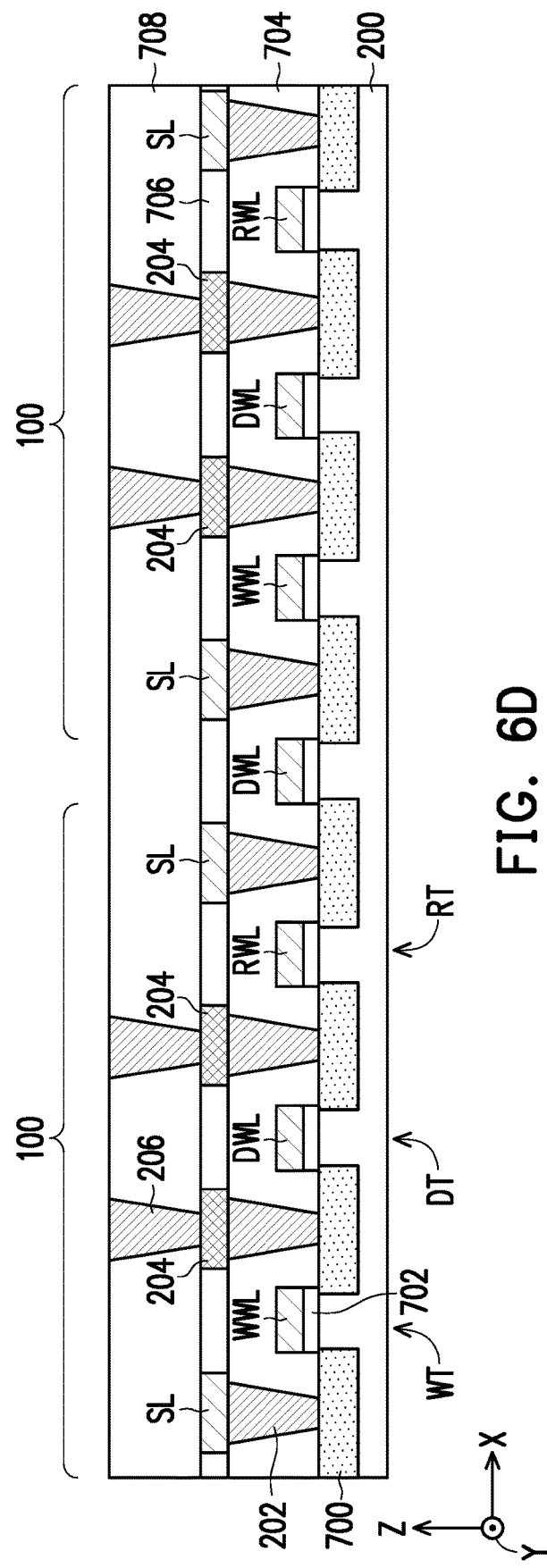

US 12,356,870 B2

MEMORY DEVICE

CROSS-REFERENCE TO RELATED APPLICATION

This application is a continuation application of and claims the priority benefit of U.S. patent application Ser. No. 17/355,146, filed on Jun. 22, 2021. The prior application Ser. No. 17/355,146 claims the priority benefit of U.S. provisional application Ser. No. 63/156,949, filed on Mar. 5, 2021. The entirety of each of the above-mentioned patent applications is hereby incorporated by reference herein and made a part of this specification.

BACKGROUND

Magnetic random access memory (MRAM) is one of the leading candidates for next-generation memory technologies that aim to surpass the performance of various existing memories. MRAM offers comparable performance to volatile static random access memory (SRAM) and comparable density with lower power consumption to volatile dynamic random access memory (DRAM). As compared to non-volatile flash memory, MRAM offers much faster access speed and suffers minimal degradation over time. Spin orbit torque MRAM (SOT-MRAM) is a type of MRAM. As compared to spin transfer torque MRAM (STT-MRAM), which is another type of MRAM, SOT-MRAM offers better performance in terms of speed and endurance. Nevertheless, further reducing switching energy of SOT-MRAM is limited.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6A through FIG. 6L are schematic cross-sectional views illustrating intermediate structures during the manufacturing process as shown in FIG. 5.

DETAILED DESCRIPTION

Figure 1A:
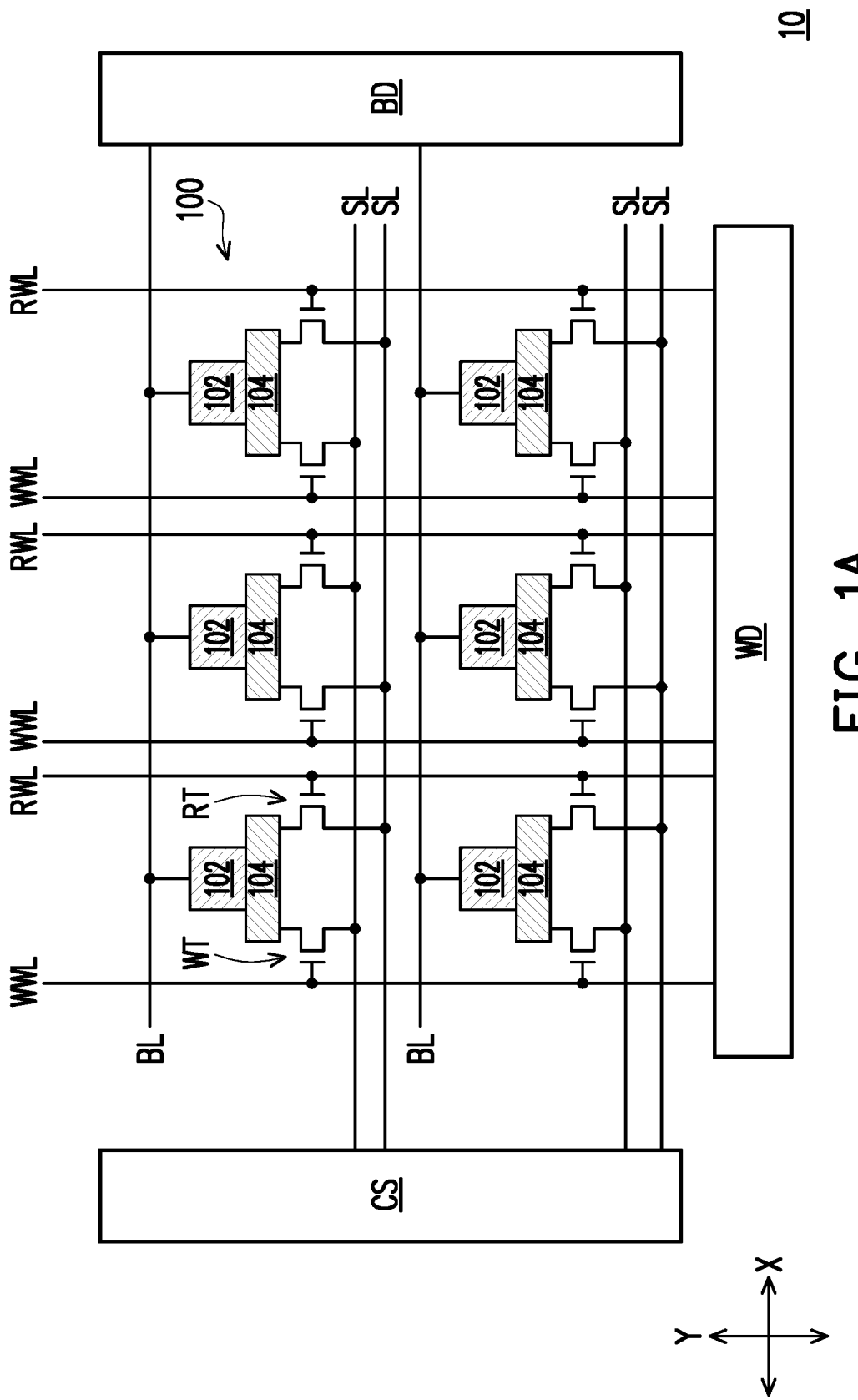
FIG. 1A is a circuit diagram schematically illustrating a memory array according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
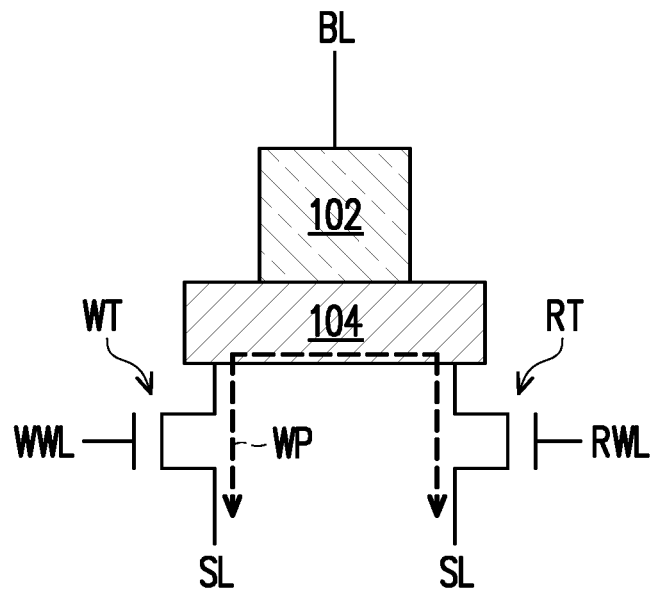
FIG. 1B illustrates a write path in a selected unit cell in the memory array as shown in FIG. 1A.
Figure 1C:
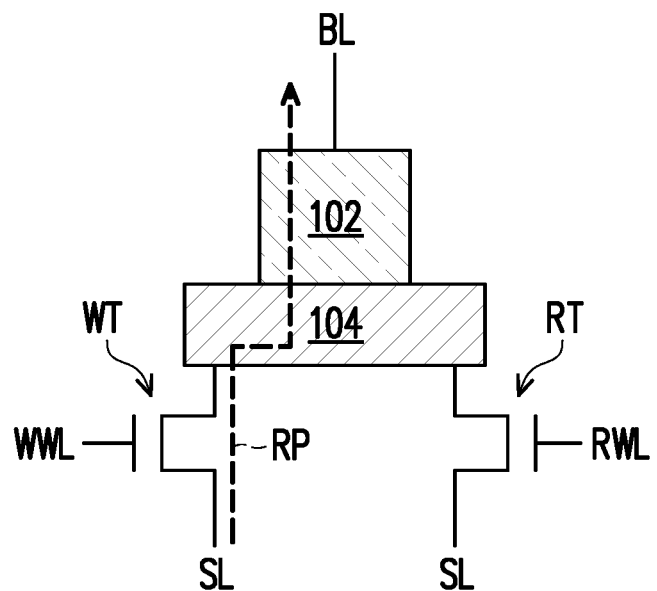
FIG. 1C illustrates a read path in a selected unit cell in the memory array as shown in FIG. 1A.

FIG. 1A is a circuit diagram schematically illustrating a memory array 10 according to some embodiments of the present disclosure. FIG. 1B illustrates a write path in a selected unit cell 100 in the memory array 10 as shown in FIG. 1A. FIG. 1C illustrates a read path in a selected unit cell 100 in the memory array 10 as shown in FIG. 1A.

Referring to FIG. 1A, the memory array 10 is a magnetic random access memory (MRAM) array. The memory array 10 includes a plurality of the unit cells 100 laterally arranged along rows and columns. In detail, as shown in FIG. 1A, the unit cells 100 in each row are arrange along a direction X, while the unit cells 100 in each column are arranged along a direction Y, wherein the direction X is perpendicular to the direction Y. In some embodiments, each column of the unit cells 100 is coupled with a pair of a write word line WWL and a read word line RWL, and each row of the unit cells 100 is coupled with a bit line BL as well as a pair of source lines SL. In these embodiments, each unit cell 100 may be defined between one of the write word lines WWL and one of the read word lines RWL, and between one of the bit lines BL and two of the source lines SL. In addition, the write word lines WWL and the read word lines RWL may extend along the direction Y, and the bit lines BL as well as the source lines SL may extend along the direction X.

Each unit cell 100 includes a magnetic tunneling junction (MTJ) 102 as a storage element. Magnetization orientations of ferromagnetic layers in the MTJ 102 may determine an electrical resistance of the MTJ 102. The MTJ 102 may have a low electrical resistance state when the magnetization orientations are at a parallel state, and have a high electrical resistance state when the magnetization orientations are at an anti-parallel state. By altering the magnetization orientations in the MTJ 102, the MTJ 102 can be programmed to store complementary logic sates (e.g., a logic high state indicating the high electrical resistance state and a logic low state indicating the low electrical resistance state). Further, according to embodiments of the present disclosure, the MTJ 102 is configured to be programmed by utilizing a spin Hall effect, and the memory array 10 may be referred as a spin orbit torque MRAM (SOT-MRAM) array. A spin orbit torque (SOT) layer 104, or also referred as a spin hall electrode (SHE), vertically lies below each of the MTJs 102. During a programming operation, an in-plane charge current passing through the SOT layer 104 may be converted to a perpendicular spin current via a spin Hall effect. In detail, the in-plane charge current is driven perpendicular to the stacked direction of the SOT layer 104 and the MTJ 102 (i.e., perpendicular to the direction Z in FIG. 2). The perpendicular spin current then flows into a ferromagnetic layer in the MTJ 102 and switch its magnetization via a spin orbit torque (SOT). In this way, the magnetization orientations of the MTJ 102 (i.e., the electrical resistance of the MTJ 102) can be altered, and bit data can be programmed into the MTJ 102. During a read operation, the resistance state of the MTJ 102 can be sensed, and the bit data stored in the MTJ 102 can be read out.

An energy efficiency of the programming operation is highly dependent on a spin Hall conductivity of the SOT layer 104. The higher the spin Hall conductivity of the SOT layer 104, the less power consumption is required for the programming operation. The spin Hall conductivity of the SOT layer 104 is defined as a ratio of a spin Hall angle of the SOT layer 104 over an electrical resistivity of the SOT layer 104. The spin Hall angle of the SOT layer 104 indicates an efficiency of the conversion from the in-plane charge current provided across the SOT layer 104, to the perpendicular spin current induced due to the spin Hall effect, and is defined as a ratio of the induced perpendicular spin current over the corresponding in-plane charge current. In other words, the higher the spin Hall angle, the more efficient of the conversion from the in-plane charge current to the perpendicular spin current, and the higher of the spin Hall conductivity. On the other hand, a shunting ratio of the in-plane charge current is affected by the electrical resistivity of the SOT layer 104. The shunting ratio is defined as a ratio of a sheet resistance of the SOT layer 104 over a sheet resistance of a ferromagnetic layer in the MTJ 102 closest to the SOT layer 104. When the electrical resistivity of the SOT layer 104 is relatively high, a larger portion of the in-plane charge current may take a low resistance path through the MTJ 102 standing on the SOT layer 104, and such portion of the in-plane charge current may not contribute to the generation of the perpendicular spin current. As a result, the conversion from the in-plane charge current to the perpendicular spin current is less efficient. On the other hand, when the electrical resistivity of the SOT layer 104 is relatively low, a shunting ratio of the in-plane charge current becomes lower, and the conversion from the in-plane charge current to the perpendicular spin current is more efficient. Therefore, in order to improve the spin Hall conductivity of the SOT layer 104, the spin Hall angle of the SOT layer 104 has to be high, and/or the electrical resistivity of the SOT layer 104 has to be low.

In some embodiments, the SOT layer 104 includes one or more heavy metals or materials doped by heavy metals. In certain embodiments, Pt, $\alpha$-W, $\beta$-W, $\beta$-Ta, AuPt, $W_3Ta$, $Bi_xSe_y$, BiSeTe, multi-layers thereof, alloys thereof, the like, or combinations thereof is used for the material of the SOT layer 104. In some embodiments, the thickness of the SOT layer 104 ranges from about 3 nm to about 20 nm. The spin Hall angle of the SOT layer 104 may increase as the thickness of the SOT layer 104, and may not saturate until the thickness of the SOT layer 104 is equal to or greater than about 3 nm. Therefore, if the thickness of the SOT layer 104 is below about 3 nm, the spin Hall angle of the SOT layer 104 may be limited. On the other hand, if the thickness of the SOT layer 104 is greater than about 20 nm, requirement of the charge current for a programming operation is significantly increased, thus energy efficiency of the programming operation is compromised.

As shown in FIG. 1A, in some embodiments, each unit cell 100 further includes a write transistor WT and a read transistor RT. The write transistor WT and the read transistor RT in each unit cell 100 are coupled with the SOT layer 104. Particularly, the write transistor WT and the read transistor RT may be coupled with portions of the SOT layer 104 at opposite sides of the MTJ 102, such that the MTJ 102 can stand on a write current path (i.e., the in-plane charge current described above) between the write transistor WT and the read transistor RT. Accordingly, the MTJ 102 can be programmed by the write current. The write transistors WT and the read transistors RT may respectively be a three-terminal device. A gate terminal of each write transistor WT may be coupled with one of the write word lines WWL, and a gate terminal of each read transistor RT may be coupled with one of the read word lines RWL. In addition, the write transistor WT and the read transistor RT in each unit cell 100 are respectively coupled with the SOT layer 104 through a source/drain terminal, and respectively coupled with one of the source lines SL through the other source/drain terminal. In some embodiments, the write transistor WT and the read transistor RT in each unit cell 100 are coupled with two of the source lines SL. Further, a terminal of each MTJ 102 is coupled with the underlying SOT layer 104, and the other terminal of each MTJ 102 is coupled with one of the bit lines BL.

A word line driver circuit WD may be coupled with the write word lines WWL and the read word lines RWL, and configured to control switching of the write transistors WT and the read transistors RT through the write word lines WWL and the read word lines RWL. In addition, a current source circuit CS may be coupled with the source lines SL. The current source circuit CS is configured to provide the write current (i.e., the in-plane charge current described above) for programming the MTJs 102 as well as a read current for sensing the resistance states of the MTJs 102, and may be in conjunction with the word line driver circuit WD. Further, a bit line driver circuit BD may be coupled with the bit lines BL, and configured to sense the read current passing through the MTJs 102, so as to identify the resistance states of the MTJs 102.

Referring to FIG. 1A and FIG. 1B, during a programming operation, the write transistor WT and the read transistor RT of a selected unit cell 100 are both turned on, and a write current WP (i.e., the in-plane charge current as described above) may flow through the write transistor WT, the read transistor RT and the SOT layer 104 therebetween. As a result of spin orbit interaction, the write current WP flowing through the SOT layer 104 may induce a SOT on the MTJ 102, thus the MTJ 102 can be subjected to programming. The write transistor WT and the read transistor RT are turned on by setting the corresponding write word line WWL and read word line RWL, and the write current WP is provided by setting a voltage difference between the corresponding two of the source lines SL. On the other hand, the bit line BL may be floated.

Referring to FIG. 1A and FIG. 1C, during a read operation, the read transistor RT of a selected unit cell 100 is turned on while the write transistor WT in the same unit cell 100 may be kept off. A voltage difference may be set between the bit line BL and the source line SL coupled with the read transistor RT, thus a read current RP can flow through the MTJ 102 connected between the read transistor RT and the bit line BL. Due to a spin orbit coupling effect, different magnetization orientations of the MTJ 102 (i.e., the parallel state and the anti-parallel state) may result a change in an amount of scattering of conduction electrons traveling across the MTJ 102. Such change leads to difference electrical resistances of the MTJ 102, and may affect a value of the read current RP or a value of a voltage drop across the MTJ 102. Therefore, the bit data (i.e., the resistance state) stored in the MTJ 102 can be read out. On the other hand, the source line SL coupled with the write transistor WT may be floated.

Figure 2:
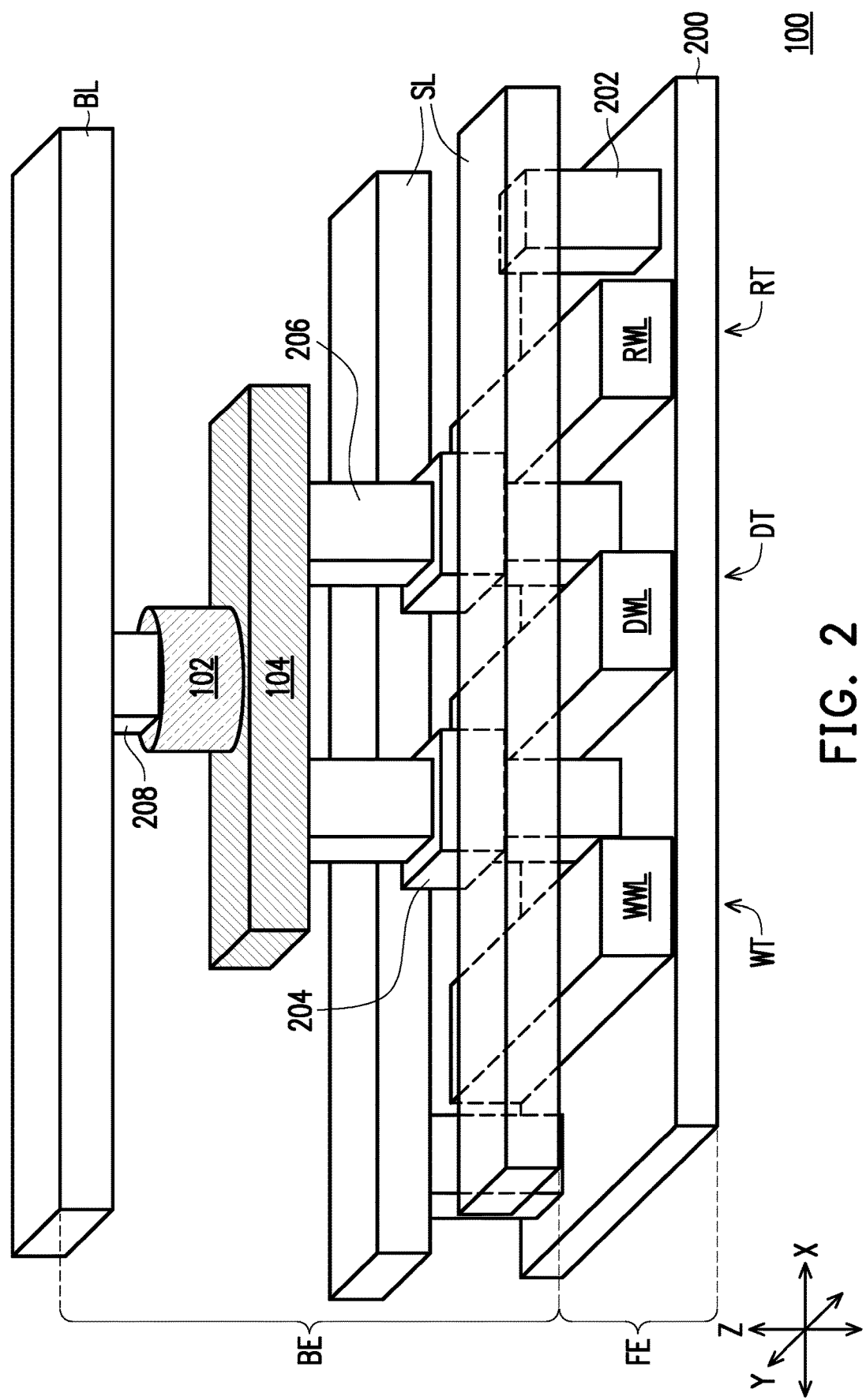
FIG. 2 is a schematic three-dimensional view illustrating one of the unit cells shown in FIG. 1A.

FIG. 2 is a schematic three-dimensional view illustrating one of the unit cells 100 shown in FIG. 1A.

Referring to FIG. 2, the write transistor WT and the read transistor RT in the selected unit cell 100 are formed in a front-end-of-line (FEOL) structure FE of a device wafer. The gate terminal of the write transistor WT may be provided by the write word line WWL lying on a substrate 200. Similarly, the gate terminal of the read transistor RT may be provided by a read word line RWL lying on the substrate 200. In some embodiments, the substrate 200 is a semiconductor substrate. The write word line WWL and the read word line RWL may be laterally spaced apart from each other along the direction X, and may both laterally extend along the direction Y. Source and drain terminals (not shown) of the write transistor WT are located at opposite sides of the write word line WWL, and source and drain terminals (not shown) of the read transistor RT are located at opposite sides of the read word line RWL. In those embodiments where the write transistor WT and the read transistor RT are planar-type transistors, the write word line WWL as well as the read word line RWL respectively lie on a planar surface of the substrate 200, and the source and drain terminals of the write transistor WT and the read transistor RT may be doped regions or epitaxial structures (not shown) formed in a shallow region of the substrate 200. In those embodiments where the write transistor WT and the read transistor RT are fin-type transistors, the write word line WWL and the read word line RWL respectively cover and intersect with a fin structure at a top region of the substrate 200, and the source and drain terminals of the write transistor WT and the read transistor RT may be epitaxial structures (not shown) in contact (e.g., in lateral contact) with the fin structures. In those embodiments where the write transistor WT and the read transistor RT are gate-all-around (GAA) transistors, stacks of semiconductor sheets over the substrate 200 are respectively wrapped by the write word line WWL or the read word line RWL, and the source and drain terminals of the write transistor WT and the read transistor RT may be epitaxial structures (not shown) in contact (e.g., in lateral contact) with the stacks of semiconductor sheets. Furthermore, contact plugs 202 may stand on the source/drain terminals of the write transistor WT and the read transistor RT along the direction Z. The contact plugs 202 are electrically connected with these source/drain terminals, in order connect these source/drain terminals to overlying conductive components.

In some embodiments, a dummy word line DWL lies between the write word line WWL and the read word line RWL. In detail, as shown in FIG. 2, the dummy word line DWL is laterally spaced apart from the write word line WWL and the read word line RWL along the direction X. The dummy word line DWL, the write word line WWL and the read word line RWL may extend along the same direction, such as the direction Y. By disposing the dummy word line DWL, a parasitic transistor may be formed between the write transistor WT and the read transistor RT. The parasitic transistor may be structurally identical with the write transistor WT and the read transistor RT. A gate terminal of the parasitic transistor may be provided by the dummy word line DWL. The write transistor WT and the read transistor RT each share one of its source/drain terminals with the parasitic transistor. In some embodiments, the dummy word line DWL is configured to receive a gate voltage that can ensure an off state of the parasitic transistor, thus the interference between the write transistor WT and the read transistor RT can be effectively avoided. Accordingly, the parasitic transistor including the dummy word line DWL may also be referred as an isolation transistor DT.

The source lines SL, the SOT layer 104, the MTJ 102 and the bit line BL may be integrated in a back-end-of-line (BEOL) structure BE formed above the FEOL structure FE. In some embodiments, the source lines SL coupled with the write transistor WT and the read transistor RT are portions of a bottom metallization layer in the BEOL structure BE, and may extend along the direction X. The source lines SL are connected with some of the source/drain terminals of the write transistor WT and the read transistors RT through the contact plugs 202 vertically extending in between. In some embodiments, others source/drain terminals of the write transistor WT and the read transistor RT are connected with landing pads 204, also formed in the bottom metallization layer of the BEOL structure BE, by the contact plugs 202 vertically extending in between. Moreover, the SOT layer 104 and the MTJ 102 may be formed over the bottom metallization layer. The SOT layer 104 may be electrically connected with the landing pads 204 in the bottom metallization layer by bottom vias 206 vertically extending in between. In other words, the SOT layer 104 may be coupled with source or drain terminals of the write transistor WT and the read transistor RT through the underlying bottom vias 206, landing pads 204 and contact plugs 202. The MTJ 102 stands or stacks on the SOT layer 104 along the direction Z, and may be located between the bottom vias 206, so as to be standing on a path of the write current flowing between the bottom vias 206. In some embodiments, as shown in FIG. 2, the SOT layer 104 extends beyond the edges of the corresponding bottom vias 206. However, the disclosure is not limited thereto. In some alternative embodiments, the edge of the SOT layer 104 is aligned with the edges of the corresponding bottom vias 206. Further, the bit line BL may be formed in another metallization layer over the MTJ 102, and may extend along the direction X. In some embodiments, the bit line BL is electrically connected with the MTJ 102 through a top via 208 vertically extending in between.

FIG. 3A through FIG. 3E are schematic cross-sectional views respectively illustrating a MTJ standing on a spin-orbit torque layer, according to some embodiments of the present disclosure.

Figure 3A:
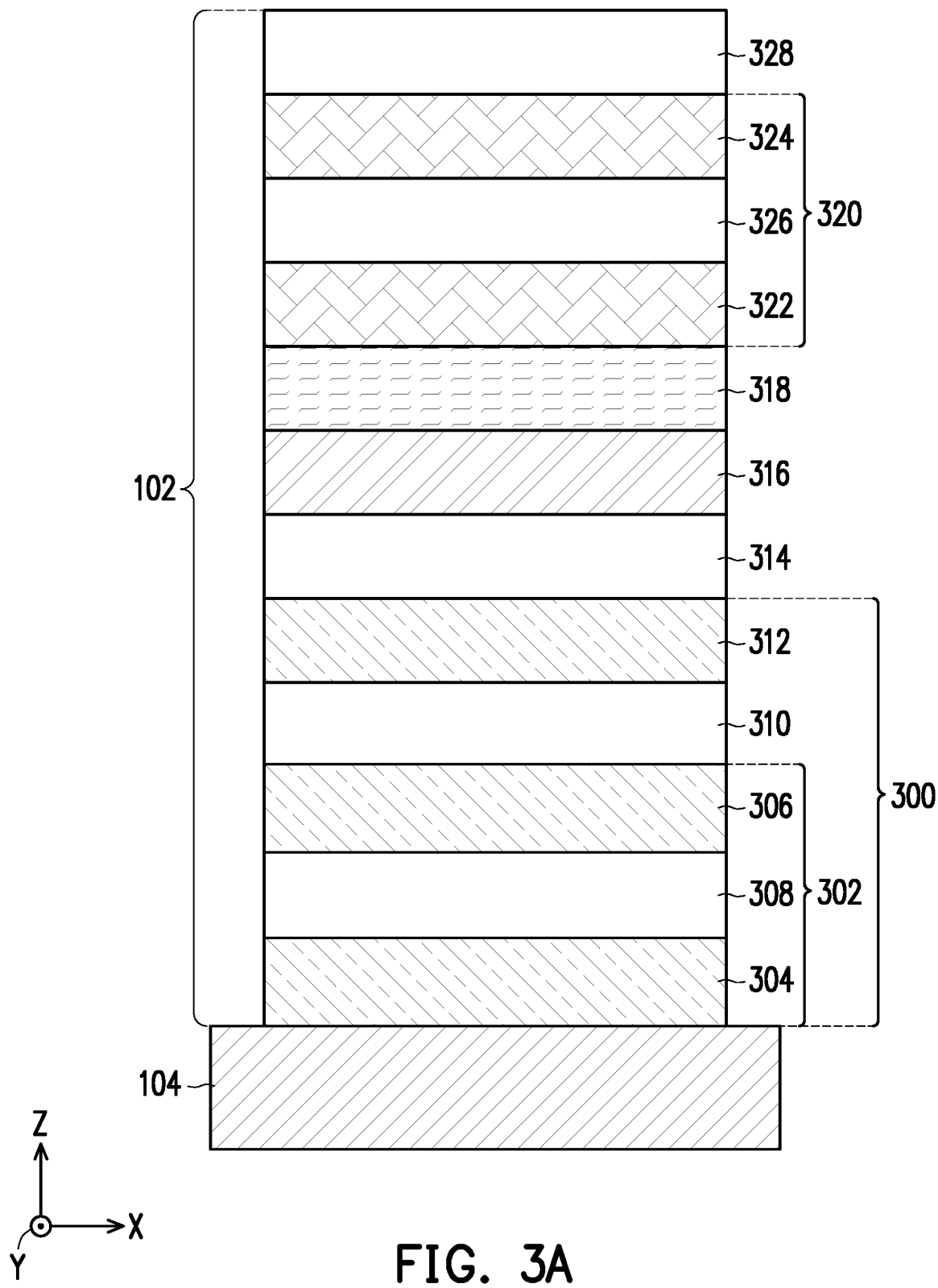
FIG. 3A through FIG. 3E are schematic cross-sectional views respectively illustrating a magnetic tunneling junction (MTJ) standing on a spin-orbit torque layer, according to some embodiments of the present disclosure.

Referring to FIG. 3A, the MTJ 102 standing on the SOT layer 104 along the direction Z may be a multilayer structure, and at least includes a synthetic free layer 300, a reference layer 316 and a barrier layer 314 sandwiched between the synthetic free layer 300 and the reference layer 316.

In some embodiments, the MTJ 102 includes a dielectric layer (e.g., barrier layer 314) sandwiched between a magnetic fixed layer (e.g., reference layer 316) which has a fixed or a "pinned" magnetization orientation and a magnetic free layer (e.g., synthetic free layer 300) which has a variable or "free" magnetization orientation. Due to the tunnel magnetoresistance effect, the resistance value between the reference layer 316 and the synthetic free layer 300 changes with the magnetization orientation switch in the synthetic free layer 300. In some embodiments, if the magnetization directions of the reference layer 316 and the synthetic free layer 300 are in a parallel relative orientation, it is more likely that charge carriers (e.g., electrons) will tunnel through the barrier layer 314, such that the MTJ 102 is in a low electrical resistance state. Conversely, in some embodiments, if the magnetization directions of the reference layer 316 and the synthetic free layer 300 are in an anti-parallel orientation, it is less likely that charge carriers (e.g., electrons) will tunnel through the barrier layer 314, such that the MTJ 102 is in a high electrical resistance state. The two states of the resistance values are considered as two logic states "1" or "0" that are stored in the unit cell 100. That is, within the MTJ 102, the synthetic free layer 300 acts as a state-keeping layer, and its magnetic state determines the state of the corresponding unit cell 100.

In some embodiments, the reference layer 316 is formed over the SOT layer 104. In some embodiments, the reference layer 316 is a ferromagnetic layer of which the magnetization direction does not change. In some embodiments, the reference layer 316 includes one or more of Fe, Co, Ni, an iron-cobalt (FeCo) alloy, a cobalt-nickel (CoNi) alloy, a cobalt-iron-boron (CoFeB) alloy, an iron-boron (FeB) alloy, an iron-platinum (FePt) alloy, an iron-palladium (FePd) alloy and a suitable ferromagnetic material. In certain embodiments, the reference layer 316 includes the CoFeB alloy. In some embodiments, the thickness of the reference layer 316 ranges from about 1 nm to about 3 nm. The thickness of the reference layer 316 may depend on whether a perpendicular direction (e.g., the direction Z) or an in-plane preferred direction (e.g., the direction X or the direction Y) for the stable magnetic states is desired. In some embodiments, the reference layer 316 has a body-centered-cubic (bcc) structure with (100) orientation.

In some embodiments, the barrier layer 314 is formed under the reference layer 316 and between the synthetic free layer 300 and the reference layer 316. In some embodiments, the barrier layer 314 is a dielectric layer that provides isolation between the synthetic free layer 300 and the reference layer 316, while being thin enough to be tunneled through by the read current. In addition, in some cases, controlling the thickness of the barrier layer 314 may control the resistance of the MTJ 102. For example, a thicker barrier layer 314 may increase the resistance of the MTJ 102. In some embodiments, the performance of the unit cell 100 can be improved by controlling the resistance of the MTJ 102 to match the parasitic resistance of the circuit(s) connected to the unit cell 100. In some cases, matching the resistances in this manner can increase the ranges of operational conditions over which the unit cell 100 can be read. In some embodiments, the thickness of the barrier layer 314 ranges from about 0.8 nm to about 3.2 nm. In some embodiments, the barrier layer 314 includes magnesium oxide, aluminum oxide, aluminum nitride, the like or combinations thereof. In certain embodiments, the barrier layer 314 includes magnesium oxide. In further embodiments, the barrier layer 314 has a bcc structure with (100) orientation.

In some embodiments, the synthetic free layer 300 is formed between the SOT layer 104 and the barrier layer 314. In some embodiments, as shown in FIG. 3A, the synthetic free layer 300 includes a synthetic antiferromagnetic structure 302, a spacer layer 310 and a free layer 312. In detail, the synthetic antiferromagnetic structure 302 is disposed between the SOT layer 104 and the free layer 312, and the spacer layer 310 is disposed between the synthetic antiferromagnetic structure 302 and the free layer 312. That is, the synthetic antiferromagnetic structure 302, the spacer layer 310 and the free layer 312 are sequentially stacked on the SOT layer 104 along the direction Z.

In some embodiments, the free layer 312 is a ferromagnetic layer having a magnetization direction that is switchable. In some embodiments, the magnetization direction of the free layer 312 is switchable in the horizontal axis, such as along the direction X or the direction Y. In some alternative embodiments, the magnetization direction of the free layer 312 is switchable in the perpendicular axis, such as along the direction Z. The switching of the magnetization direction in the free layer 312 is driven by the spacer layer 310 via RKKY coupling (see below for more detail on the spacer layer 310).

In some embodiments, the free layer 312 is formed of a material with high saturation magnetization (Ms). In some embodiments, the saturation magnetization of the free layer 312 ranges from about 1100 eum/cm$^3$ to about 1600 eum/cm$^3$. In some embodiments, the free layer 312 is formed of one or more ferromagnetic materials, such as a cobalt-iron-boron (CoFeB) alloy, a cobalt-palladium (CoPd) alloy, a cobalt-iron (CoFe) alloy, a cobalt-iron-boron-tungsten (CoFeBW) alloy, a nickel-iron (NiFe) alloy, ruthenium (Ru), the like or combinations thereof. In certain embodiments, the free layer 312 is formed of the CoFeB alloy. In such embodiments, the CoFeB alloy may be presented as $Co_xFe_yB_{1-x-y}$, wherein $0.1<x<0.4$; $0.5<y<0.8$. In other embodiments, the free layer 312 includes multiple layers of different materials, such as a layer of Ru between two layers of the CoFeB alloy, though other configurations of layers or materials may be used. In some embodiments, the reference layer 316 has the same material composition as the free layer 312. In some embodiments, the thickness of the free layer 312 ranges from about 0.5 nm to about 5 nm. The thickness of the free layer 312 may depend on whether a perpendicular direction (e.g., the direction Z) or an in-plane preferred direction (e.g., the direction X or the direction Y) for the stable magnetic states is desired. For example, the free layer 312 having an in-plane magnetic anisotropy (IMA) may have a thickness between about 1 nm and about 5 nm, or the free layer 312 having a perpendicular-to-plane magnetic anisotropy (PMA) may have a thickness between about 0.5 nm and about 1 nm. In further embodiments, the free layer 312 has a body-centered-cubic (bcc) structure with (100) orientation.

In some embodiments, the synthetic antiferromagnetic (SAF) structure 302 includes one or more spacer layers each sandwiched between two ferromagnetic layers. For example, as shown in FIG. 3A, the SAF structure 302 includes a ferromagnetic layer 304, a ferromagnetic layer 306 and a spacer layer 308 between the ferromagnetic layer 304 and the ferromagnetic layer 306, i.e., two ferromagnetic layers and one spacer layer. Specifically, in such case, the ferromagnetic layer 304, the spacer layer 308, the ferromagnetic layer 306, the spacer layer 310 and the free layer 312 together form the penta-layered synthetic free layer 300. However, the disclosure is not limited thereto. In some alternative embodiments, the SAF structure 302 may include ferromagnetic layers and spacer layers stacked alternately along the direction Z. In some embodiments, as shown in FIG. 3A, the ferromagnetic layer 304, the spacer layer 308 and the ferromagnetic layer 306 are sequentially and vertically stacked on the SOT layer 104.

In some embodiments, the spacer layer 308 induces RKKY coupling between the ferromagnetic layer 304 and the ferromagnetic layer 306, such that the ferromagnetic layer 304 and the ferromagnetic layer 306 are antiferromagnetically coupled with each other. As such, while the ferromagnetic layer 304 has a first magnetization direction, the ferromagnetic layer 306 has a second magnetization direction antiparallel to the first magnetization direction. Such spacer layer 308 may also be referred to as an exchange coupling layer or an antiferromagnetically coupling layer in some examples. In some embodiments, the spacer layer 308 is a non-magnetic metal layer. In some embodiments, the spacer layer 308 includes Ru, W, vanadium (V), titanium (Ti), a combination of the foregoing, or the like. In some embodiments, the thickness of the spacer layer 308 ranges from about 0.2 nm to about 1.5 nm to provide the antiferromagnetic coupling.

In some embodiments, each of the ferromagnetic layer 304 and the ferromagnetic layer 306 has a magnetization direction that is switchable. In some embodiments, the magnetization direction of each of the ferromagnetic layer 304 and the ferromagnetic layer 306 is switchable in the horizontal axis, such as along the direction X or the direction Y. In some alternative embodiments, the magnetization direction of each of the ferromagnetic layer 304 and the ferromagnetic layer 306 is switchable in the perpendicular axis, such as along the direction Z. The switching of the magnetization direction in the ferromagnetic layer 304 is driven by the spin Hall effect as described above, and the switching of the magnetization direction in the ferromagnetic layer 306 is driven by the spacer layer 308 via RKKY coupling.

In some embodiments, each of the ferromagnetic layer 304 and the ferromagnetic layer 306 is formed as having low saturation magnetization (Ms). In some embodiments, the saturation magnetization of each of the ferromagnetic layer 304 and the ferromagnetic layer 306 ranges from about 550 eum/cm$^3$ to about 1150 eum/cm$^3$. In some embodiments, the saturation magnetization of the ferromagnetic layer 304 is substantially equal to the saturation magnetization of the ferromagnetic layer 306. In some embodiments, as shown in FIG. 3A, each of the ferromagnetic layer 304 and the ferromagnetic layer 306 is a single layer. In such embodiments, each of the ferromagnetic layer 304 and the ferromagnetic layer 306 includes a cobalt-chromium alloy or a cobalt-iron-nickel alloy. In embodiments where each of the ferromagnetic layer 304 and the ferromagnetic layer 306 includes a cobalt-chromium alloy, the cobalt-chromium alloy may be $Co_{1-x}Cr_x$ wherein $0.05<x<0.2$. If the "x" in the $Co_{1-x}Cr_x$ is greater than or equal to about 0.2, the cobalt-chromium alloy becomes paramagnetic material thus lose its magnetic coupling strength; and/or if the "x" in the $Co_{1-x}Cr_x$ is less than or equal to about 0.05, the cobalt-iron-nickel alloy layer exhibits high saturation magnetization resulting in high switching current. In embodiments where each of the ferromagnetic layer 304 and the ferromagnetic layer 306 includes a cobalt-iron-nickel alloy, the cobalt-iron-nickel alloy may be $Co_x$—$Fe_y$—$Ni_z$, wherein x<0.5, y<0.3, z>0.5. If in $Co_x$—$Fe_y$—$Ni_z$, the "x" is greater than or equal to about 0.5, the "y" is greater than or equal to about 0.3, and/or the "z" is less than or equal to about 0.5, the cobalt-iron-nickel alloy layer exhibits high saturation magnetization resulting in high switching current. In some embodiments, the material of the ferromagnetic layer 304 is the same as the material of the ferromagnetic layer 306. However, the disclosure is not limited thereto. In some alternative embodiments, as long as the saturation magnetization of the ferromagnetic layer 304 is substantially equal to the saturation magnetization of the ferromagnetic layer 306, the material of the ferromagnetic layer 304 may be different from the material of the ferromagnetic layer 306. In some embodiments, the thickness of each of the ferromagnetic layer 304 and the ferromagnetic layer 306 ranges from about 0.5 nm to about 2.5 nm. The thickness of each of the ferromagnetic layer 304 and the ferromagnetic layer 306 may depend on whether a perpendicular direction (e.g., the direction Z) or an in-plane preferred direction (e.g., the direction X or the direction Y) for the stable magnetic states is desired. Further, the ferromagnetic layer 304, the spacer layer 308 and the ferromagnetic layer 306 included in the SAF structure 302 each may be formed with a crystalline structure similar to or identical with an expected crystalline structure (e.g., bcc structure) of the overlying free layer 312, so as to provide a preferable growth template for the overlying free layer 312. Accordingly, the overlying free layer 312 may be formed with improved crystallinity.

The spacer layer 310 induces RKKY coupling between the free layer 312 and the ferromagnetic layer 306 of the SAF structure 302, such that the ferromagnetic layer 306 and the free layer 312 are antiferromagnetically coupled with each other. As such, the magnetization direction of the free layer 312 is opposite to that of the ferromagnetic layer 306 due to the antiparallel exchange coupling provided by the spacer layer 310. That is to say, the SAF structure 302 is configured to alter the magnetization direction of the free layer 312 by exchange coupling induced by spacer layer 310. Also, such spacer layer 310 may be referred to as an exchange coupling layer or an antiferromagnetically coupling layer in some examples. In some embodiments, the spacer layer 310 is a non-magnetic metal layer. In some embodiments, the spacer layer 310 includes Ru, W, V, Ti, a combination of the foregoing, or the like. In some embodiments, the material of the spacer layer 310 is the same as the material of the spacer layer 308. In some alternative embodiments, the material of the spacer layer 310 is different from the material of the spacer layer 308. In some embodiments, the thickness of the spacer layer 310 ranges from about 0.2 nm to about 1.5 nm to provide the antiferromagnetic coupling.

By utilizing the synthetic free layer 300 in the MTJ 102, the memory array 10 can provide improvements over the conventional memory array with a single free layer in MTJ. Firstly, by arranging the SAF structure 302, the spacer layer 310 and the free layer 312 in the synthetic free layer 300, the magnetic coercive field (Hc) and the effective anisotropy field (Hk) of the synthetic free layer 300 are enhanced, such that the data stability, data processing and data retention ability of the memory array 10 can be improved, thereby increasing the reliability of the memory array 10. In certain embodiments, the magnetic coercive field (Hc) of the synthetic free layer 300 ranges from about 100 mT to about 130 mT. Secondly, due to the low saturation magnetization of each of the ferromagnetic layer 304 and the ferromagnetic layer 306, the write current (i.e., the in-plane charge current) passing through the SOT layer 104 can be reduced. In certain embodiments, in the memory array 10, when the write current ranges from about 30 uA to about 45 uA, the switching time can be 10 ns; and when the write current ranges from about 50 uA to about 80 uA, the switching time can be 2 ns. Thirdly, since both dipolar coupling and spin-torque between ferromagnetic layers (e.g., the ferromagnetic layer 304 and the ferromagnetic layer 306) of the SAF structure 302 help the SAF structure 302 to switch faster, by arranging the SAF structure 302, the spacer layer 310 and the free layer 312 in the synthetic free layer 300, the switching of the synthetic free layer 300 can be faster.

In some embodiments, the MTJ 102 further includes a spacer layer 318 interposed between the reference layer 316 and the SAF structure 320 (see below for a detailed description of the SAF structure 320). In detail, as shown in FIG. 3A, the spacer layer 318 overlies the reference layer 316 and separates the reference layer 316 from the SAF structure 320. In some embodiments, the spacer layer 318 is a layer to trigger antiferromagnetic coupling. In such embodiments, the spacer layer 318 is formed of a material such as Ru, W, molybdenum (Mo), iridium (Jr), the like, or combinations thereof. In some embodiments, the thickness of the spacer layer 318 ranges from about 2 Å to about 10 Å. In some embodiments, the thicker spacer layer 318 may be used to reduce the effects of cryptographic mismatch on the SAF structure 320 from overlying layers. In some embodiments, the spacer layer 318 is optional and is not a part of the MTJ 102.

The SAF structure 320 is configured to enhance the pinning of the magnetization direction in the reference layer 316. Pinning the magnetization direction of the reference layer 316 allows the unit cell 100 to be toggled between a low electrical resistance state and a high electrical resistance state by changing the magnetization direction of the synthetic free layer 300 relative to the reference layer 316. Because the SAF structure 320 and the reference layer 316 are formed over the synthetic free layer 300, such the MTJ 102 may be considered a "top-pinned" MTJ. However, the disclosure is not limited thereto. In some alternative embodiments, the order of the layers of the MTJ 102 may be reversed and the SOT layer 104 may be formed over the MTJ 102. In such embodiments, because the synthetic free layer 300 is formed over the reference layer 316 and the SAF structure 320, such MTJ may be considered a "bottom-pinned" MTJ.

In some embodiments, the SAF structure 320 includes one or more spacer layers each sandwiched between two ferromagnetic layers. For example, as shown in FIG. 3A, the SAF structure 320 includes a ferromagnetic layer 322, a ferromagnetic layer 324 and a spacer layer 326 between the ferromagnetic layer 322 and the ferromagnetic layer 324, i.e., two ferromagnetic layers and one spacer layer. However, the disclosure is not limited thereto. In some alternative embodiments, the SAF structure 320 may include ferromagnetic layers and spacer layers stacked alternately along the direction Z. In some embodiments, as shown in FIG. 3A, the ferromagnetic layer 322, the spacer layer 326 and the ferromagnetic layer 324 are sequentially and vertically stacked on the SOT layer 104.

The spacer layer 326 induces RKKY coupling between the ferromagnetic layer 322 and the ferromagnetic layer 324, such that the ferromagnetic layer 322 and the ferromagnetic layer 324 are antiferromagnetically coupled with each other. As such, the magnetization direction of the ferromagnetic layer 322 is opposite to that of the ferromagnetic layer 324 due to the antiparallel exchange coupling provided by the spacer layer 326. Also, such spacer layer 326 may be referred to as an exchange coupling layer or an antiferromagnetically coupling layer in some examples. In some embodiments, the spacer layer 326 is a non-magnetic metal layer. In some embodiments, the spacer layer 326 includes Ru, W, V, Ti, a combination of the foregoing, or the like. In some embodiments, the material of the spacer layer 326 is the same as the material of the spacer layer 308. In some alternative embodiments, the material of the spacer layer 326 is different from the material of the spacer layer 308. In some embodiments, the thickness of the spacer layer 326 ranges from about 0.2 nm to about 1.5 nm to provide the antiferromagnetic coupling.

In some embodiments, each of the ferromagnetic layer 322 and the ferromagnetic layer 324 has a fixed magnetization orientation. In some embodiments, each of the ferromagnetic layer 322 and the ferromagnetic layer 324 includes one or more of Fe, Co, Ni, a FeCo alloy, a NiFe alloy, a CoNi alloy, a CoFeB alloy, a CoFeBW alloy, a FeB alloy, a FePt alloy, a FePd alloy and a suitable ferromagnetic material. In some embodiments, the thickness of each of the ferromagnetic layer 322 and the ferromagnetic layer 324 ranges from about 1 nm to about 3 nm. The thickness of each of the ferromagnetic layer 322 and the ferromagnetic layer 324 may depend on whether a perpendicular direction (e.g., the direction Z) or an in-plane preferred direction (e.g., the direction X or the direction Y) for the stable magnetic states is desired. In some embodiments, the total thickness of the SAF structure 320 is in a range from about 3 nm to about 10 nm, such as about 5 nm. In some embodiments, the thicker SAF structure 320 may have stronger antiferromagnetic properties, or may be more robust against external magnetic fields or thermal fluctuation. In some embodiments, the SAF structure 320 may have a face-center-cubic (fcc) structure with (111) orientation. In some embodiments, the SAF structure 320 is optional and is not a part of the MTJ 102. In some embodiments, a pinning layer (not shown) is further disposed over the reference layer 316. In these embodiments, the pinning layer 306 is formed of an anti-ferromagnetic material, such as PtMn, IrMn, MnNi, FeMn, PdMn, CrFe, CrCo.

Furthermore, in some embodiments, the MTJ 102 further includes a capping layer 328 as an outermost layer (e.g., a topmost layer) in the MTJ 102. In those embodiments where the SAF structure 320 overlies the reference layer 316, as shown in FIG. 3A, the capping layer 328 is disposed on the SAF structure 320. The capping layer 328 may protect the underlying layer(s) from etching damage and/or oxidation. According to some embodiments, the capping layer 328 is formed of a conductive material, such as tantalum, tantalum nitride, titanium, titanium nitride, the like or combinations thereof.

Figure 3B:
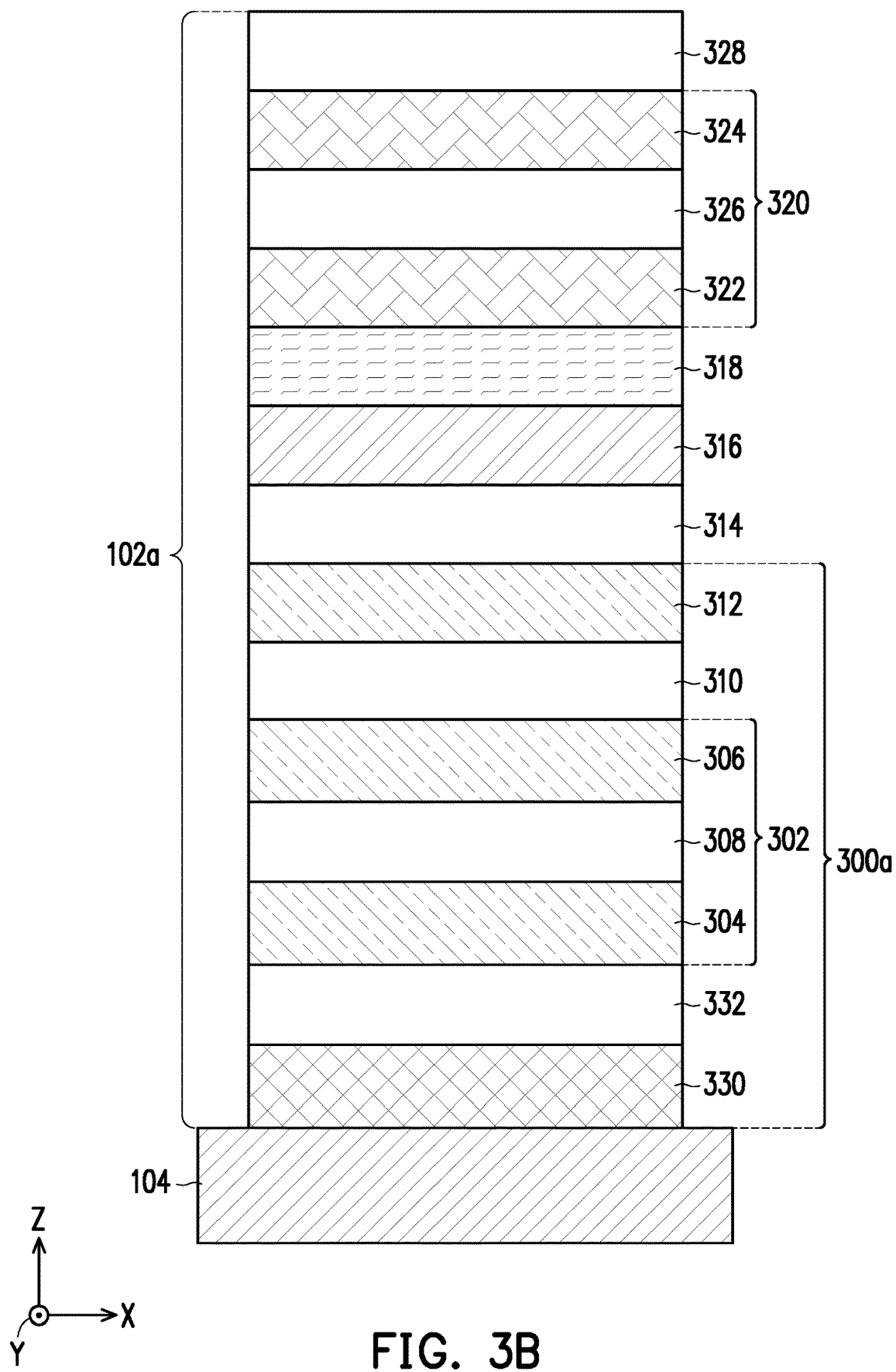

Referring to FIG. 3A and FIG. 3B, the MTJ 102a illustrated in FIG. 3B is similar to the MTJ 102 illustrated in FIG. 3A, hence the same reference numerals are used to refer to the same or liked parts, and its detailed description will be omitted herein. The differences between the MTJ 102a and the MTJ 102 will be described below.

Referring to FIG. 3B, in the MTJ 102a, the synthetic free layer 300a further includes a superparamagnetic layer 330 and a spacer layer 332. That is to say, in the MTJ 102a, the superparamagnetic layer 330, the spacer layer 332, the ferromagnetic layer 304, the spacer layer 308, the ferromagnetic layer 306, the spacer layer 310 and the free layer 312 together form the hept-layered synthetic free layer 300a. In detail, as shown in FIG. 3B, the superparamagnetic layer 330 is formed between the SOT layer 104 and the SAF structure 302, and the spacer layer 332 is formed between the superparamagnetic layer 330 and the SAF structure 302. That is, the spacer layer 332 overlies the superparamagnetic layer 330 and separates the superparamagnetic layer 330 from the SAF structure 320.

In some embodiments, in the superparamagnetic layer 330, the magnetization direction is unstable and can randomly change direction due to random thermal fluctuations. That is to say, the superparamagnetic layer 330 has the randomized magnetic moment. In some embodiments, the x-component along the direction X, y-component along the direction Y and z-component along the direction Z of the magnetization direction of the superparamagnetic layer 330 vary randomly. In such embodiments, the superparamagnetic layer 330 includes a cobalt-chromium alloy. In certain embodiments, the cobalt-chromium alloy may be $Co_{1-x}Cr_x$, wherein $0.05<x<0.2$. Since the Co content in the cobalt-chromium alloy is so low that the spin in Co cannot form a short-range exchange, which dictates the antiparallel or parallel alignment of the spins, the superparamagnetic layer 330 has the randomized magnetic moment of which x-, y- and z-components all vary randomly. In some embodiments, the thickness of the superparamagnetic layer 330 ranges from about 0.5 nm to about 1.5 nm. In some embodiments, the saturation magnetization of the superparamagnetic layer 330 ranges from about 20 eum/cm$^3$ to about 100 eum/cm$^3$.

In some embodiments, the spacer layer 332 is a non-magnetic metal layer. In some embodiments, the spacer layer 332 includes Ru, W, V, Ti, a combination of the foregoing, or the like. In some embodiments, the thickness of the spacer layer 332 ranges from about 0.2 nm to about 1.5 nm. In some embodiments, the spacer layer 332 may induce RKKY coupling between the superparamagnetic layer 330 and the ferromagnetic layer 304 of the SAF structure 302. In such embodiments, through thickness control of the spacer layer 332, the ferromagnetic layer 304 and the ferromagnetic layer 306 may be ferromagnetic or antiferromagnetic coupled.

By utilizing the synthetic free layer 300a in the MTJ 102a, the memory array of the present disclosure can provide improvements over the conventional memory array with a single free layer in MTJ. Firstly, by arranging the SAF structure 302, the spacer layer 310 and the free layer 312 in the synthetic free layer 300a, the magnetic coercive field (Hc) and the effective anisotropy field (Hk) of the synthetic free layer 300a are enhanced, such that the data stability, data processing and data retention ability of the memory array including the synthetic free layer 300a can be improved, thereby increasing the reliability of such memory array. In certain embodiments, the magnetic coercive field (Hc) of the synthetic free layer 300a ranges from about 80 mT to about 120 mT. Secondly, in addition to the low saturation magnetization of each of the ferromagnetic layer 304 and the ferromagnetic layer 306, the randomized magnetic moment of the superparamagnetic layer 330 coupled to the ferromagnetic layer 304, the ferromagnetic layer 306 and the free layer 312 can provide a thermally randomized angle, which fastens the initial magnetic precession for the ferromagnetic layer 304, the ferromagnetic layer 306 and the free layer 312, such that the write current (i.e., the in-plane charge current) passing through the SOT layer 104 can be further reduced. In certain embodiments where the synthetic free layer 300a is included in the MTJ 102a, when the write current ranges from about 20 uA to about 35 uA, the switching time can be 10 ns; and when the write current ranges from about 40 uA to about 65 uA, the switching time can be 2 ns. Thirdly, since both dipolar coupling and spin-torque between ferromagnetic layers (e.g., the ferromagnetic layer 304 and the ferromagnetic layer 306) of the SAF structure 302 help the SAF structure 302 to switch faster, by arranging the SAF structure 302, the spacer layer 310 and the free layer 312 in the synthetic free layer 300a, the switching of the synthetic free layer 300a can be faster.

In the above-mentioned embodiments, each of the ferromagnetic layer 304 and the ferromagnetic layer 306 in the SAF structure 302 is a single layer. However, the disclosure is not limited thereto. In some alternative embodiments, each of the ferromagnetic layer 304 and the ferromagnetic layer 306 in the SAF structure 302 may be a multilayer structure. The details will be described below with reference to FIG. 3C and FIG. 3D.

Figure 3C:
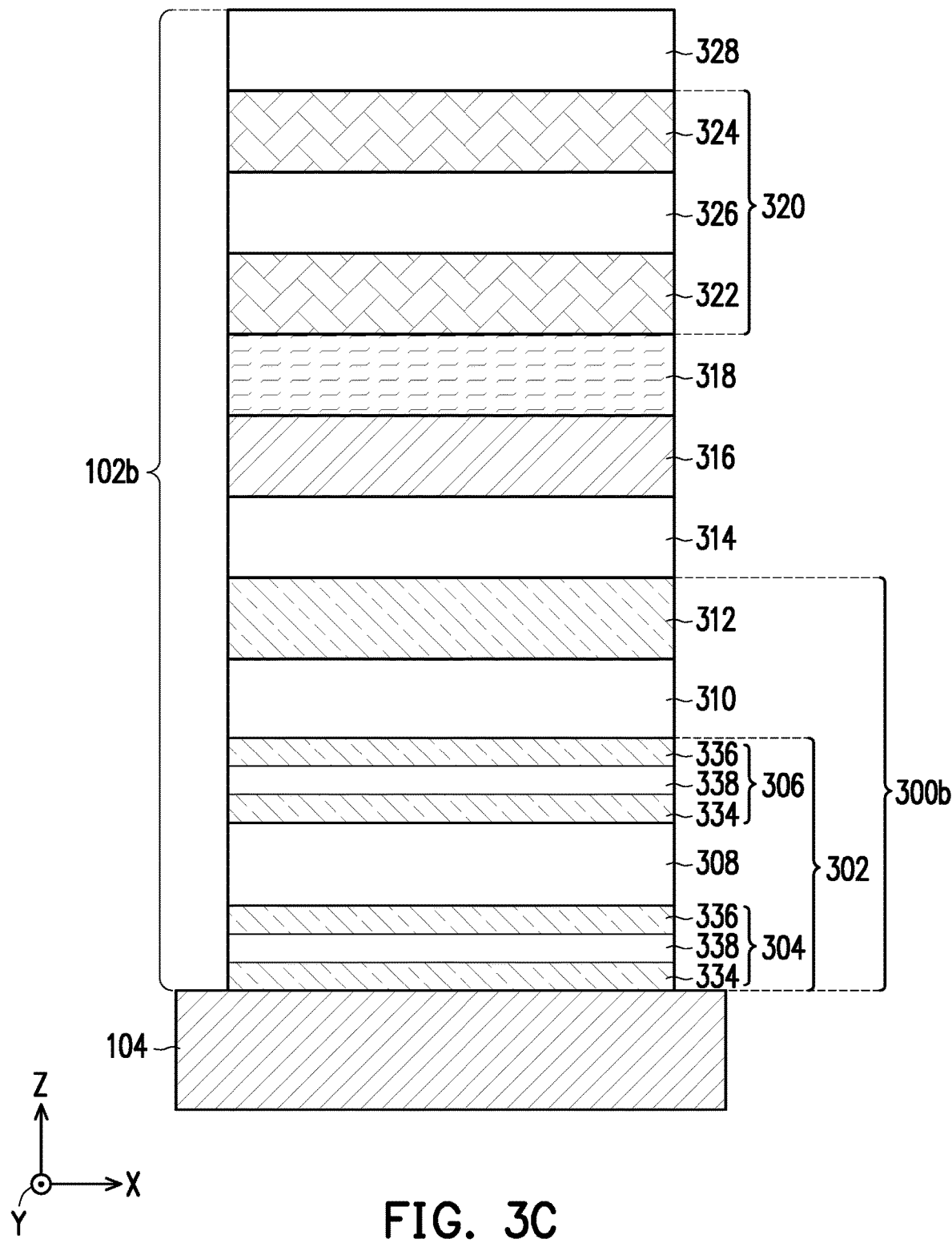

Referring to FIG. 3A and FIG. 3C, the MTJ 102b illustrated in FIG. 3C is similar to the MTJ 102 illustrated in FIG. 3A, hence the same reference numerals are used to refer to the same or liked parts, and its detailed description will be omitted herein. The differences between the MTJ 102b and the MTJ 102 will be described below.

Referring to FIG. 3C, in the synthetic free layer 300b of the MTJ 102b, each of the ferromagnetic layer 304 and the ferromagnetic layer 306 includes a ferromagnetic sub-layer 334, a ferromagnetic sub-layer 336 and a spacer layer 338 sandwiched between the ferromagnetic sub-layer 334 and the ferromagnetic sub-layer 336. That is to say, in the synthetic free layer 300b, each of the ferromagnetic layer 304 and the ferromagnetic layer 306 is a tri-layered structure including two ferromagnetic sub-layers and one spacer layer. In other words, in the synthetic free layer 300b, the two ferromagnetic sub-layer 334, 336 are separated by the one spacer layer 338.

In some embodiments, each of the ferromagnetic sub-layer 334 and the ferromagnetic sub-layer 336 is formed as having high saturation magnetization (Ms). In some embodiments, the saturation magnetization of each of the ferromagnetic sub-layer 334 and the ferromagnetic sub-layer 336 ranges from about 1100 eum/cm$^3$ to about 1600 eum/cm$^3$. In some embodiments, each of the ferromagnetic sub-layer 334 and the ferromagnetic sub-layer 336 includes a cobalt-iron alloy. In certain embodiments, the cobalt-iron alloy may be $Co_xFe_y$, wherein $0.1<x<0.4$, $0.5<y<0.8$, $x+y=1$. If the "x" in the $Co_xFe_y$ is less than or equal to about 0.1 and/or greater than or equal to about 0.4, the "y" in the $Co_xFe_y$ is less than or equal to about 0.5 and/or greater than or equal to about 0.8, and/or "x+y" is not equal to 1, the cobalt-iron alloy exhibits low saturation magnetization resulting in low magnetic coercive field (Hc) and low retention. In some embodiments, the material of the ferromagnetic sub-layer 334 is the same as the material of the ferromagnetic sub-layer 336. In some alternative embodiments, the material of the ferromagnetic sub-layer 334 is different from the material of the ferromagnetic sub-layer 336. In some embodiments, the thickness of each of the ferromagnetic sub-layer 334 and the ferromagnetic sub-layer 336 ranges from about 0.1 nm to about 2 nm. The thickness of each of the ferromagnetic sub-layer 334 and the ferromagnetic sub-layer 336 may depend on whether a perpendicular direction (e.g., the direction Z) or an in-plane preferred direction (e.g., the direction X or the direction Y) for the stable magnetic states is desired.

In some embodiments, the spacer layer 338 is formed as having non-magnetic or low saturation magnetization (Ms).

As such, even if each of the ferromagnetic sub-layer 334 and the ferromagnetic sub-layer 336 is formed as having high saturation magnetization (Ms), by arranging the spacer layer 338 sandwiched between the ferromagnetic sub-layer 334 and the ferromagnetic sub-layer 336, each of the ferromagnetic layer 304 and the ferromagnetic layer 306 still has low high saturation magnetization (Ms) which ranges from, for example, about 500 eum/cm$^3$ to about 1150 eum/cm$^3$. In embodiments where the spacer layer 338 is formed as having non-magnetic, the spacer layer 338 is a non-magnetic metal layer. In some embodiments, the spacer layer 338 includes Ru, W, V, Ti, Cr, Cu, Al, Ni, a combination of the foregoing, or the like. In some embodiments, the thickness of the spacer layer 338 ranges from about 0.1 nm to about 2 nm. In embodiments where the spacer layer 338 is formed as having low saturation magnetization (Ms), the thickness of the spacer layer 338 may depend on whether a perpendicular direction (e.g., the direction Z) or an in-plane preferred direction (e.g., the direction X or the direction Y) for the stable magnetic states is desired.

In some embodiments, the material of the ferromagnetic sub-layer 334 in the ferromagnetic layer 304 is the same as the material of the ferromagnetic sub-layer 334 in the ferromagnetic layer 306; the material of the ferromagnetic sub-layer 336 in the ferromagnetic layer 304 is the same as the material of the ferromagnetic sub-layer 336 in the ferromagnetic layer 306; and the material of the spacer layer 338 in the ferromagnetic layer 304 is the same as the material of the spacer layer 338 in the ferromagnetic layer 306. However, the disclosure is not limited thereto. In some alternative embodiments, as long as the saturation magnetization of the ferromagnetic layer 304 is substantially equal to the saturation magnetization of the ferromagnetic layer 306, the material of the ferromagnetic sub-layer 334 in the ferromagnetic layer 304 may be different from the material of the ferromagnetic sub-layer 334 in the ferromagnetic layer 306; the material of the ferromagnetic sub-layer 336 in the ferromagnetic layer 304 may be different from the material of the ferromagnetic sub-layer 336 in the ferromagnetic layer 306; and/or the material of the spacer layer 338 in the ferromagnetic layer 304 may be different from the material of the spacer layer 338 in the ferromagnetic layer 306.

Further, the ferromagnetic sub-layers 334, the ferromagnetic sub-layers 336 and the spacer layers 338 included in the SAF structure 302 each may be formed with a crystalline structure similar to or identical with an expected crystalline structure (e.g., bcc structure) of the overlying free layer 312, so as to provide a preferable growth template for the overlying free layer 312. Accordingly, the overlying free layer 312 may be formed with improved crystallinity.

By utilizing the synthetic free layer 300b in the MTJ 102b, the memory array of the present disclosure can provide improvements over the conventional memory array with a single free layer in MTJ. Firstly, by arranging the SAF structure 302, the spacer layer 310 and the free layer 312 in the synthetic free layer 300b, the magnetic coercive field (Hc) and the effective anisotropy field (Hk) of the synthetic free layer 300b are enhanced, such that the data stability, data processing and data retention ability of the memory array including the synthetic free layer 300b can be improved, thereby increasing the reliability of such memory array. In certain embodiments, the magnetic coercive field (Hc) of the synthetic free layer 300b ranges from about 150 mT to about 200 mT. Secondly, due to the low saturation magnetization of each of the ferromagnetic layer 304 and the ferromagnetic layer 306, the write current (i.e., the in-plane charge current) passing through the SOT layer 104 can be reduced. In certain embodiments where the synthetic free layer 300b is included in the MTJ 102b, when the write current ranges from about 60 uA to about 100 uA, the switching time can be 10 ns; and when the write current ranges from about 100 uA to about 170 uA, the switching time can be 2 ns. Thirdly, since both dipolar coupling and spin-torque between ferromagnetic layers (e.g., the ferromagnetic layer 304 and the ferromagnetic layer 306) of the SAF structure 302 help the SAF structure 302 to switch faster, by arranging the SAF structure 302, the spacer layer 310 and the free layer 312 in the synthetic free layer 300b, the switching of the synthetic free layer 300b can be faster.

Figure 3D:
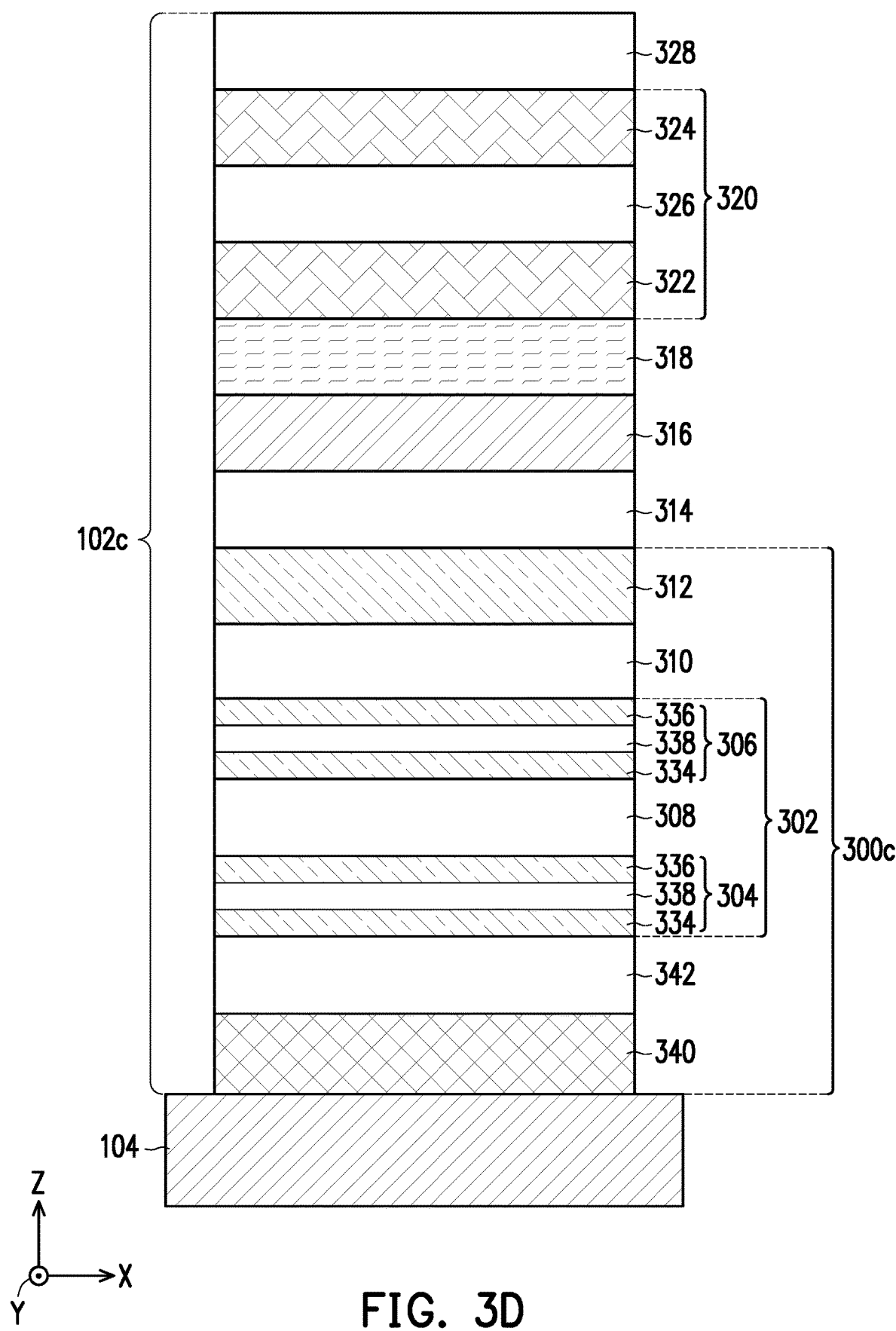

Referring to FIG. 3C and FIG. 3D, the MTJ 102c illustrated in FIG. 3D is similar to the MTJ 102b illustrated in FIG. 3C, hence the same reference numerals are used to refer to the same or liked parts, and its detailed description will be omitted herein. The differences between the MTJ 102c and the MTJ 102b will be described below.

Referring to FIG. 3D, in the MTJ 102c, the synthetic free layer 300c further includes a superparamagnetic layer 340 and a spacer layer 342. In detail, as shown in FIG. 3D, the superparamagnetic layer 340 is formed between the SOT layer 104 and the SAF structure 302, and the spacer layer 342 is formed between the superparamagnetic layer 340 and the SAF structure 302. That is, the spacer layer 342 overlies the superparamagnetic layer 340 and separates the superparamagnetic layer 340 from the SAF structure 320.

In some embodiments, the material of the superparamagnetic layer 340 is substantially the same or similar to the material of the superparamagnetic layer 330 mentioned for the MTJ 102a shown in FIG. 3B, and thus its detailed description is not repeated herein for simplicity. Also, for details or descriptions (e.g. material, property, thickness, etc.) of the superparamagnetic layer 340 not iterated herein, please refer to the aforesaid embodiments. In some embodiments, the material of the spacer layer 342 is substantially the same or similar to the material of the spacer layer 332 mentioned for the MTJ 102a shown in FIG. 3B, and thus its detailed description is not repeated herein for simplicity. Also, for details or descriptions (e.g. material, property, thickness, etc.) of the spacer layer 342 not iterated herein, please refer to the aforesaid embodiments.

By utilizing the synthetic free layer 300c in the MTJ 102c, the memory array of the present disclosure can provide improvements over the conventional memory array with a single free layer in MTJ. Firstly, by arranging the SAF structure 302, the spacer layer 310 and the free layer 312 in the synthetic free layer 300c, the magnetic coercive field (Hc) and the effective anisotropy field (Hk) of the synthetic free layer 300c are enhanced, such that the data stability, data processing and data retention ability of the memory array including the synthetic free layer 300c can be improved, thereby increasing the reliability of such memory array. In certain embodiments, the magnetic coercive field (Hc) of the synthetic free layer 300c ranges from about 130 mT to about 180 mT. Secondly, in addition to the low saturation magnetization of each of the ferromagnetic layer 304 and the ferromagnetic layer 306, the randomized magnetic moment of the superparamagnetic layer 340 coupled to the ferromagnetic layer 304, the ferromagnetic layer 306 and the free layer 312 can provide a thermally randomized angle, which fastens the initial magnetic precession for the ferromagnetic layer 304, the ferromagnetic layer 306 and the free layer 312, such that the write current (i.e., the in-plane charge current) passing through the SOT layer 104 can be further reduced. In certain embodiments where the synthetic free layer 300c is included in the MTJ 102c, when the write current ranges from about 50 uA to about 80 uA, the switching time can be 10 ns; and when the write current ranges from about 100 uA to about 130 uA, the switching time can be 2 ns. Thirdly, since both dipolar coupling and spin-torque between ferromagnetic layers (e.g., the ferromagnetic layer 304 and the ferromagnetic layer 306) of the SAF structure 302 help the SAF structure 302 to switch faster, by arranging the SAF structure 302, the spacer layer 310 and the free layer 312 in the synthetic free layer 300c, the switching of the synthetic free layer 300c can be faster.

Figure 3E:
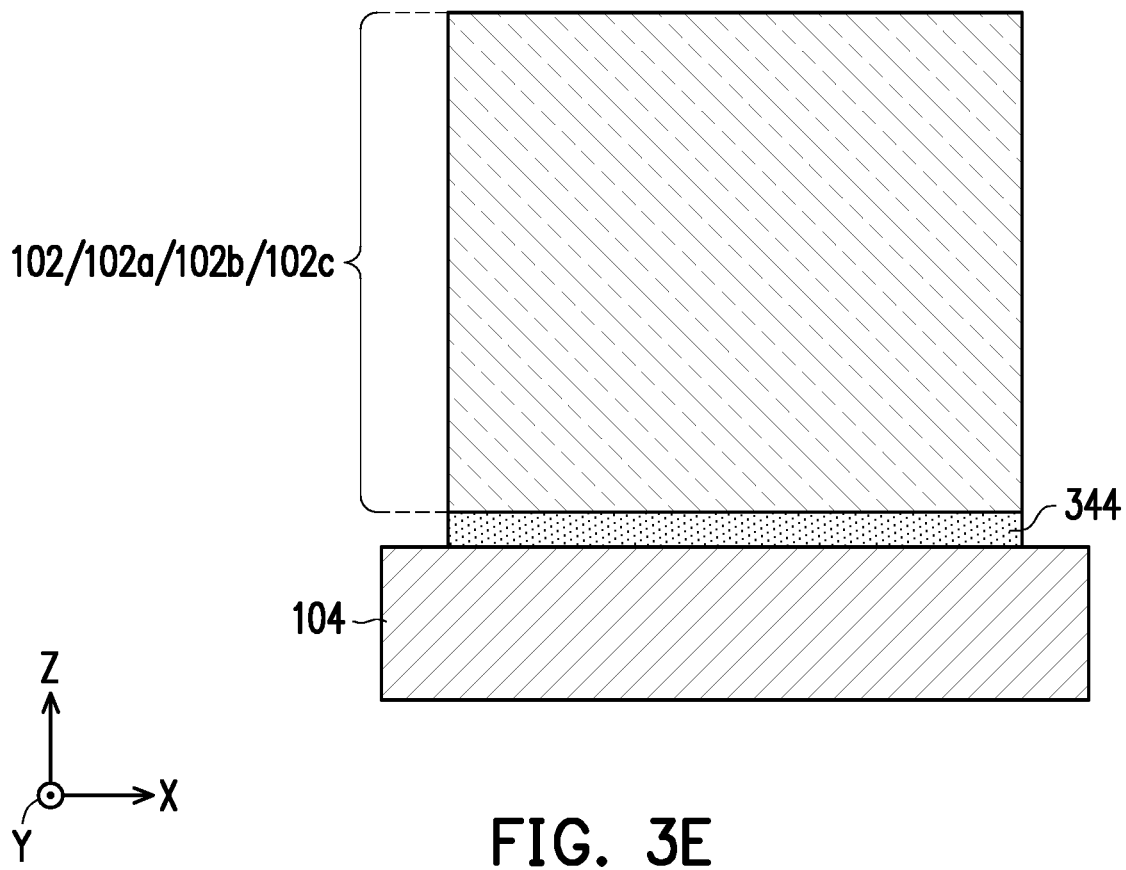

Referring to FIG. 3E, in some embodiments, a diffusion barrier 344 is disposed between the SOT layer 104 and a MTJ, which may be the MTJ 102 as described with reference to FIG. 3A, the MTJ 102a as described with reference to FIG. 3B, the MTJ 102b as described with reference to FIG. 3C, or the MTJ 102c as described with reference to FIG. 3D. The diffusion barrier 344 is configured to prevent inter-diffusion between the SOT layer 104 and the layer of the MTJ closest to the SOT layer 104 (e.g., the ferromagnetic layer 304 of the MTJ 102, the superparamagnetic layer 330 of the MTJ 102a, the ferromagnetic sub-layer 334 of the MTJ 102b, the superparamagnetic layer 340 of the MTJ 102c), and may be formed of a non-magnetic conductive material, such as molybdenum.

Figure 4A:
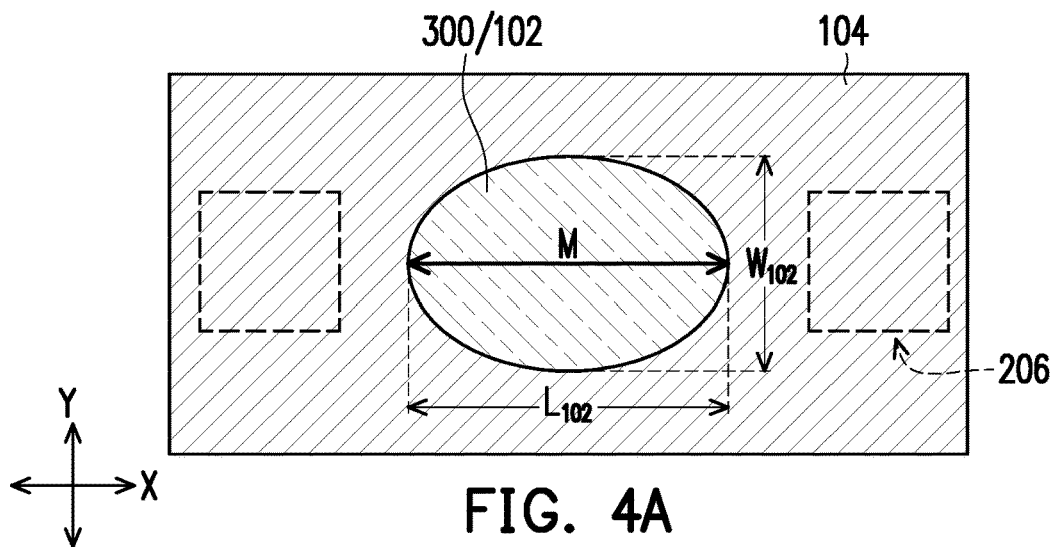
FIG. 4A through FIG. 4C are schematic plan views each illustrating a MTJ standing on a spin-orbit torque layer, according to some embodiments of the present disclosure.
Figure 4B:
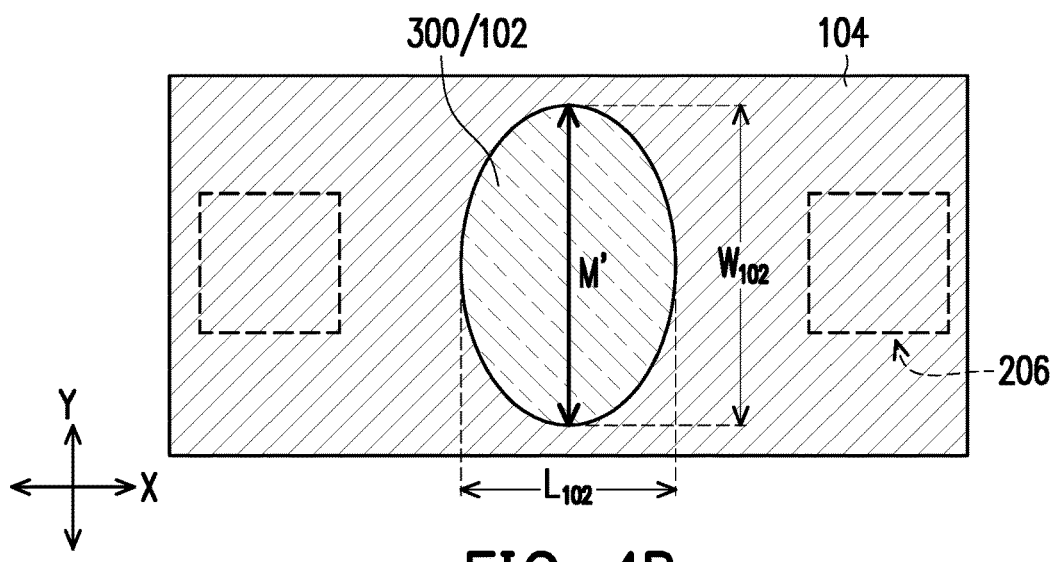
Figure 4C:
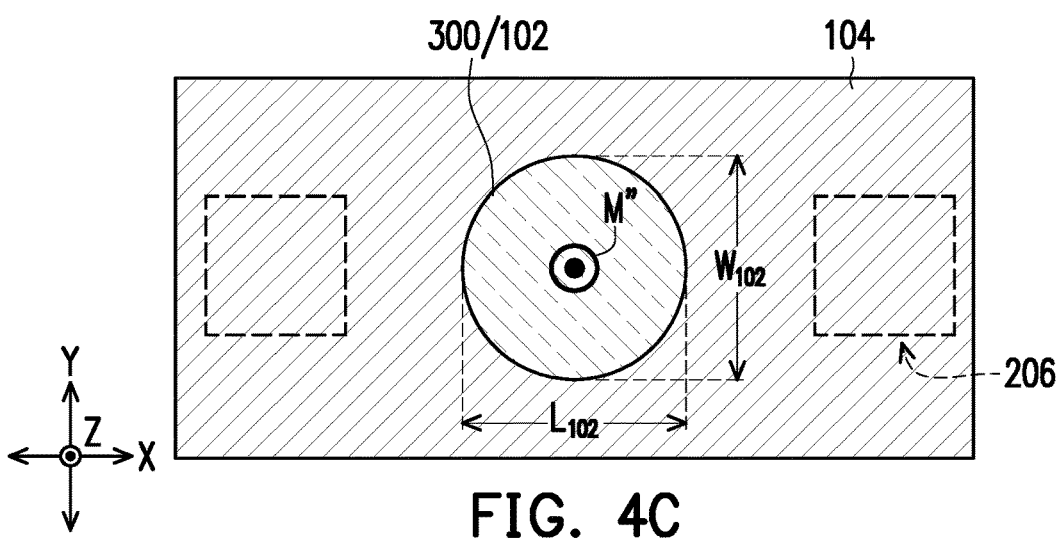

FIG. 4A through FIG. 4C are schematic plan views each illustrating a MTJ standing on a spin-orbit torque layer, according to some embodiments of the present disclosure.

Referring to FIG. 4A, in some embodiments, the major axis of the MTJ 102 is substantially aligned or substantially parallel with the major axis of the SOT layer 104, along which the write path is directed. In these embodiments, the magnetization direction M of the synthetic free layer 300 (as described with reference to FIG. 3A) in the MTJ 102 may also be substantially aligned or substantially parallel with the major axis of the SOT layer 104. As an example illustrated in FIG. 4A, the major axis of the SOT layer 104 and the directed write path between the bottom vias 206 are along the direction X (i.e., an in-plane direction), and the major axis of the MTJ 102 as well as the magnetization direction M of the synthetic free layer 300 in the MTJ 102 are along the direction X as well. The ratio of the dimension $L_{102}$ of the MTJ 102 along the direction X over the dimension $W_{102}$ of the MTJ 102 along the direction Y (i.e., another in-plane direction) may, for example, range from about 1.5 to about 5.

Referring to FIG. 4B, in some embodiments, the major axis of the MTJ 102 is intersected with (e.g., perpendicular with) the major axis of the SOT layer 104, along which the write path is directed. In these embodiments, the magnetization direction M' of the synthetic free layer 300 in the MTJ 102, which is substantially aligned with the major axis of the MTJ 102, may also be intersected with (e.g., perpendicular with) the major axis of the SOT layer 104. As an example illustrated in FIG. 4B, the major axis of the SOT layer 104 and the directed write path between the bottom vias 206 are along the direction X, while the major axis of the MTJ 102 as well as the magnetization direction M' of the synthetic free layer 300 in the MTJ 102 are along the direction Y. The ratio of the dimension $L_{102}$ of the MTJ 102 along the direction X over the dimension $W_{102}$ of the MTJ 102 along the direction Y may, for example, range from about 1.5 to about 5.

Referring to FIG. 4C, in some embodiments, the MTJ 102 is formed in a substantially symmetrical shape. In these embodiments, the magnetization direction M" of the synthetic free layer 300 in the MTJ 102 may be along the direction Z (i.e., an out-of-plane direction) that is substantially normal to the surface of the SOT layer 104 in contact with the MTJ 102. In addition, the ratio of the dimension $L_{102}$ of the MTJ 102 along the direction X over the dimension $W_{102}$ of the MTJ 102 along the direction Y may be close to or identical with 1.

It should be noted that, the MTJ 102 is exemplarily taken for elaborating various configurations of the SOT layer 104 and a MTJ standing on the SOT layer 104. The SOT layer 104 and the MTJ 102b as described with reference to FIG. 3B may have the variations shown in FIG. 4A through FIG. 4C as well. Similarly, the SOT layer 104 and the MTJ 102b as described with reference to FIG. 3C or the SOT layer 104 and the MTJ 102c as described with reference to FIG. 3D may also have the variations shown in FIG. 4A through FIG. 4C.

Figure 5:
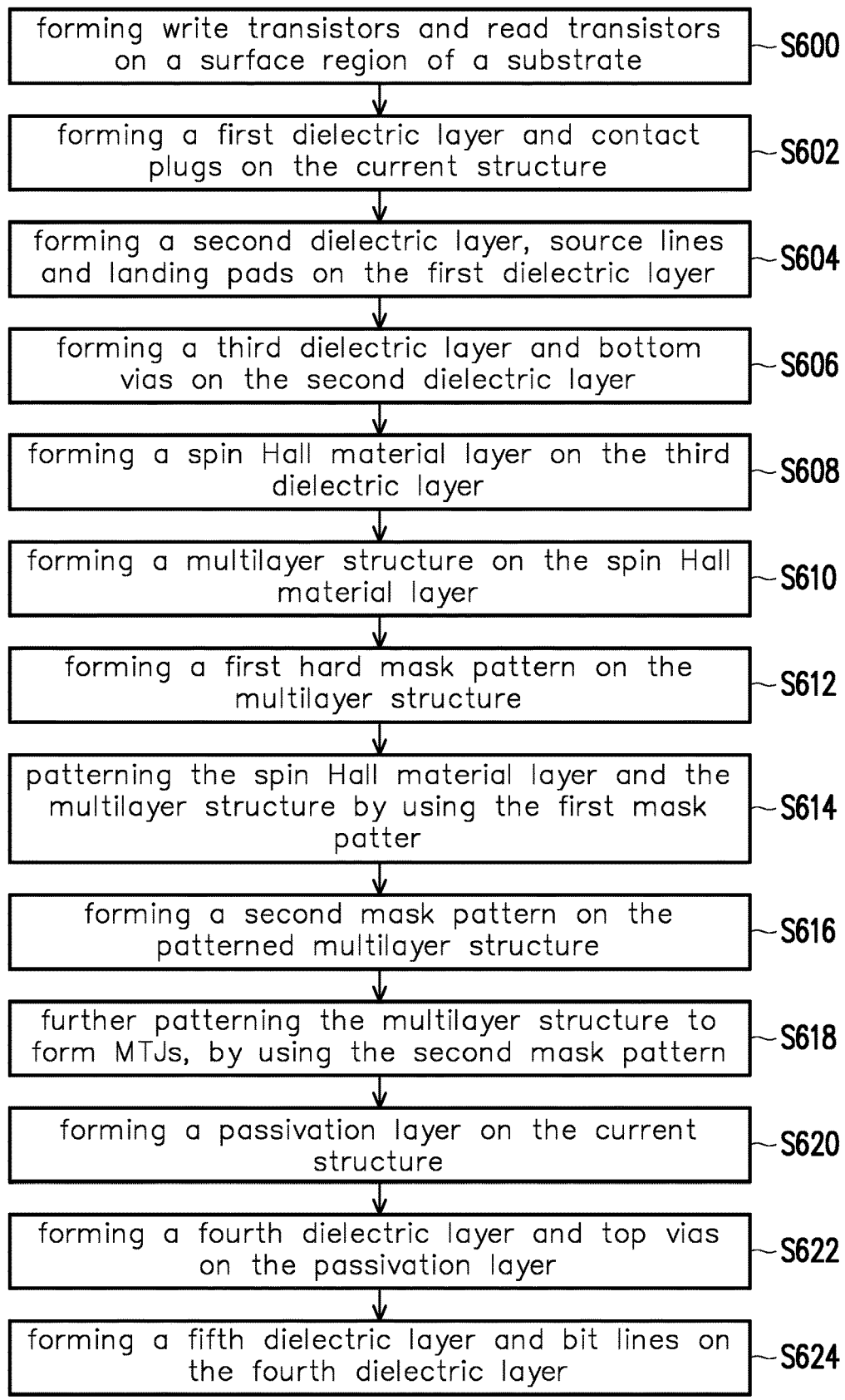
FIG. 5 is a flow diagram illustrating a method for manufacturing adjacent ones of the unit cells each described with reference to FIG. 2, according to some embodiments of the present disclosure.

FIG. 5 is a flow diagram illustrating a method for manufacturing adjacent ones of the unit cells 100 each described with reference to FIG. 2, according to some embodiments of the present disclosure. FIG. 6A through FIG. 6L are schematic cross-sectional views illustrating intermediate structures during the manufacturing process as shown in FIG. 5. Particularly, FIG. 6F through FIG. 6J are enlarged schematic views illustrating intermediate structures for forming and passivating the SOT layer 104 and the MTJ 102 in a unit cell 100. FIG. 7A through FIG. 7E are schematic plan views of the intermediate structures shown in FIG. 6F through FIG. 6J.

Referring to FIG. 5 and FIG. 6A, step S600 is performed, and the write transistors WT as well as the read transistors RT are formed on a surface region of the substrate 200. As described with reference to FIG. 1A and FIG. 2, each of the unit cells 100 may include one of the write transistors WT and one of the read transistors RT. In those embodiments where these transistors are planar-type transistors, the write transistor WT includes a write word line WWL formed over a planar surface of the substrate 200, and source/drain structures 700 formed in a shallow region of the substrate 200. Similarly, the read transistor RT includes a read word line RWL formed over a planar surface of the substrate 200, and source/drain structures 700 formed in the shallow region of the substrate 200. The write word line WWL and the read word line RWL are respectively separated from the substrate 200 by a gate dielectric layer 702. In some embodiments, the isolation transistors DT are formed along with the write transistor WT and the read transistor RT. In these embodiments, the dummy word lines DWL are respectively formed between a write transistor WT and an adjacent read transistor RT, and respectively separated from the substrate 200 by the gate dielectric layer 702.

It should be noted that, the write transistors WT, the read transistors RT and the isolation transistors DT are described herein as the planar-type transistors. However, as described with reference to FIG. 2, the write transistors WT, the read transistors RT and the isolation transistors DT may be alternatively formed as fin-type transistors or GAA transistors, and the structures of the elements in the write transistors WT, the read transistors RT and the isolation transistors DT may be modified accordingly.

Referring to FIG. 5 and FIG. 6B, step S602 is performed, and a dielectric layer 704 as well as the contact plugs 202 are formed over the substrate 200. The dielectric layer 704 may cover the write transistors WT, the read transistors RT and the isolation transistors DT. The contact plugs 202 penetrate through the dielectric layer 704 along the direction Z to establish electrical connection with the source/drain structures 700. In some embodiments, the dielectric layer 704 and the contact plugs 202 are formed by a damascene process (e.g., a single damascene process).

Referring to FIG. 5 and FIG. 6C, step S604 is performed, and a dielectric layer 706 as well as the source lines SL and the landing pads 204 are formed on the dielectric layer 704. The dielectric layer 706 may laterally surround the source lines SL and the landing pads 204, and the source lines SL as well as the landing pads 204 are vertically overlapped and electrically connected with the contact plugs 202. A pair of source line SL and landing pad 204 are connected with the source/drain structures 700 of each write transistor WT through the contact plugs 202 in between. Similarly, a pair of source line SL and landing pad 204 are connected with the source/drain structures 700 of each read transistor RT through the contact plugs 202 in between. In some embodiments, the method for forming the dielectric layer 706, the source lines SL and the landing pads 204 includes a damascene process.

Referring to FIG. 5 and FIG. 6D, step S606 is performed, and a dielectric layer 708 as well as the bottom vias 206 are formed on the dielectric layer 706. The bottom vias 206 may penetrate through the dielectric layer 708 along the direction Z, to establish electrical connection with the landing pads 204. In this way, one of the source/drain structures 700 of each write transistor WT is connected with the corresponding source line SL, while the other of the source/drain structures 700 of each write transistor WT is connected with the corresponding bottom via 206 through the corresponding landing pad 204 and contact plug 202 in between. Similarly, one of the source/drain structures 700 of each read transistor RT is connected with the corresponding source line SL, while the other of the source/drain structures 700 of each read transistor RT is connected with the corresponding bottom via 206 through the corresponding landing pad 204 and contact plug 202 in between. In some embodiments, the method for forming the dielectric layer 708 and the bottom vias 206 includes a damascene process (e.g., a single damascene process).

Figure 6E:
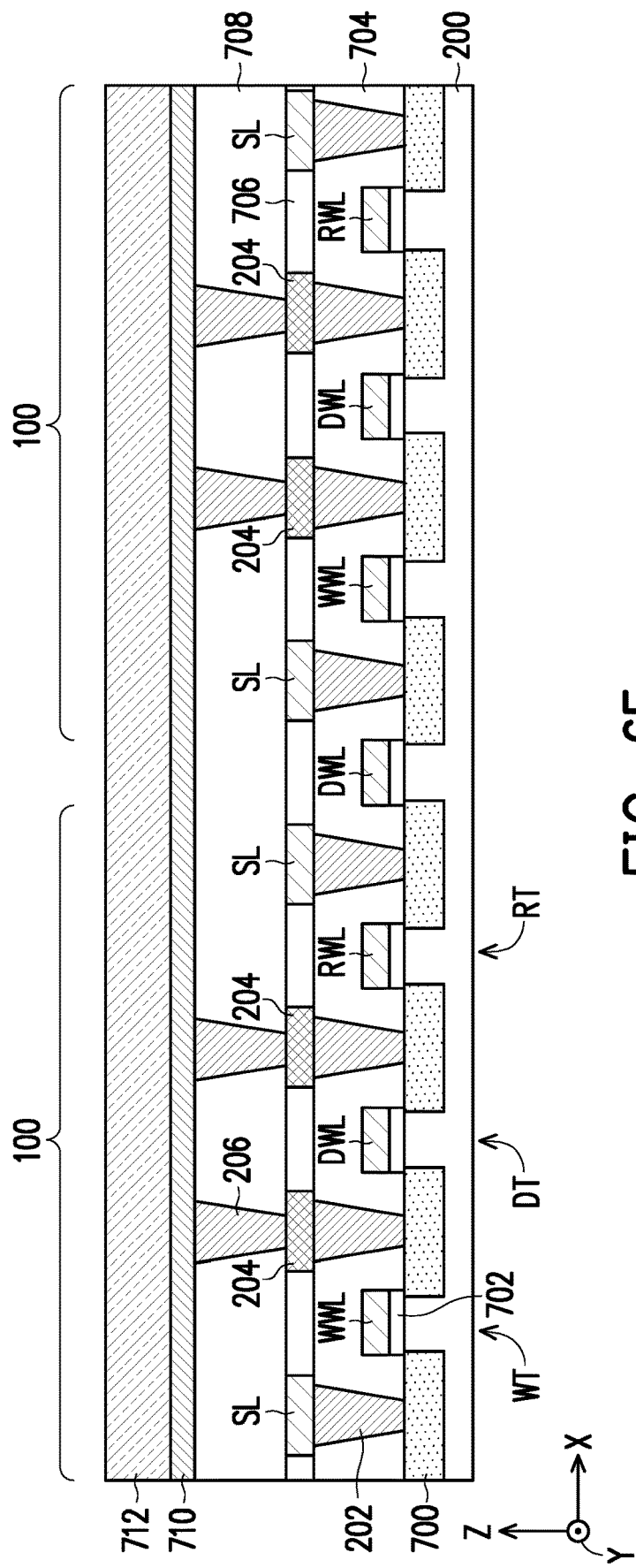

Referring to FIG. 5 and FIG. 6E, step S608 is performed, and a spin Hall material layer 710 is globally formed on the dielectric layer 708. The spin Hall material layer 710 will be patterned to form the SOT layers 104 as described with reference to FIG. 1A and FIG. 2 in the subsequent steps. In some embodiments, the spin Hall material layer 710 includes one or more heavy metals or materials doped by heavy metals. In certain embodiments, Pt, α-W, β-W, β-Ta, AuPt, $W_3Ta$, $Bi_xSe_y$, BiSeTe, multi-layers thereof, alloys thereof, the like, or combinations thereof is used for the material of the spin Hall material layer 710. In some embodiments, the method for forming the spin Hall material layer 710 may include a sputtering process or a co-sputtering process, and may include a subsequent thermal treatment. In some embodiments, the thermal treatment is an annealing process. In some embodiments, the process temperature of the thermal treatment ranges from about 350° C. to about 450° C., and the process time of the thermal treatment ranges from about 10 minutes to about 60 minutes.

Thereafter, step S610 is performed, and a multilayer structure 712 is formed on the spin Hall material layer 710. The multilayer structure 712 will be patterned to form the MTJ 102 as described with reference to FIG. 1A and FIG. 2 in the subsequent steps. In some embodiments, the method for forming the multilayer structure 712 includes multiple deposition processes, and each deposition process includes a sputtering process, a co-sputtering process or combinations thereof.

Furthermore, a barrier material layer (not shown) may be optionally formed on the spin Hall material layer 710 before formation of the multilayer structure 712, and may be patterned to form the diffusion barrier 314 as described with reference to FIG. 3E, along with the patterning of the multilayer structure 712. In some embodiments, the method for forming the barrier material layer includes a sputtering process or a co-sputtering process.

It should be noted that, the MTJ 102 and the multilayer structure 712 described hereinafter are merely taken for elaborating a manufacturing process for forming the unit cells 100, according to some embodiments. In alternative embodiments where the unit cell 100 uses the MTJ 102a as described with reference to FIG. 3B, the MTJ 102b as described with reference to FIG. 3C or the MTJ 102c as described with reference to FIG. 3D, a corresponding multilayer structure rather than the multilayer structure 712 may be formed on the spin Hall material layer 710 in the current step.

Figure 7A:
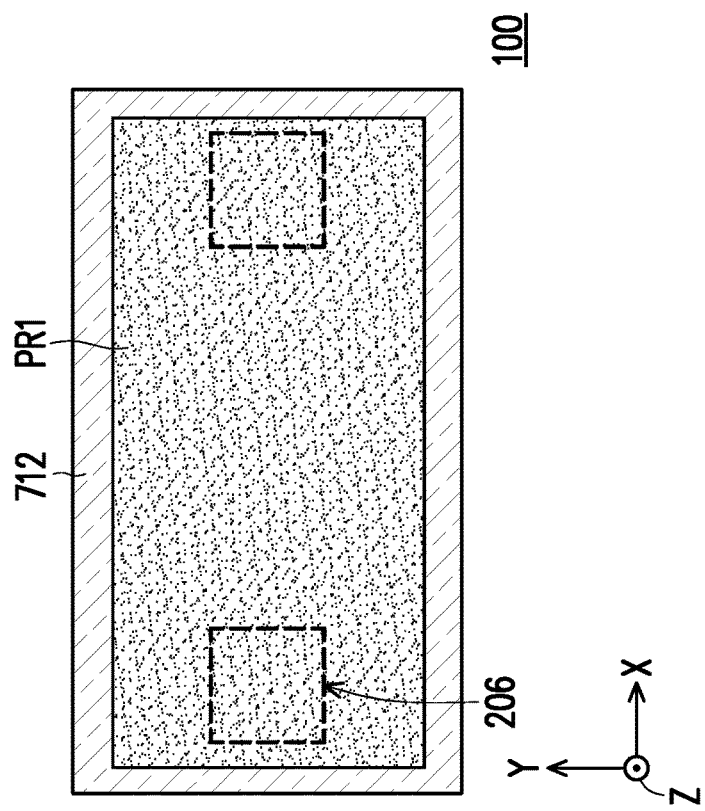
FIG. 7A through FIG. 7E are schematic plan views of the intermediate structures shown in FIG. 6F through FIG. 6J.
Figure 6F:
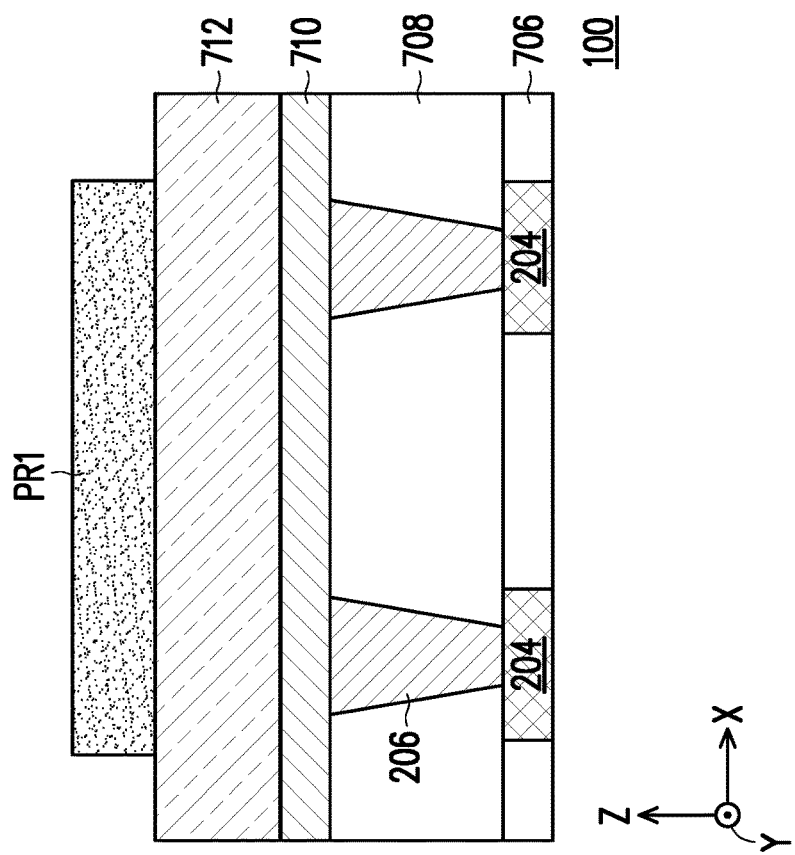

Referring to FIG. 5, FIG. 6F and FIG. 7A, step S612 is performed, and a mask pattern PR1 is formed on the multilayer structure 712. The mask pattern PR1 may have separated portions. Each portion of the mask pattern PR1 is configured to define the boundary of the subsequently formed SOT layer 104, and vertically overlaps a pair of the bottom vias 206 in each unit cell 100. In some embodiments, the mask pattern PR1 is a photoresist pattern. In some embodiments, the mask pattern PR1 is formed by a lithography process.

Figure 7B:
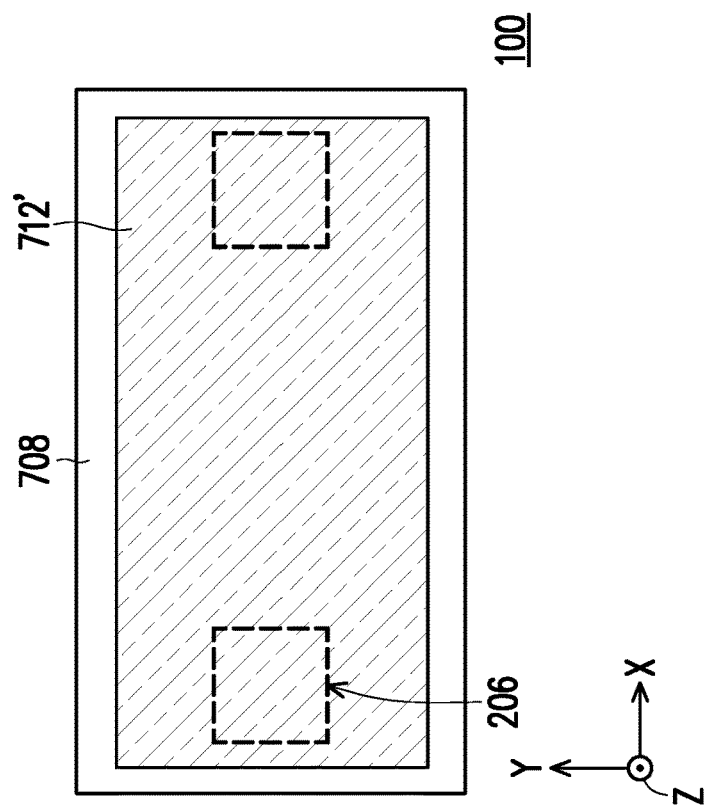
Figure 6G:
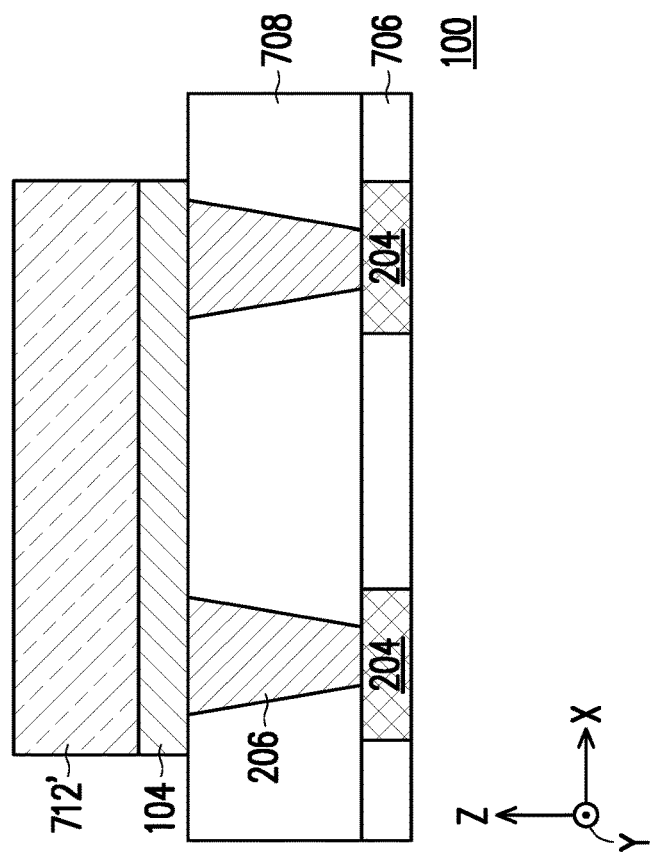

Referring to FIG. 5, FIG. 6G and FIG. 7B, step S614 is performed, and the spin Hall material layer 710 as well as the multilayer structure 712 are patterned by using the mask pattern PR1. The spin Hall material layer 710 is patterned to form the SOT layer 104. A patterned multilayer structure 712' is formed, and will be further patterned to form the MTJ 102 in the subsequent steps. Currently, the boundary of the patterned multilayer structure 712' is substantially aligned with the boundary of the SOT layer 104, as shown in FIG. 6G and FIG. 7B. One or more etching processes (e.g., anisotropic etching processes) may be used for the current patterning process of the SOT layer 104 and the patterned multilayer structure 712'. The mask pattern PR1 may be functioned as a shadow mask during the etching processes. Further, the mask pattern PR1 may be removed after the SOT layer 104 and the patterned multilayer structure 712' are formed by, for example, a stripping process or an ashing process.

Figure 7C:
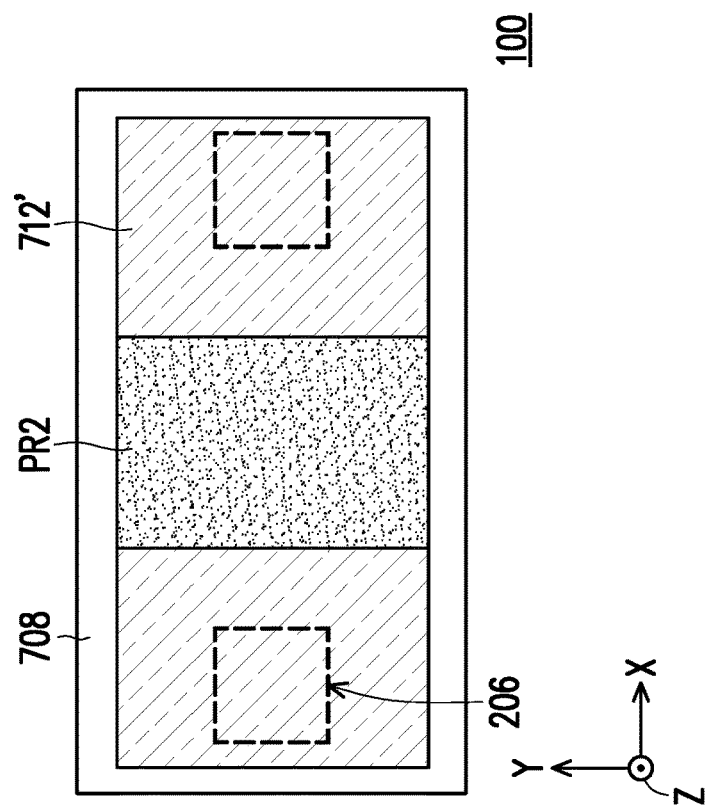
Figure 6H:
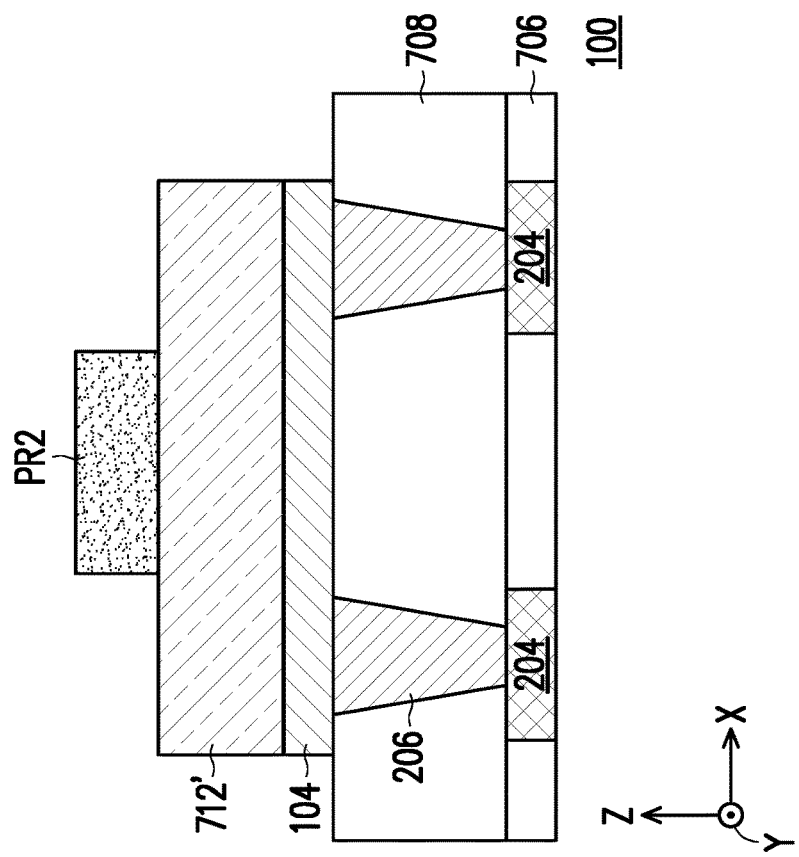

Referring to FIG. 5, FIG. 6H and FIG. 7C, step S616 is performed, and a mask pattern PR2 is formed on the patterned multilayer structure 712'. The mask pattern PR2 may have separated portions. Each portion of the mask pattern PR2 is configured to define the boundary of the subsequently formed MTJ 102, and located between a pair of the bottom vias 206 in each unit cell 100. In some embodiments, the mask pattern PR2 is a photoresist pattern. In some embodiments, the mask pattern PR2 is formed by a lithography process.

Figure 7D:
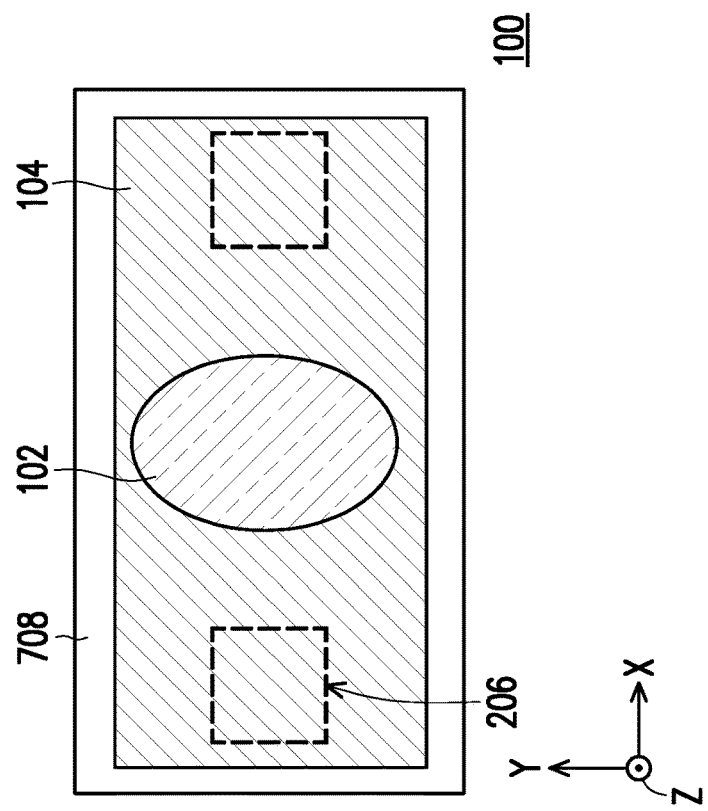
Figure 6I:
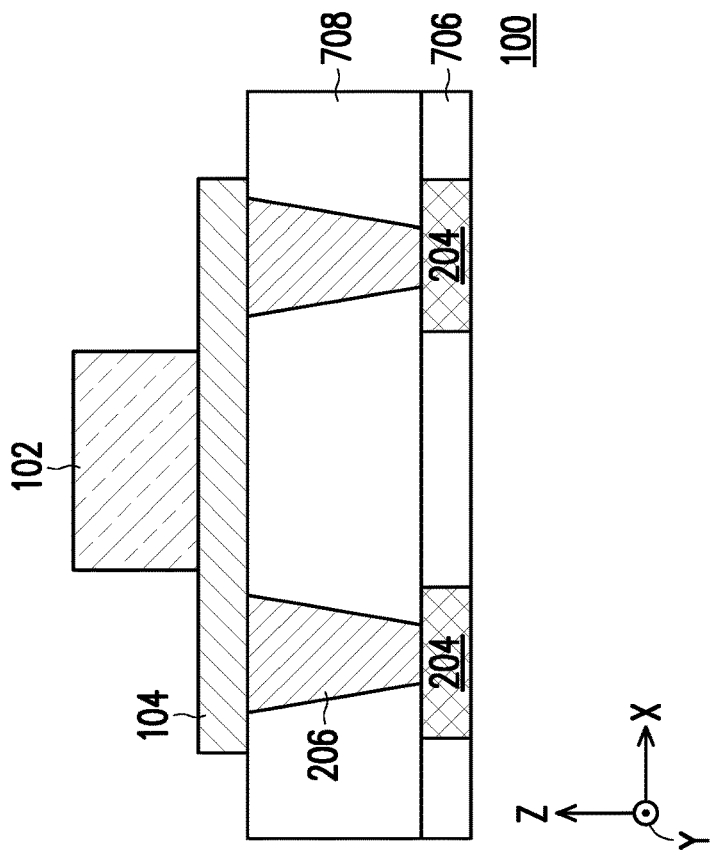

Referring to FIG. 5, FIG. 6I and FIG. 7D, step S618 is performed, and the patterned multilayer structure 712' is further patterned to form the MTJ 102. As down scaling of the MTJ 102, the boundary of the MTJ 102 may not be completely overlapped with the boundary of the mask pattern PR2. For instance, the mask pattern PR2 may have a rectangular boundary, while the MTJ 102 may have an elliptical boundary laterally recessed from the rectangular boundary of the mask pattern PR2. One or more etching processes (e.g., anisotropic etching processes) may be used for the current patterning process of the MTJ 102. The mask pattern PR2 may be functioned as a shadow mask during the etching processes. Further, the mask pattern PR2 may be removed after the MTJ 102 is formed by, for example, a stripping process or an ashing process.

Figure 7E:
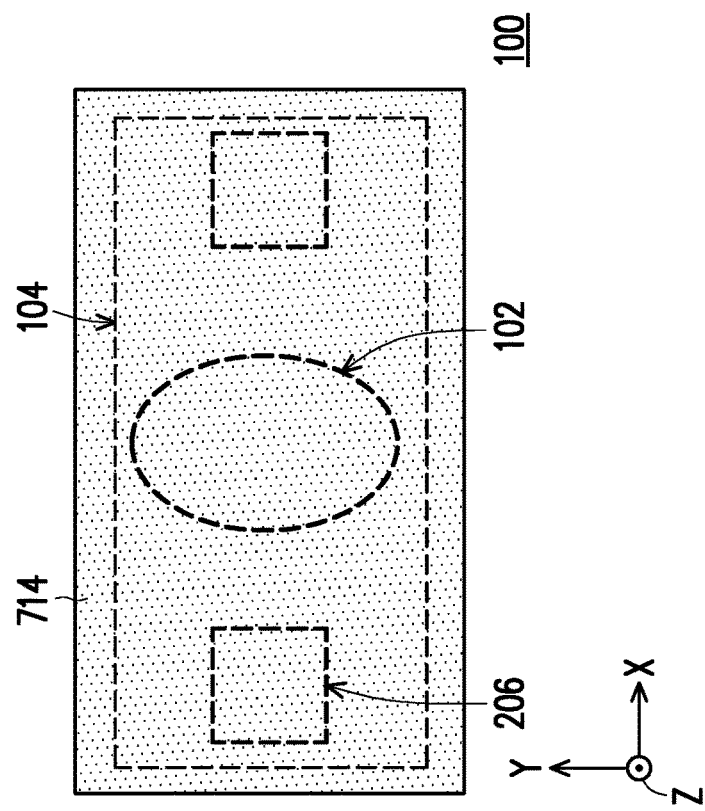
Figure 6J:
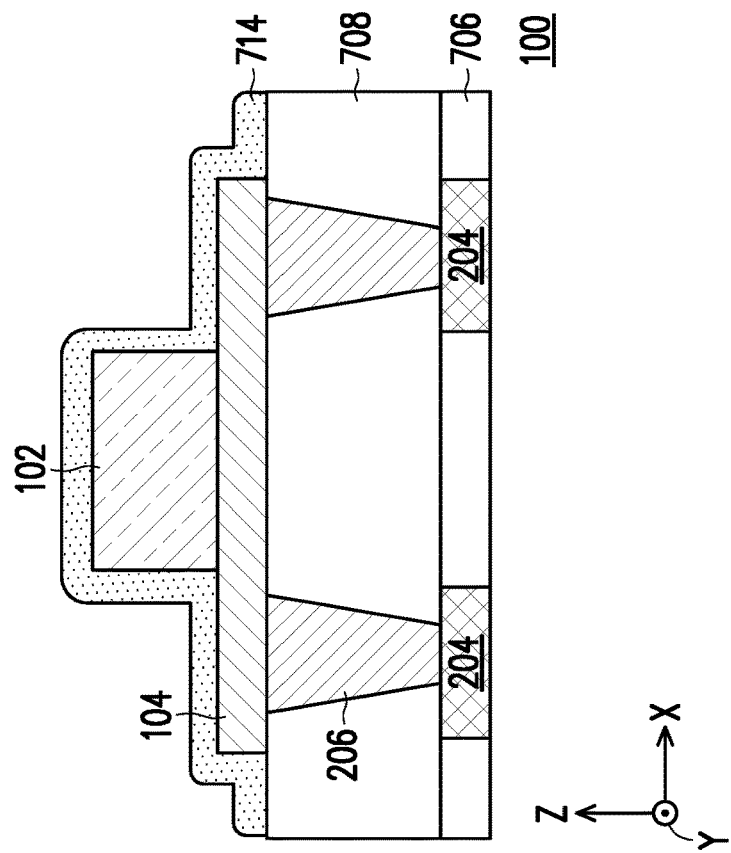

Referring to FIG. 5, FIG. 6J and FIG. 7E, step S620 is performed, and a passivation layer 714 is formed over the dielectric layer 708. In some embodiments, the passivation layer 714 is globally deposited, and the dielectric layer 708, the SOT layers 104 104 and the MTJs 102 are covered by the passivation layer 714. Further, in some embodiments, the passivation layer 714 conformally spreads on the dielectric layer 708, the SOT layers 104 and the MTJs 102. The passivation layer 714 may be formed by an insulating material, such as $Al_2O_3$, SiNx, SiOx, MgO. In addition, in some embodiments, the method for forming the passivation layer 714 includes a deposition process, such as a chemical vapor deposition (CVD) process.

Figure 6K:
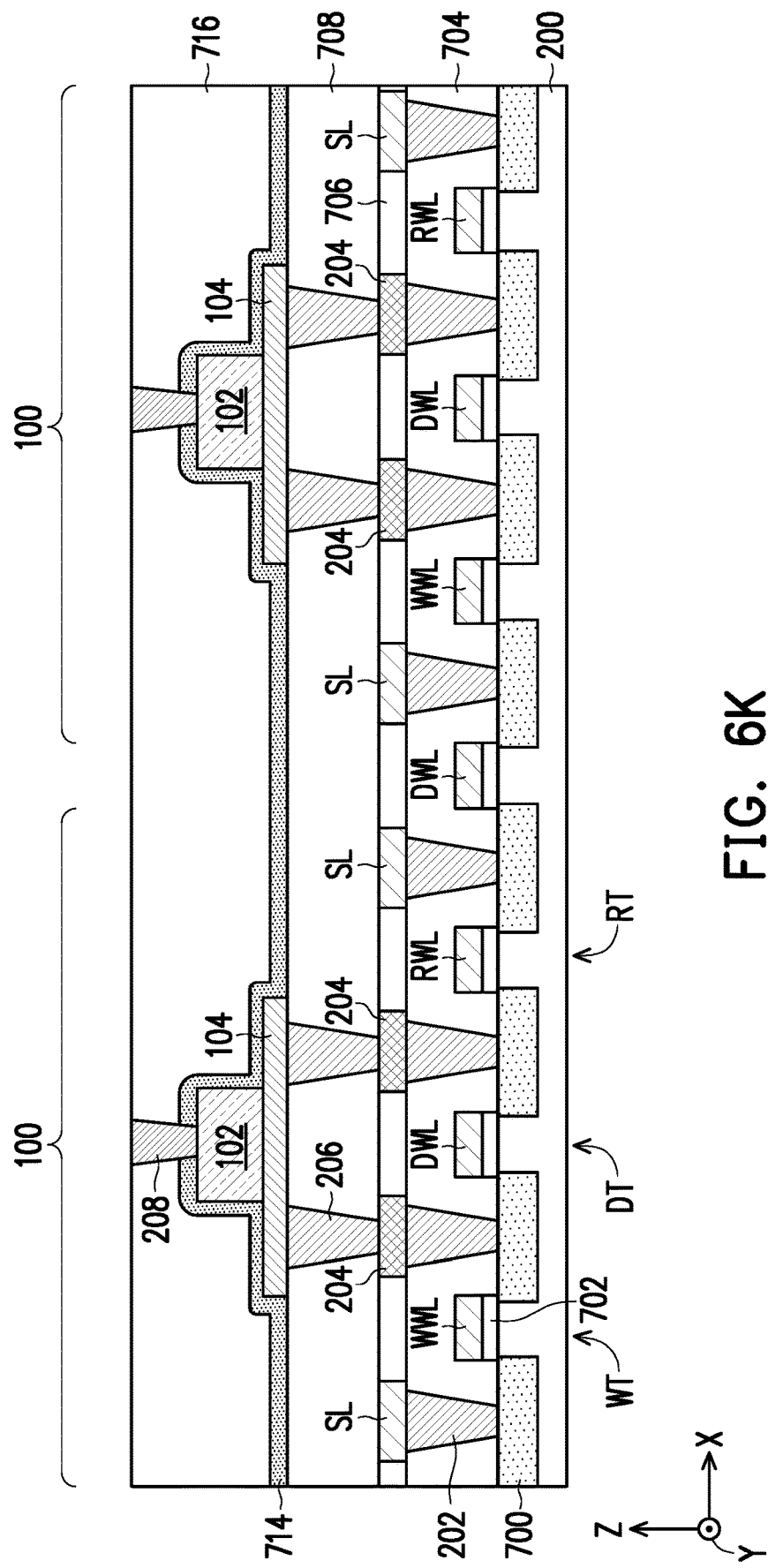

Referring to FIG. 5 and FIG. 6K, step S622 is performed, and a dielectric layer 716 as well as the top vias 208 are formed over the dielectric layer 708. The dielectric layer 716 may be formed to a height over a topmost surface of the passivation layer 714, such that the passivation layer 714 may be completely covered by the dielectric layer 716. The top vias 208 extend from a top surface of the dielectric layer 716 to top surfaces of the MTJs 102 through the dielectric layer 716 and the passivation layer 714 along the direction Z. In some embodiments, the method for forming the dielectric layer 716 and the top vias 208 includes a damascene process (e.g., a single damascene process).

Figure 6L:
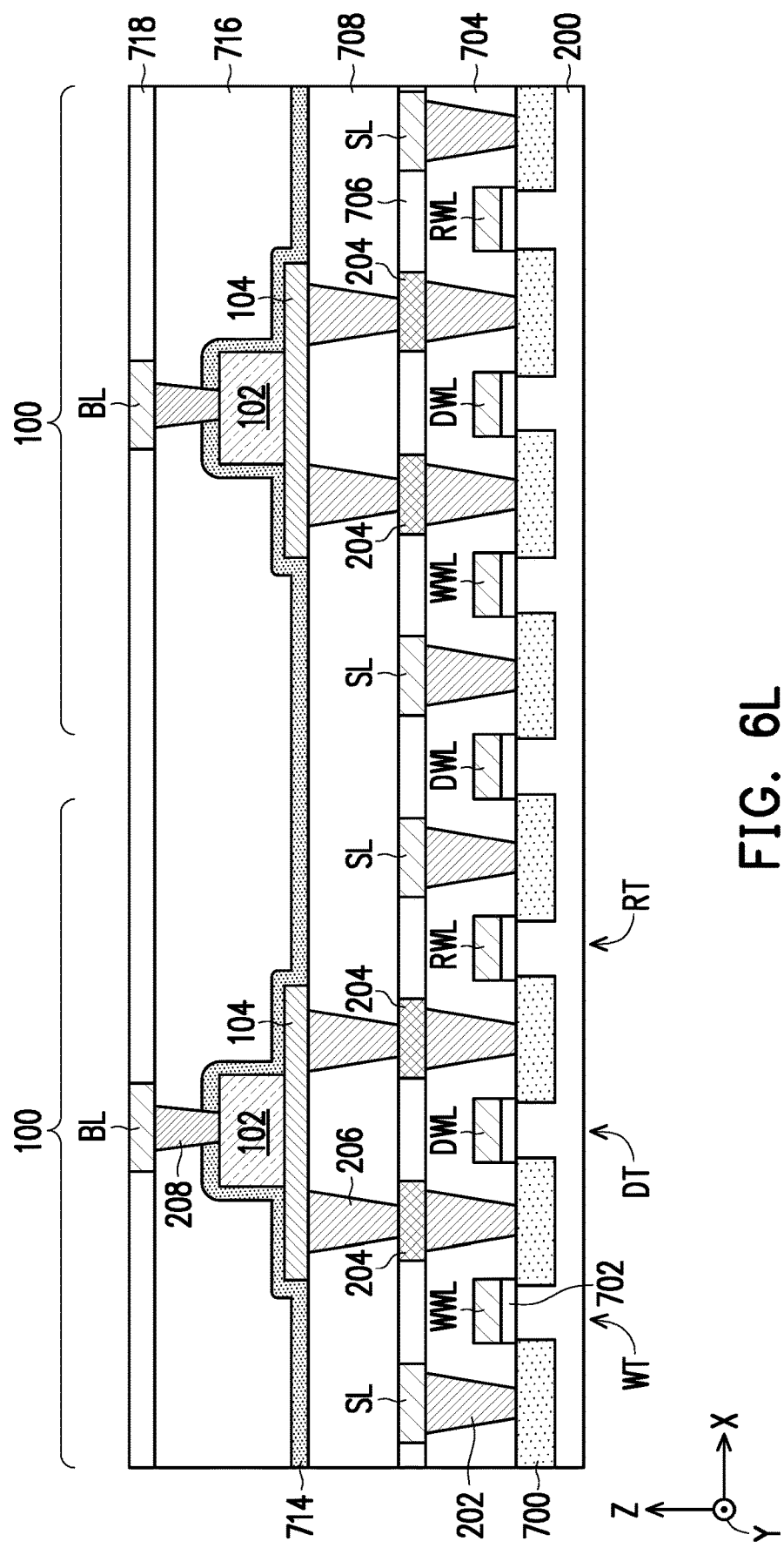

Referring to FIG. 5 and FIG. 6L, step S624 is performed, and a dielectric layer 718 as well as the bit lines BL are formed on the dielectric layer 716. The dielectric layer 718 laterally surrounds the bit lines BL. The bit lines BL vertically overlap and electrically connect with the top vias 208. In some embodiments, the method for forming the dielectric layer 718 and the bit lines BL includes a damascene process (e.g., a single damascene process). In alternative embodiments, the dielectric layer 716, the dielectric layer 718, the top vias 208 and the bit lines BL are formed by a dual damascene process.

Up to here, the unit cells 100 in the memory array 10 described with reference to FIG. 1A and FIG. 2 are formed. It should be noted that, some of the elements described with reference to FIG. 6A through FIG. 6L and FIG. 7A through FIG. 7E (e.g., the dielectric layers 704, 706, 708, 716, 718 and the passivation layer 714) are omitted from illustration in FIG. 2. Although the SOT layers 104 and the MTJs 102 are described as being formed between first and second metallization layers from bottom of the BEOL structure BE, the SOT layers 104 and the MTJs 102 may be alternatively formed between other vertically adjacent metallization layers in the BEOL structure BE, and more conductive features may be formed in the BEOL structure BE for routing the SOT layers 104 and the MTJs 102. In addition, further BEOL process may be performed to form a device wafer. Moreover, the device wafer may be subjected to a packaging process to form a plurality of semiconductor packages.

Figure 8:
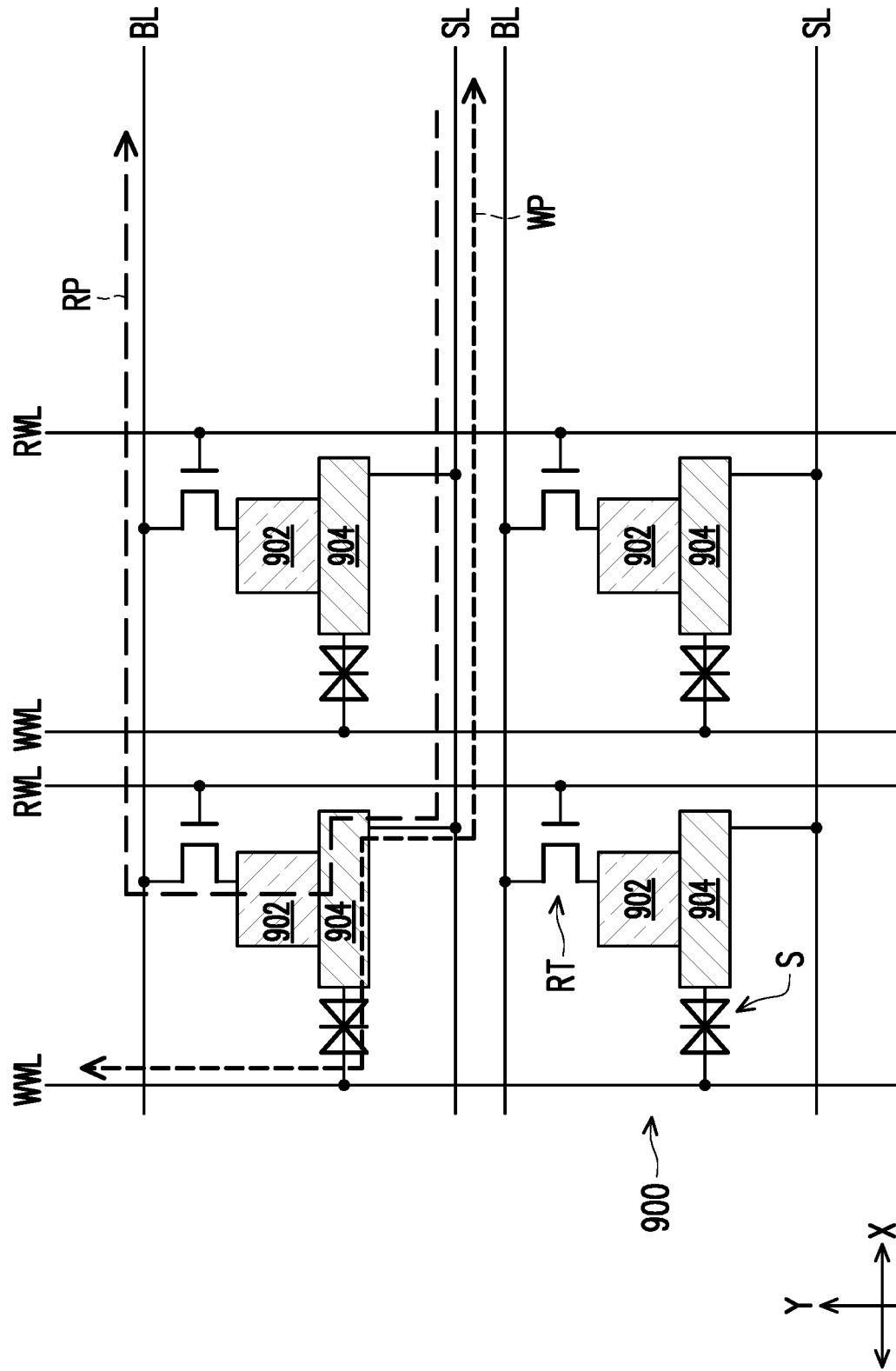
FIG. 8 is a circuit diagram illustrating a memory array according to some other embodiments of the present disclosure.

FIG. 8 is a circuit diagram illustrating a memory array 90 according to some embodiments of the present disclosure.

Referring to FIG. 8, as similar to the memory array 10 as described with reference to FIG. 1A, the memory array 90 includes a plurality of the unit cells 900 arranged along rows and columns. In detail, as shown in FIG. 8, each row of the unit cells 900 is arranged along the direction X, while each column of the unit cells 900 is arranged along the direction Y. In addition, each column of the unit cells 900 is coupled with a pair of a write word line WWL and a read word line RWL, while each row of the unit cells 900 is coupled with a pair of a bit line BL and a source line SL. Although not shown, the write word lines WWL and the read word lines RWL may be coupled with a word line driver circuit, the bit lines BL may be coupled with a bit line driver circuit, and the source lines SL may be coupled with a current source circuit, as described with reference to FIG. 1A.

Each unit cell 900 includes a MTJ 902 and a SOT layer 904 in contact with a synthetic free layer in the MTJ 902. As will be described with reference to FIG. 9, the stacking order of the MTJ 902 and the SOT layer 904 may be different from the stacking order of the MTJ 102 and the SOT layer 104 as described with reference to FIG. 2. Further, in some embodiments, the SOT layer 904 is coupled with the corresponding write word line WWL through a selector S, while being coupled with the corresponding read word line RWL without a selector or a transistor in between. Moreover, in some embodiments, the MTJ 902 is coupled with a bit line BL through a read transistor RT.

The selector S is a two-terminal switching device formed of a pair of electrodes and a switching layer sandwiched between the electrodes. When a sufficient bias is set across the electrodes, the selector S is turned on, and a current can flow through the selector S. On the other hand, if the selector S is not biased or a bias voltage is not sufficient, the selector S is in an off state, and a current may be blocked from flowing through the selector S. In this way, the coupling between the SOT layer 904 and the write word line WWL can be controlled by the selector S. In some embodiments, the selector S is an exponential type selector or a threshold type selector. An exponential I-V curve may be observed on the exponential type selector, while a "snapback" I-V curve may be observed on the threshold type selector. For instance, the exponential type selector may be a metal-insulator-metal (MIM) based selector, and the threshold type selector may be a threshold switching selector (e.g., an ovonic threshold switching (OTS) selector, a metal-insulator-transition (MIT) selector, a field assist superlinear threshold (FAST) selector, a mixed ionic-electron conduction (MIEC) selector or the like).

During a programming operation, the selector S of a selected unit cell 900 is turned on.

By setting a voltage difference between the write word line WWL and the source line SL coupled with the selected unit cell 900, a write current WP may flow from the selected write word line WWL to the selected source line SL through the selector S and the SOT layer 904 in between, or vice versa. As a result of spin orbit interaction, the write current WP flowing through the SOT layer 904 may induce a SOT on the MTJ 902, thus the MTJ 902 can be subjected to programming. On the other hand, the read transistor RT of the selected unit cell 900 may be kept in an off state, along with the selectors S and the read transistors RT in unselected unit cells 900.

During a read operation, the read transistor RT of a selected unit cell 900 is turned on. By setting a voltage difference between the bit line BL and the source line SL coupled with the selected unit cell 900, a read current RP may flow from the selected source line SL to the selected bit line BL through the SOT layer 904, the MTJ 102 and the read transistor RT in between, or vice versa. Due to a spin orbit coupling effect, different magnetization orientations of the MTJ 902 (i.e., the parallel state and the anti-parallel state) may result in difference electrical resistances of the MTJ 902, and may affect a value of the read current RP or a value of a voltage drop across the MTJ 902. Therefore, the bit data stored in the MTJ 902 can be read out. On the other hand, the selector S of the selected unit cell 900 is kept in an off state, along with the read transistors RT and the selectors S in unselected unit cells 900.

Figure 9:
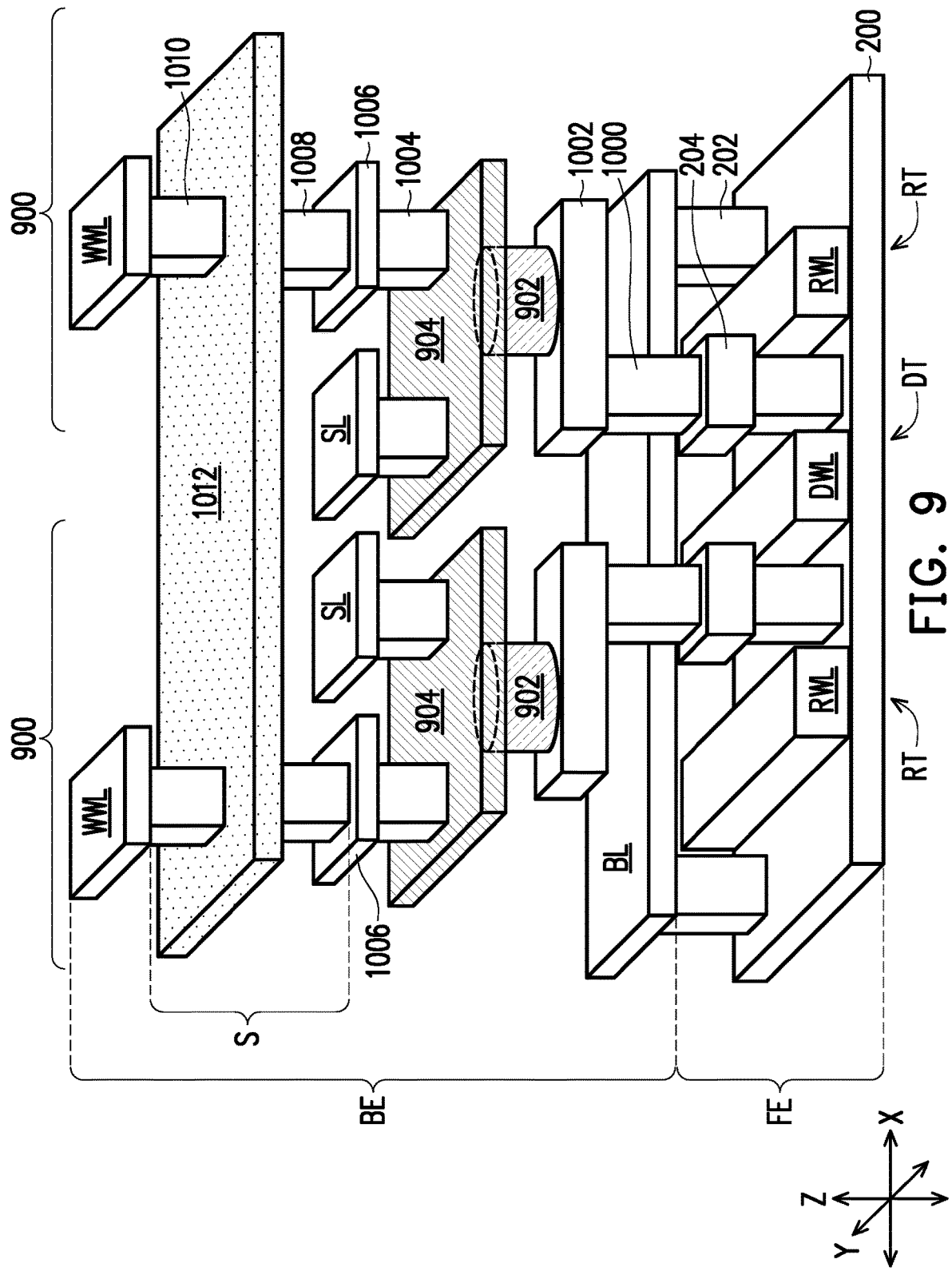
FIG. 9 is a schematic three-dimensional view illustrating adjacent ones of the unit cells in the memory array as shown in FIG. 8, according to some embodiments of the present disclosure.

FIG. 9 is a schematic three-dimensional view illustrating adjacent ones of the unit cells 900 in the memory array 90 as shown in FIG. 8, according to some embodiments of the present disclosure. The structure of the unit cell 900 shown in FIG. 9 is similar to the structure of the unit cell 100 as described with reference to FIG. 2. Only differences between the unit cells 100, 900 will be described, while the same or the like parts in the unit cells 100, 900 may not be repeated again.

Referring to FIG. 9, the FEOL structure FE may no longer include the write transistors WT as described with reference to FIG. 2. Further, the bit line BL coupled with the read transistors RT may be a portion of a bottom metallization layer in the BEOL structure BE, along with the landing pads 204. The bit line BL and the landing pads 204 may be connected with the source and drain terminals of the read transistors RT through the contact plugs 202. Vias 1000 may stand on the landing pads 204 along the direction Z, respectively. In some embodiments, landing pads 1002 in another metallization layer are disposed on the vias 1000. The landing pads 1002 vertically overlap and electrically connect with the vias 1000.

According to some embodiments, the MTJs 902 are in contact with the SOT layers 904 from below the SOT layers 904, rather than standing on the SOT layers 904. In detail, as shown in FIG. 9, the MTJs 902 stand on the landing pads 1002, and the SOT layers 904 lie on and stack on the MTJs 902. The MTJ 902 may include the layers in the MTJ 102 as described with reference to FIG. 3A, the layers in the MTJ 102a as described with reference to FIG. 3B, the layers in the MTJ 102b as described with reference to FIG. 3C or the layers in the MTJ 102c as described with reference to FIG. 3D, but in a reverse stacking order. In other words, the synthetic free layer 300, 300a, 300b or 300c may be the top layer in the MTJ 902, while the capping layer 328 may be the bottom layer in the MTJ 902. In addition, the SOT layer 904 may be identical with the SOT layer 104 as described with reference to FIG. 1A, FIG. 2, except that the SOT layer 904 lies on the MTJ 902. In some embodiments, the diffusion barrier 314 as described with reference to FIG. 3E may be further disposed between the MTJ 902 and the SOT layer 904. Further, vias 1004 may stand on the SOT layers 904, and landing pads 1006 as well as the source lines SL cover and electrically connect with the vias 1004. Each SOT layer 904 may be connected with one of the source lines SL and one of the landing pads 1006 through the vias 1004 in between.

The selectors S may be disposed on the landing pads 1006. In some embodiments, the selectors S include bottom vias 1008, top vias 1010 overlapping the bottom vias 1008, and a switching layer 1012 lying between the bottom vias 1008 and the top vias 1010. In these embodiments, as shown in FIG. 9, the selectors S share the common switching layer 1012. The material of the switching layer 1012 may be chosen such that, when biased, electrons may flow across the shortest distance through the switching layer 1012, and not into neighboring unit cells 900. In other words, the biasing has a local effect so that even though the switching layer 1012 laterally extends to neighboring unit cells 900, the biasing may only be locally effective to allow electrons to flow through the switching layer 1012 along the direction Z (i.e., the vertical direction) (e.g., from the top via 1010 to the bottom via 1008, or vice versa). For instance, the switching layer 1012 may be formed of a material including hafnium oxide, and may be doped with Cu, Al, N, P, S, Si, Zr, Gd, Ti, La, Ti, the like or combinations thereof. Moreover, the write word lines WWL may respectively lie on the top vias 1010.

By using the selectors S integrated in the BEOL structure BE for replacing the write transistors WT, a footprint area of each unit cell 900 may be significantly reduced. Accordingly, a storage density of the memory array 90 can be effectively increased. In addition, by disposing the SOT layers 904 over the MTJs 902, a material of a seed layer (not shown) as a growth template for the MTJs 902 can be more flexibly chosen without affecting the spin orbit interaction used for a programming operation. Therefore, layers in the MTJs 902 may have an improved crystalline property, and a tunneling magnetoresistance (TMR) of the MTJs 902 may be enhanced.

Figure 10:
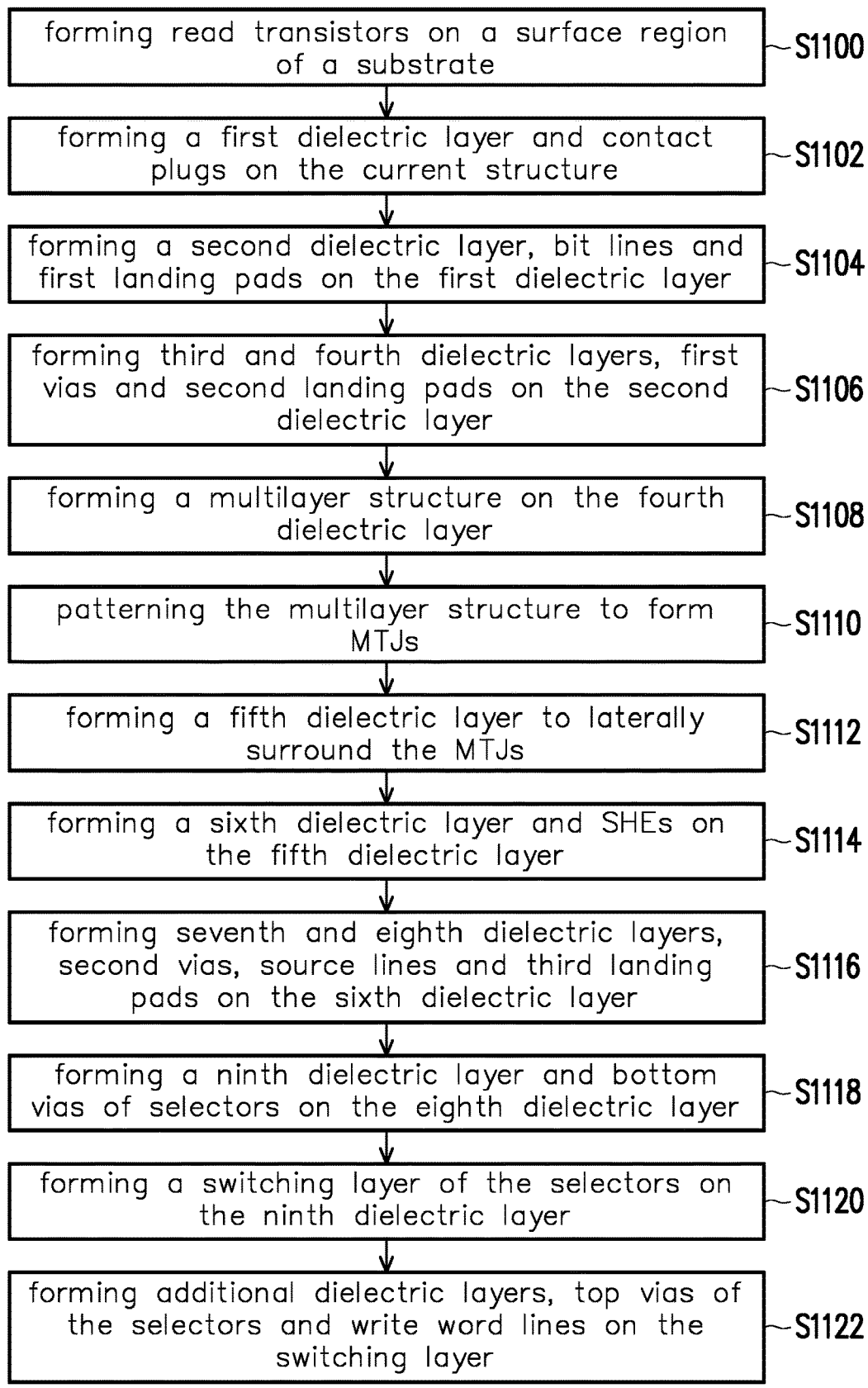
FIG. 10 is a flow diagram illustrating a method for manufacturing adjacent ones of the unit cells described with reference to FIG. 9, according to some embodiments of the present disclosure.

FIG. 10 is a flow diagram illustrating a method for manufacturing adjacent ones of the unit cells 900 described with reference to FIG. 9, according to some embodiments of the present disclosure. FIG. 11A through FIG. 11L are schematic cross-sectional views illustrating intermediate structures during the manufacturing process as shown in FIG. 10.

It should be noted that, the manufacturing process shown in FIG. 10 and FIG. 11A through FIG. 11L is similar to the manufacturing process described with reference to FIG. 5 and FIG. 6A through FIG. 6L, thus only differences between these manufacturing processes will be described. The same or similar parts in these manufacturing processes may not be repeated again, and the same or similar elements may be labeled identically. As an example, the similar/identical parts may include using single damascene processes, dual damascene processes or combinations thereof for forming dielectric layers and conductive features (e.g., contact plugs, landing pads and vias) in the dielectric layers.

Figure 11A:
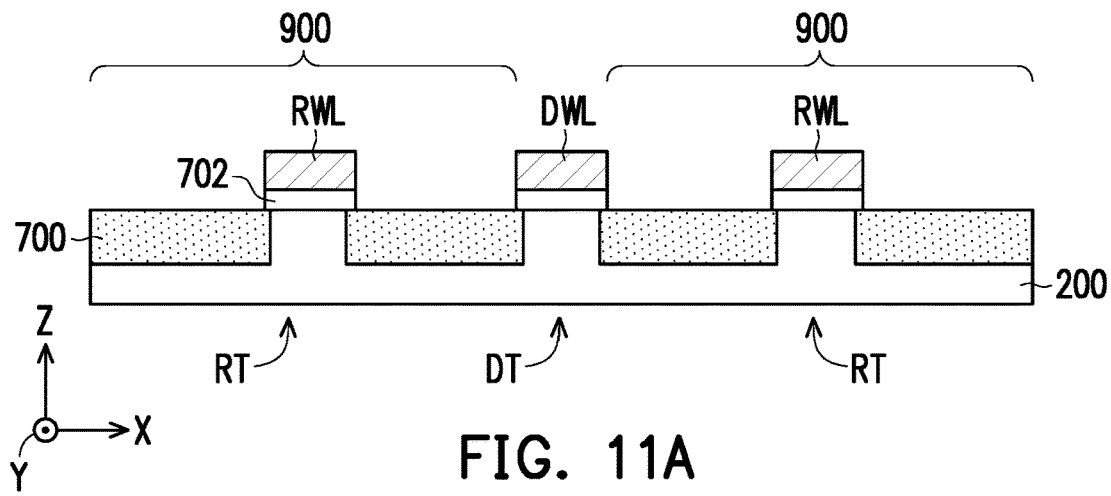
FIG. 11A through FIG. 11L are schematic cross-sectional views illustrating intermediate structures during the manufacturing process as shown in FIG. 10.

Referring to FIG. 10 and FIG. 11A, step S1100 is performed, and the read transistors RT are formed on a surface region of the substrate 200. In some embodiments, the isolation transistors DT are formed along with the read transistors RT. In these embodiments, the dummy word lines DWL are respectively formed between adjacent ones of the read word lines RWL. In detail, as shown in FIG. 11A, the dummy word line DWL is laterally spaced apart from the corresponding read word lines RWL along the direction X.

Figure 11B:
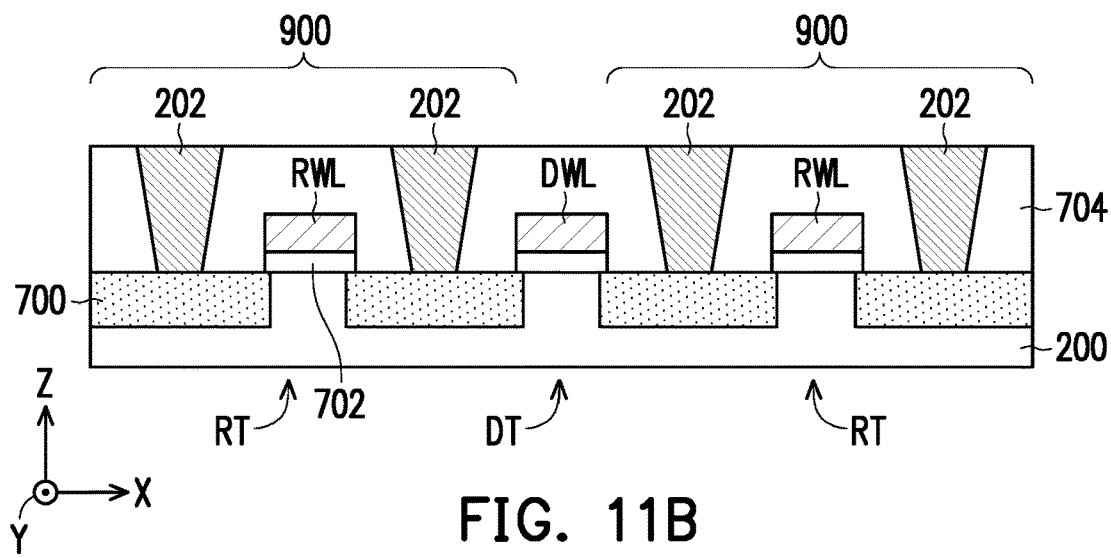

Referring to FIG. 10 and FIG. 11B, step S1102 is performed, and the dielectric layer 704 as well as the contact plugs 202 are formed over the substrate 200. The contact plugs 202 penetrate through the dielectric layer 704 along the direction Z, to establish electrical connection with the source/drain structures 700 of the read transistors RT.

Figure 11C:
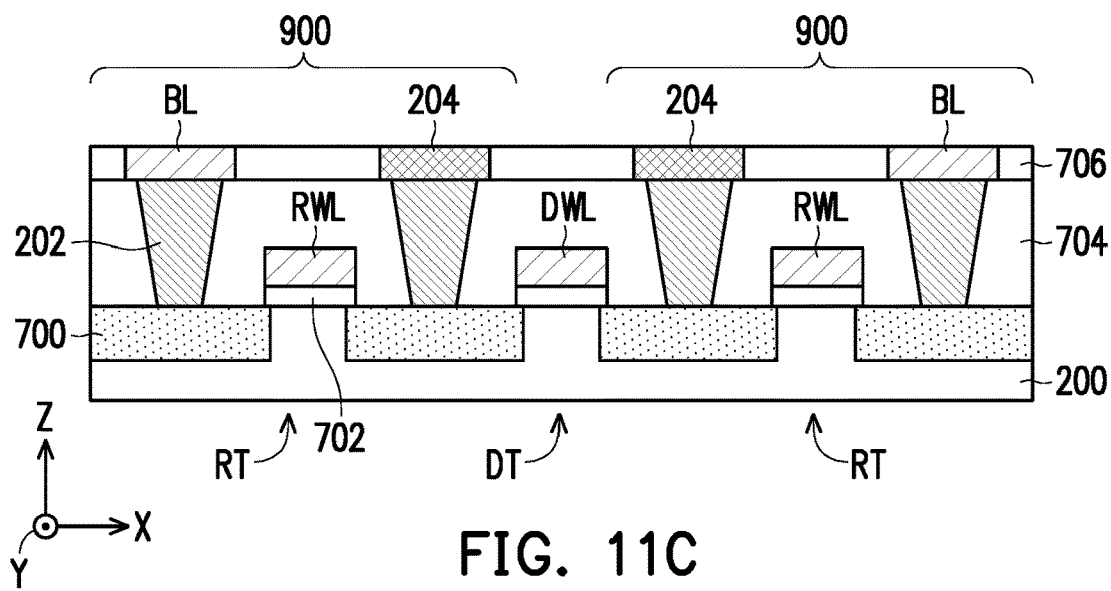

Referring to FIG. 10 and FIG. 11C, step S1104 is performed, and the dielectric layer 706 as well as the bit lines BL and the landing pads 204 are formed over the dielectric layer 704.

The bit lines BL and the landing pads 204 are laterally surrounded by the dielectric layer 704. The source/drain structures 700 of each read transistor RT are connected with one of the landing pads 204 and one of the bit lines BL through the contact plugs 202 in between. Although illustrated otherwise hereinafter, adjacent read transistors RT in the same row may be coupled with the same bit line BL, as described with reference to FIG. 8.

Figure 11D:
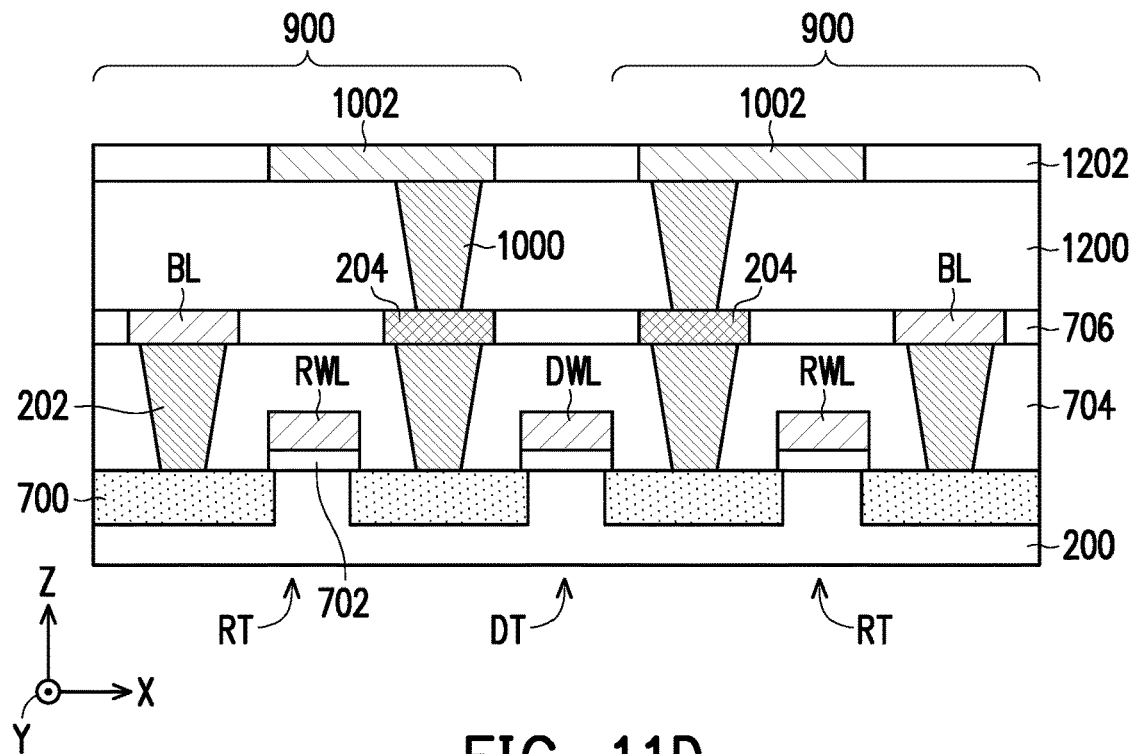

Referring to FIG. 10 and FIG. 11D, step S1106 is performed, and dielectric layers 1200, 1202 as well as the vias 1000 and the landing pads 1002 are formed over the dielectric layer 706. The dielectric layer 1202 is stacked on the dielectric layer 1200 along the direction Z. The vias 1000 vertically extend through the dielectric layer 1200, to reach the underlying landing pads 204 embedded in the dielectric layer 706, so as to establish electric connection with the landing pads 204. The landing pads 1002 are laterally surrounded by the dielectric layer 1202, and vertically overlap and electrically connect with the vias 1000, respectively.

Figure 11E:
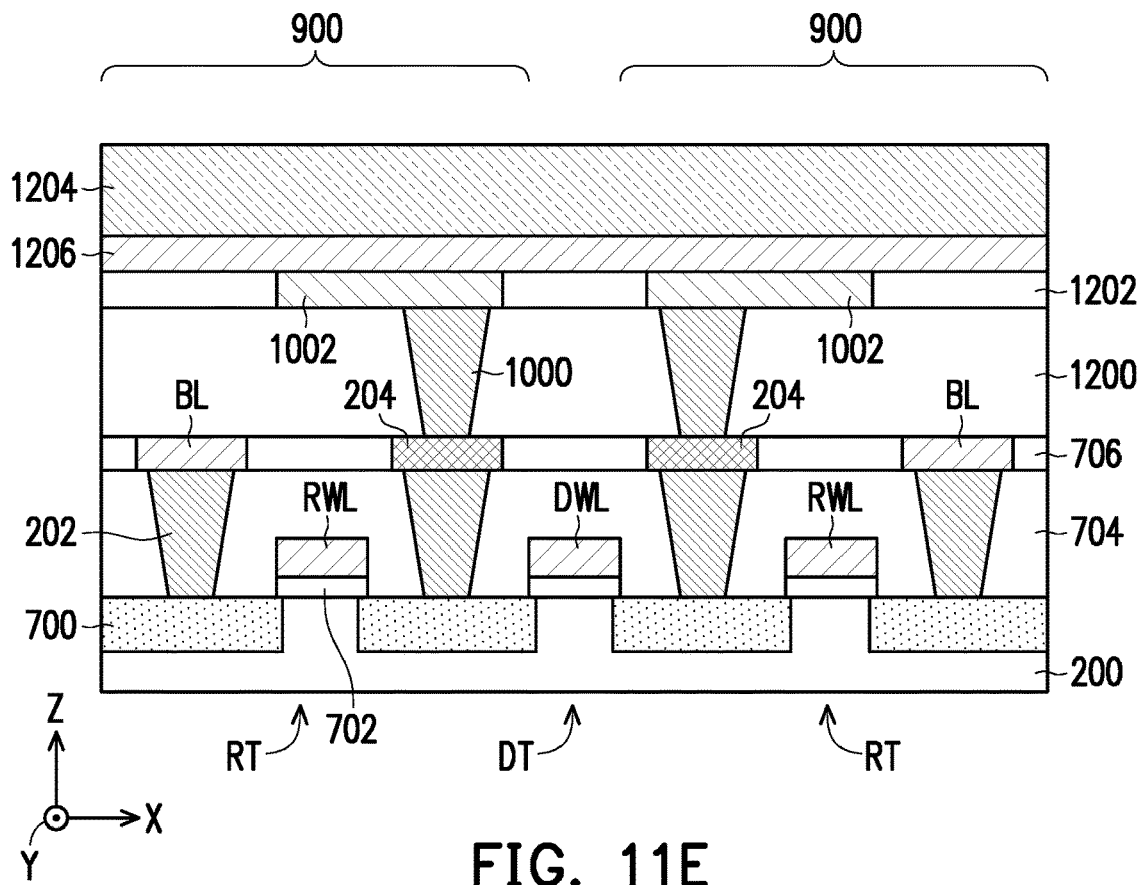

Referring to FIG. 10 and FIG. 11E, step S1108 is performed, and a multilayer structure 1204 is formed on the dielectric layer 1202. The multilayer structure 1204 will be patterned to form the MTJ 902 as described with reference to FIG. 8 and FIG. 9 in the subsequent step. In some embodiments, the method for forming the multilayer structure 1204 includes multiple deposition processes, and each deposition process includes a sputtering process, a co-sputtering process or combinations thereof.

In some embodiments, an electrode layer 1206 is pre-formed on the dielectric layer 1202 before the formation of the multilayer structure 1204. In these embodiments, the electrode layer 1206 may be patterned along with the multilayer structure 1204 in a subsequent step. The method for forming the electrode layer 1206 may include a sputtering process or a co-sputtering process.

Figure 11F:
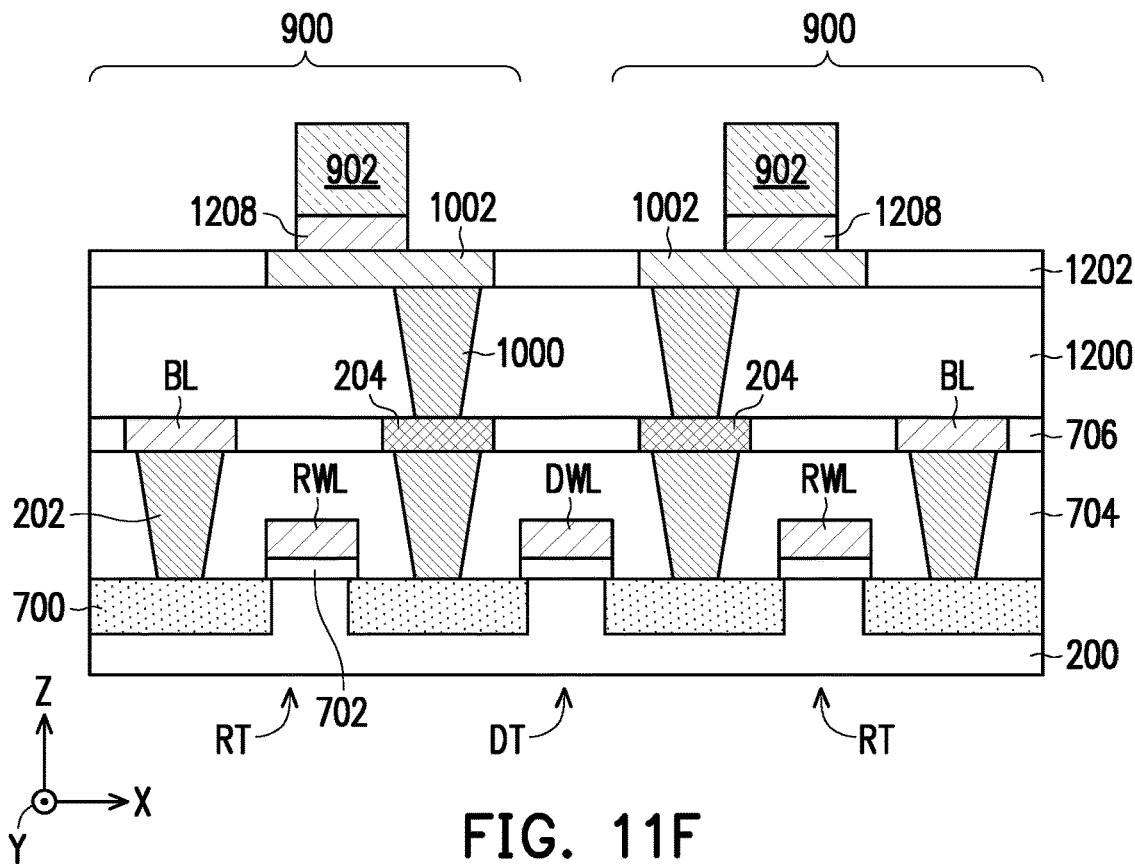

Referring to FIG. 10 and FIG. 11F, step S1110 is performed, and the multilayer structure 1204 is patterned to form the MTJs 902. Such patterning may include a lithography process and one or more etching processes. In those embodiments where the electrode layer 1206 is pre-formed on the dielectric layer 1202 before the formation of the multilayer structure 1204, the electrode layer 1206 may be patterned along with the multilayer structure 1204, to form electrodes 1208.

Figure 11G:
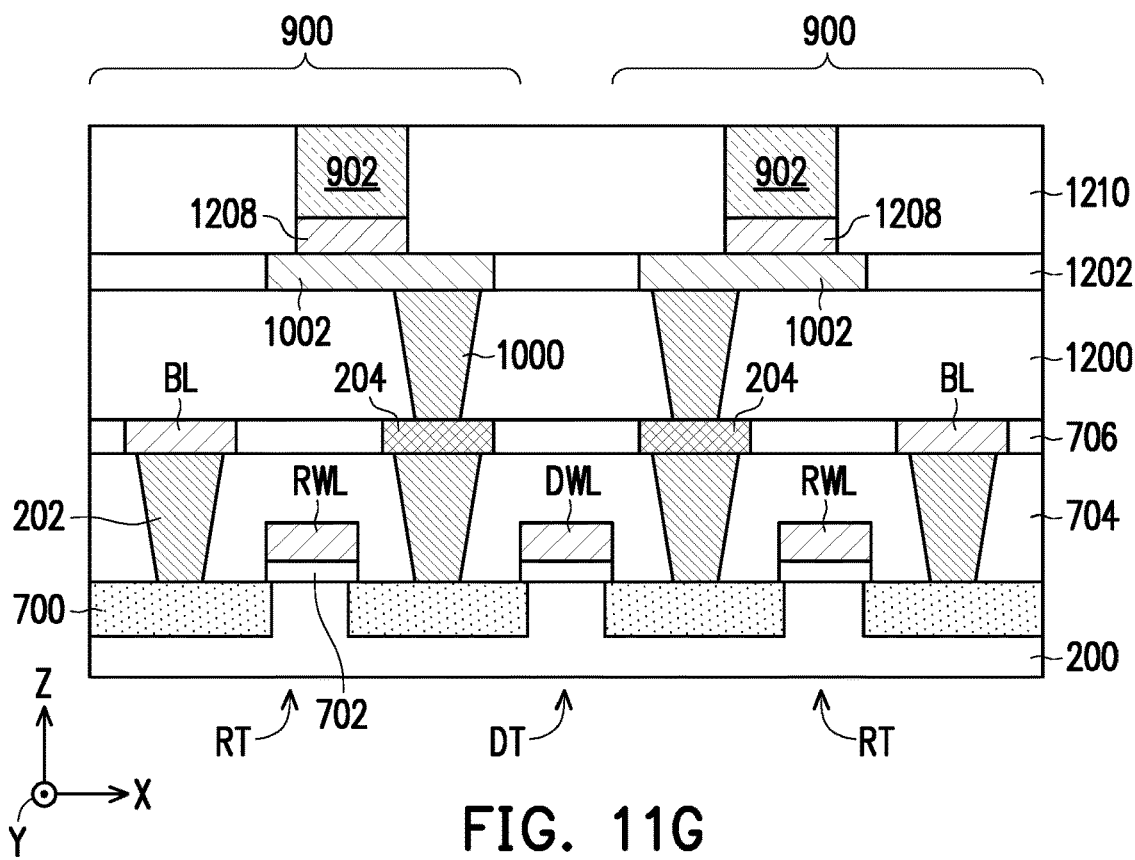

Referring to FIG. 10 and FIG. 11G, step S1112 is performed, and a dielectric layer 1210 is formed to laterally surround the MTJs 902. The method for forming the dielectric layer 1210 may include a deposition process (e.g., a CVD process) and a planarization process (e.g., a polishing process, an etching process or a combination thereof).

Figure 11H:
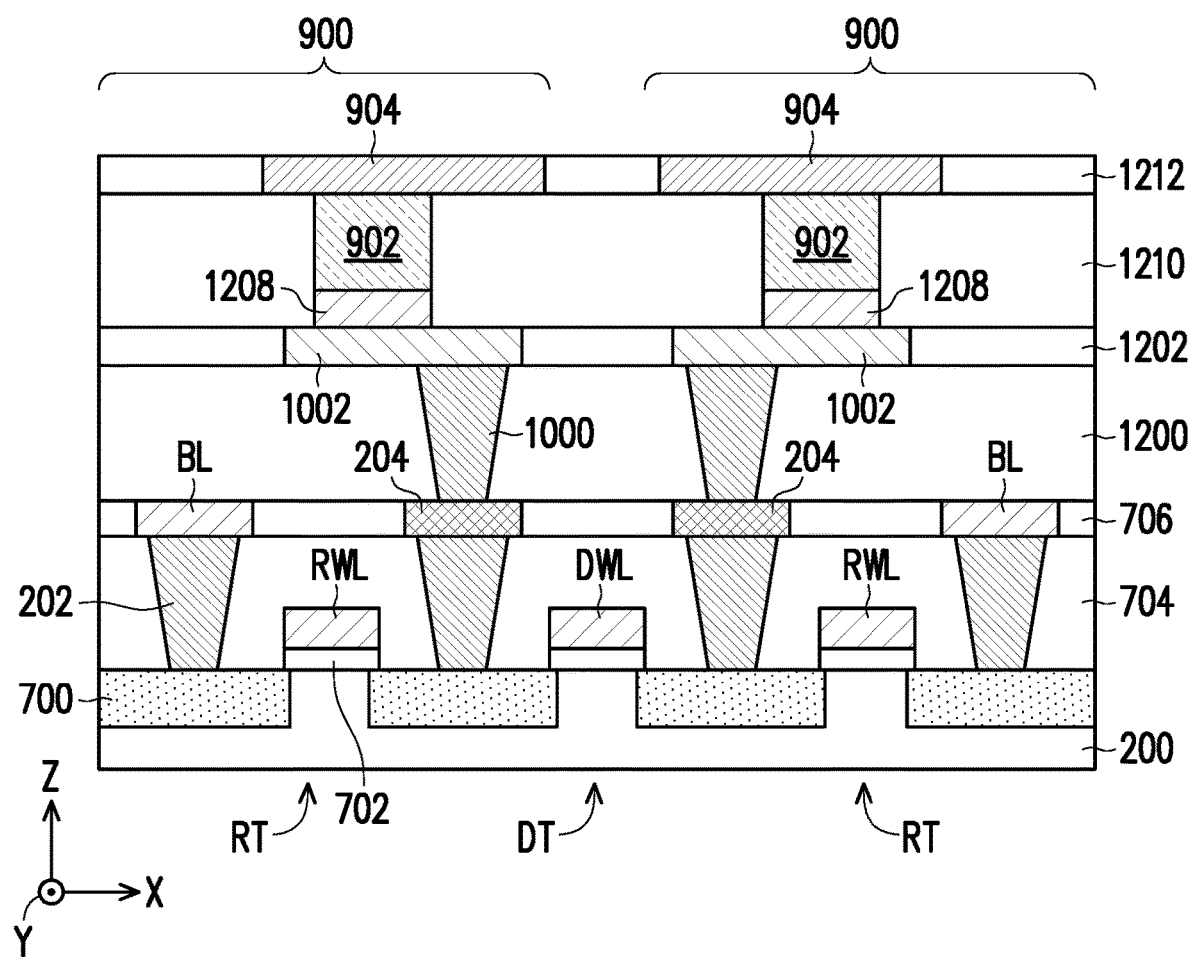

Referring to FIG. 10 and FIG. 11H, step S1114 is performed, and a dielectric layer 1212 as well as the SOT layers 904 are formed over the dielectric layer 1210. The SOT layers 904 are laterally surrounded by the dielectric layer 1212. According to some embodiments, the method for forming the dielectric layer 1212 may include forming a dielectric material layer on the dielectric layer 1210 and the MTJs 902. Subsequently, the dielectric material layer may be patterned to form the dielectric layer 1212 with openings by a lithography process and an etching process. Thereafter, a spin Hall material layer may be formed on the dielectric layer 1212, and may fill up the openings of the dielectric layer 1212. In some embodiments, the method for forming the spin Hall material layer may include a sputtering process or a co-sputtering process, and may include a subsequent thermal treatment. Further, a planarization process may be performed for removing portions of the spin Hall material layer above the dielectric layer 1212. Remained portions of the spin Hall material layer with in the openings may form the SOT layers 904.

Figure 11I:
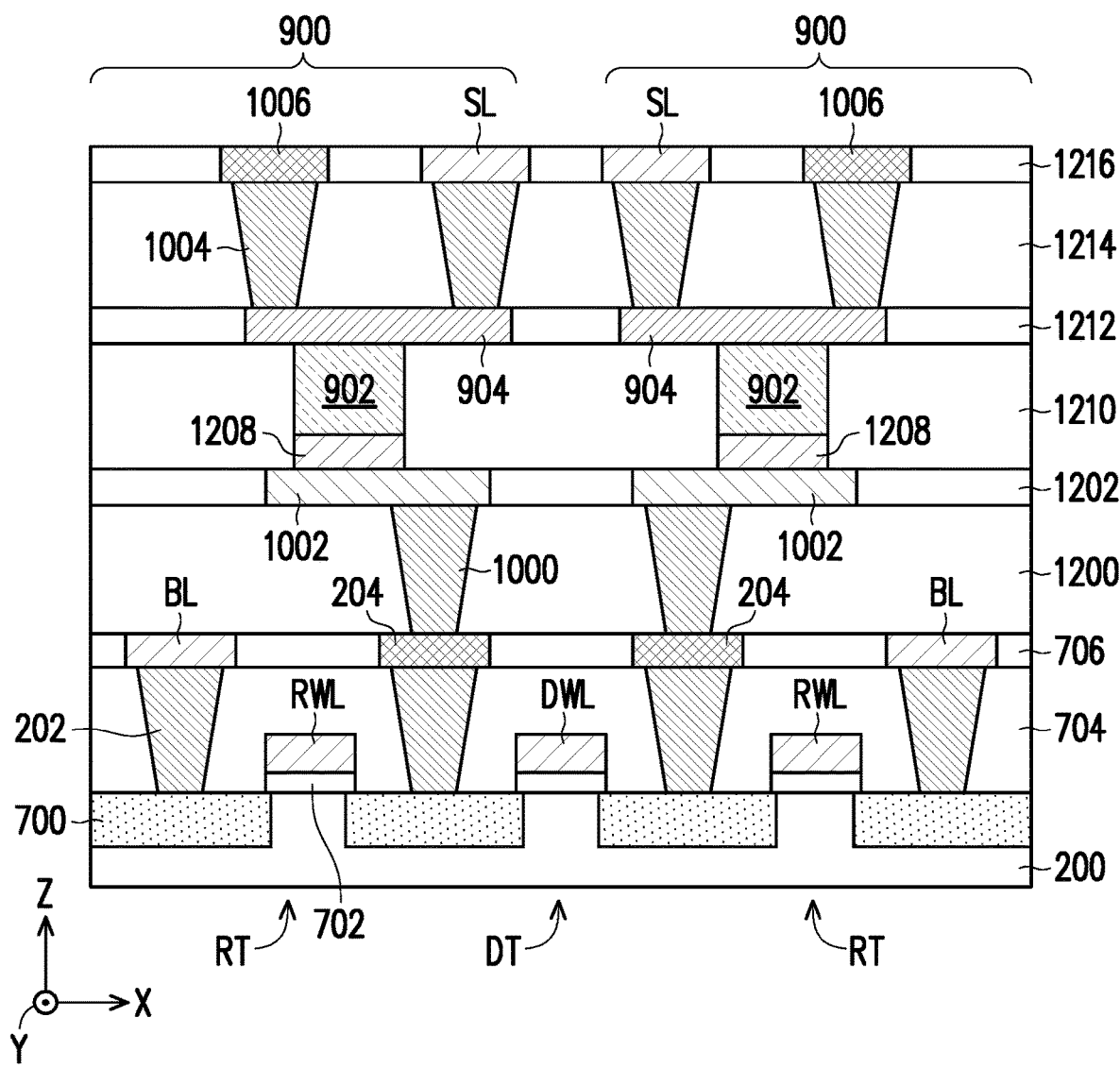

Referring to FIG. 10 and FIG. 11I, step S1116 is performed, and dielectric layers 1214, 1216 as well as the vias 1004, the source lines SL and the landing pads 1006 are formed over the dielectric layer 1212. The dielectric layer 1216 is stacked on the dielectric layer 1214 along the direction Z. The vias 1004 vertically penetrate through the dielectric layer 1214, to reach the SOT layers 904 embedded in the dielectric layer 1212, so as to establish electrical connection with the SOT layers 904. The landing pads 1006 and the source lines SL are laterally surrounded by the dielectric layer 1216, and vertically overlap and electrically connect with the vias 1004. Each SOT layer 904 may be electrically connected with one of the source lines SL and one of the landing pads 1006 through the vias 1004 in between. It should be noted that, although illustrated otherwise hereinafter, adjacent read transistors RT in the same row may be coupled with the same source line SL, as described with reference to FIG. 8.

Figure 11J:
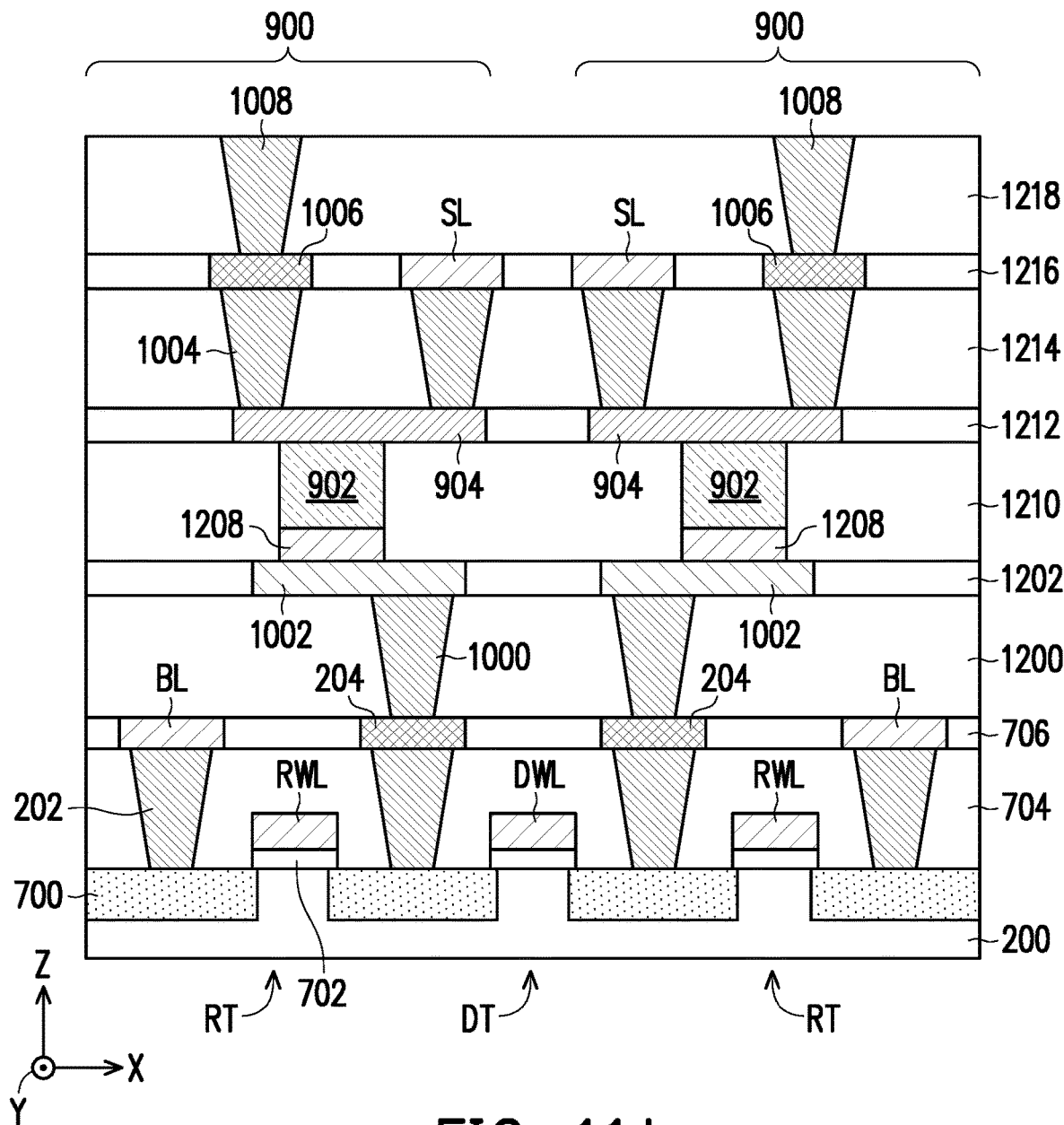

Referring to FIG. 10 and FIG. 11J, step S1118 is performed, and a dielectric layer 1218 and the bottom vias 1008 of the selectors S are formed over the dielectric layer 1216. The bottom vias 1008 vertically penetrate through the dielectric layer 1218, to reach the landing pads 1216, in order to establish electrical connection with the landing pads 1216.

Figure 11K:
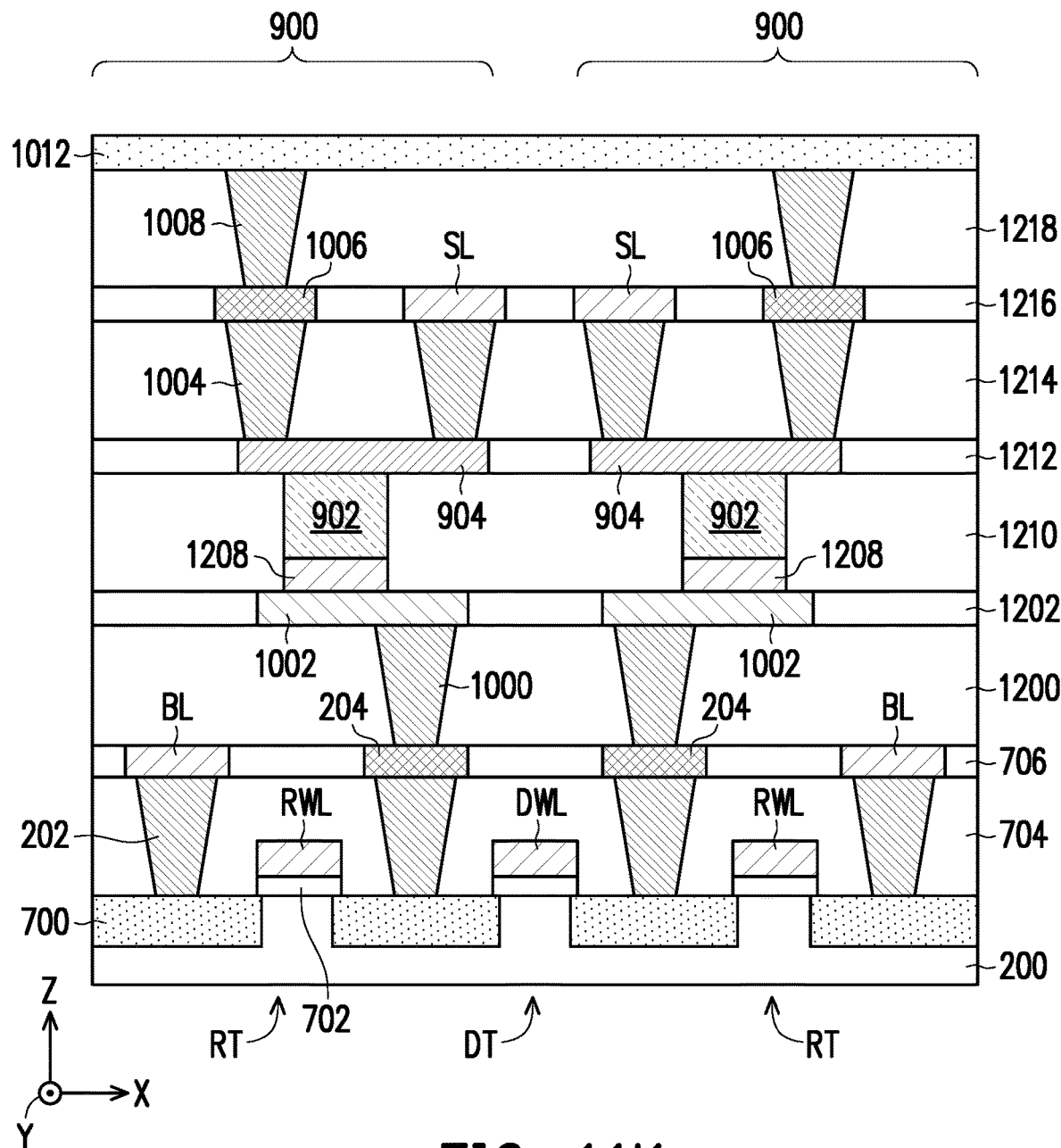

Referring to FIG. 10 and FIG. 11K, step S1120 is performed, and the switching layer 1012 of the selectors S is formed on the dielectric layer 1218. According to some embodiments, the switching layer 1012 is globally formed on the dielectric layer 1218. In some embodiments, the method for forming the switching layer 1012 includes a deposition process, such as a CVD process or a physical vapor deposition (PVD) process.

Figure 11L:
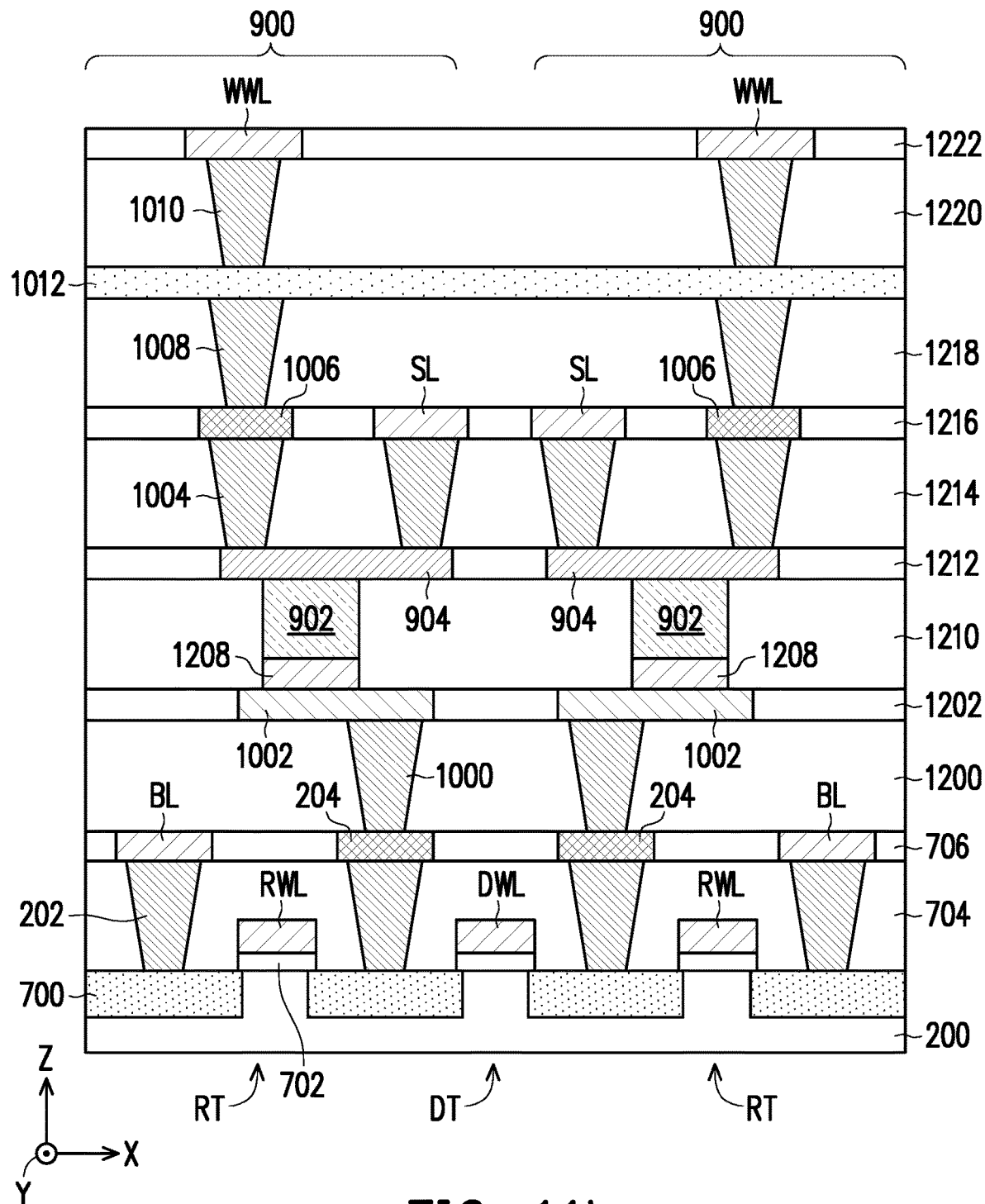

Referring to FIG. 10 and FIG. 11L, step S1122 is performed, and dielectric layers 1220, 1222 as well as the top vias 1010 of the selectors S and the write word lines WWL are formed over the switching layer 1012. The dielectric layer 1222 is stacked on the dielectric layer 1220 along the direction Z. The top vias 1010 vertically penetrate through the dielectric layer 1222 to reach the switching layer 1012, and may overlap the bottom vias 1008 along the direction Z. The write word lines WWL are laterally surrounded by the dielectric layer 1222, and vertically overlap and electrically connect with the top vias 1010.

Up to here, the unit cells 900 in the memory array 90 described with reference to FIG. 8 and FIG. 9 are formed. It should be noted that, some of the elements described with reference to FIG. 11A through FIG. 11L (e.g., the dielectric layers 704, 706, 1200, 1202, 1210, 1212, 1214, 1216, 1218 and the electrodes 1208) are omitted from illustration in FIG. 9. Although the SOT layers 904 and the MTJs 902 are described as being formed between second and third metallization layers from bottom of the BEOL structure BE, the SOT layers 904 and the MTJs 902 may be alternatively formed between other vertically adjacent metallization layers in the BEOL structure BE, and more or fewer conductive features may be formed in the BEOL structure BE for routing the SOT layers 904 and the MTJs 902. In addition, further BEOL process may be performed to form a device wafer. Moreover, the device wafer may be subjected to a packaging process to form a plurality of semiconductor packages.

It should be noted that, although a storage element of first type including the MTJ 102 standing on the SOT layer 104 is described as being driven by the write transistor WT and the read transistor RT in the FEOL structure FE (as shown in FIG. 2), and a storage element of second type including the MTJ 902 in contact with the SOT layer 904 from below is described as being driven by the read transistor WT in the FEOL structure FE and the selector S in the BEOL structure BE (as shown in FIG. 9), the storage element of first type may be alternatively driven by a combination of a transistor and a selector, and the storage element of second type may be alternatively driven by two transistors. Other driving schemes may also be available to the storage element of first type and the storage element of second type, and routings between the drivers and the storage element may be modified accordingly. The present disclosure is not limited to the driving scheme of the storage elements.

In accordance with an embodiment, a memory device includes a substrate, a spin-orbit torque layer and a magnetic tunneling junction. The magnetic tunneling junction stacks with the spin-orbit torque layer over the substrate and includes a synthetic free layer, a barrier layer and a reference layer. The synthetic free layer includes a synthetic antiferromagnetic structure, a first spacer layer and a free layer, wherein the synthetic antiferromagnetic structure is disposed between the spin-orbit torque layer and the free layer, and the synthetic antiferromagnetic structure is configured to alter a magnetization direction of the free layer.

In accordance with an embodiment, a memory device includes a write transistor, a read transistor, a spin-orbit torque layer, a magnetic tunneling junction and a bit line. The write transistor and the read transistor are formed on a surface region of a substrate. The spin-orbit torque layer lies over the write transistor and the read transistor, and is electrically connected with a first terminal of the write transistor and a second terminal of the read transistor. The magnetic tunneling junction stands on the spin-orbit torque layer and is electrically coupled with the spin-orbit torque layer by a first terminal of the magnetic tunneling junction, wherein the magnetic tunneling junction includes a synthetic free layer, a barrier layer and a reference layer. The synthetic free layer includes a synthetic antiferromagnetic structure, a free layer and a first exchange coupling metal layer between the synthetic antiferromagnetic structure and the free layer, wherein the synthetic antiferromagnetic structure is closer to the spin-orbit torque layer than the free layer. The barrier layer is disposed over the synthetic free layer. The reference layer is disposed over the barrier layer. The bit line is electrically coupled with a second terminal of the MTJ.

In accordance with an embodiment, a memory device includes a read transistor, a bit line, a spin-orbit torque layer, a magnetic tunneling junction, a selector and a write word line. The read transistor is formed on a surface region of a substrate, and includes a read word line extending on the substrate. The bit line lies over the read word line and is coupled with a first terminal of the read transistor. The spin-orbit torque layer is disposed over the read transistor. The magnetic tunneling junction is disposed under the spin-orbit torque layer, wherein the magnetic tunneling junction is electrically coupled with a second terminal of the read transistor by a first terminal of the magnetic tunneling junction and electrically coupled with the spin-orbit torque layer by a second terminal of the magnetic tunneling junction, and the magnetic tunneling junction includes a synthetic free layer, a barrier layer and a reference layer. The synthetic free layer includes a synthetic antiferromagnetic structure, a free layer and a first exchange coupling metal layer between the synthetic antiferromagnetic structure and the free layer, wherein the synthetic antiferromagnetic structure is disposed between the spin-orbit torque layer and the first exchange coupling metal layer. The barrier layer is disposed under the synthetic free layer. The reference layer is disposed under the barrier layer. The selector is disposed over the spin-orbit torque layer and electrically coupled with the spin-orbit torque layer by a first terminal of the selector. The write word line lies over the selector and is electrically coupled with a second terminal of the selector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a spin hall electrode;
   a magnetic tunneling junction (MTJ) disposed beside the spin hall electrode and comprising:
      a synthetic free layer comprising a synthetic antiferromagnetic structure, a first exchange coupling layer and a free layer, wherein the synthetic antiferromagnetic structure is disposed between the spin hall electrode and the free layer, and the synthetic antiferromagnetic structure is configured to alter a magnetization direction of the free layer;
      a reference layer disposed beside the synthetic free layer; and
      a barrier layer disposed between the synthetic free layer and the reference layer; and;
   a diffusion barrier lying between the MTJ and the spin hall electrode, wherein the diffusion barrier is formed of a non-magnetic conductive material.

2. The memory device according to claim 1, wherein the synthetic antiferromagnetic structure comprises:
   a first ferromagnetic layer with a first magnetization direction;
   a second ferromagnetic layer with a second magnetization direction different from the first magnetization direction; and
   a second exchange coupling layer between the first ferromagnetic layer and the second ferromagnetic layer.

3. The memory device according to claim 2, wherein the synthetic free layer further comprises:
   a superparamagnetic layer between the spin hall electrode and the synthetic antiferromagnetic structure; and
   a third exchange coupling layer between the superparamagnetic layer and the synthetic antiferromagnetic structure.

4. The memory device according to claim 2, wherein each of the first ferromagnetic layer and the second ferromagnetic layer comprises a cobalt-chromium alloy, a cobalt-iron-nickel alloy, or a cobalt-iron alloy.

5. The memory device according to claim 3, wherein each of the first exchange coupling layer, the second exchange coupling layer and the third spacer layer comprises Ru, W, V or Ti, and a thickness of each of the first exchange coupling layer, the second exchange coupling layer and the third spacer layer ranges from 0.2 nm to 1.5 nm.

6. The memory device according to claim 3, wherein the superparamagnetic layer comprises a tungsten-cobalt alloy.

7. The memory device according to claim 1, wherein the non-magnetic conductive material includes molybdenum.

8. A memory device, comprising:
   a first transistor and a second transistor;
   a spin hall electrode, lying over the first transistor and the second transistor, and electrically connected with a terminal of the first transistor and a terminal of the second transistor;

a MTJ, standing on the spin hall electrode and electrically coupled with the spin hall electrode, wherein the MTJ comprises:
  a synthetic free layer comprising a synthetic antiferromagnetic structure, a free layer and a first antiferromagnetically coupling layer between the synthetic antiferromagnetic structure and the free layer, wherein the synthetic antiferromagnetic structure is disposed between the spin hall electrode than the first antiferromagnetically coupling layer;
  a barrier layer disposed over the synthetic free layer; and
  a reference layer disposed over the barrier layer; and
a dummy word line located between the first transistor and the second transistor.

9. The memory device according to claim 8, wherein
the terminal of the first transistor is one of source and drain terminals of the first transistor, the terminal of the second transistor is one of source and drain terminals of the second transistor; and
the synthetic antiferromagnetic structure comprises:
a first ferromagnetic layer with a first magnetization direction;
a second ferromagnetic layer with a second magnetization direction different from the first magnetization direction; and
a second antiferromagnetically coupling layer between the first ferromagnetic layer and the second ferromagnetic layer.

10. The memory device according to claim 9, wherein each of the first ferromagnetic layer and the second ferromagnetic layer comprises a cobalt-chromium alloy or a cobalt-iron-nickel alloy, the cobalt-chromium alloy is represented as $Co_{1-x}Cr_x$, wherein $0.05<x<0.2$, and the cobalt-iron-nickel alloy is represented as $Co_x$—$Fe_y$—$Ni_z$, wherein $x<0.5$, $y<0.3$, $z>0.5$.

11. The memory device according to claim 9, wherein each of the first ferromagnetic layer and the second ferromagnetic layer comprises two ferromagnetic sub-layers and a non-magnetic spacer layer sandwiched between the two ferromagnetic sub-layers, each of the two ferromagnetic sub-layers comprises a cobalt-iron alloy, the cobalt-iron alloy is represented as $Co_xFe_y$, wherein $0.1<x<0.4$, $0.5<y<0.8$, $x+y=1$, the non-magnetic spacer layer comprises Ru, W, V, Ti, Cr, Cu, Al or Ni.

12. The memory device according to claim 9, wherein the synthetic free layer further comprises:
a superparamagnetic layer between the spin hall electrode and the synthetic antiferromagnetic structure; and
a non-magnetic spacer layer between the superparamagnetic layer and the synthetic antiferromagnetic structure, wherein the superparamagnetic layer comprises a tungsten-cobalt alloy, the tungsten-cobalt alloy is represented as $W_{1-x}Co_x$, wherein $0.01<x<0.5$.

13. The memory device according to claim 8, further comprising a passivation layer, conformally covering a sidewall and a top surface of the MTJ and a top surface of the spin hall electrode.

14. The memory device according to claim 8, further comprising:
a first source line, lying over the first transistor and the second transistor, and electrically coupled with the other source/drain terminal of the first transistor; and
a second source line, lying over the first transistor and the second transistor, and electrically coupled with the other source/drain terminal of the second transistor.

15. The memory device according to claim 8, wherein the first antiferromagnetically coupling layer is in contact with the synthetic antiferromagnetic structure and the free layer.

16. A memory device, comprising:
a read transistor;
a bit line, lying over the read transistor and coupled with a first terminal of the read transistor;
a spin hall electrode, disposed over the read transistor;
a MTJ, disposed under the spin hall electrode, wherein the MTJ is electrically coupled with a second terminal of the read transistor by a first terminal of the MTJ and electrically coupled with the spin hall electrode by a second terminal of the MTJ, and the MTJ comprises:
  a synthetic free layer comprising a synthetic antiferromagnetic structure, a free layer and a first non-magnetic spacer layer between the synthetic antiferromagnetic structure and the free layer, wherein the synthetic antiferromagnetic structure is disposed between the spin hall electrode and the first non-magnetic spacer layer;
  a barrier layer disposed under the synthetic free layer; and
  a reference layer disposed under the barrier layer;
a selector, disposed over the spin hall electrode and electrically coupled with the spin hall electrode by a first terminal of the selector; and
a write word line, lying over the selector and electrically coupled with a second terminal of the selector.

17. The memory device according to claim 16, wherein
the first terminal of the read transistor is one of source and drain terminals of the read transistor, the second terminal of the read transistor is the other of the source and drain terminals of the read transistor; and
the synthetic antiferromagnetic structure comprises:
a first ferromagnetic layer with a first magnetization direction;
a second ferromagnetic layer with a second magnetization direction different from the first magnetization direction; and
a second non-magnetic spacer layer between the first ferromagnetic layer and the second ferromagnetic layer.

18. The memory device according to claim 17, wherein each of the first ferromagnetic layer and the second ferromagnetic layer comprises a single layer, the single layer comprises a cobalt-chromium alloy or a cobalt-iron-nickel alloy, the cobalt-chromium alloy is represented as $Co_{1-x}Cr_x$, wherein $0.05<x<0.2$, and the cobalt-iron-nickel alloy is represented as $Co_x$—$Fe_y$—$Ni_z$, wherein $x<0.5$, $y<0.3$, $z>0.5$.

19. The memory device according to claim 17, wherein each of the first ferromagnetic layer and the second ferromagnetic layer comprises a multilayer structure, the multilayer structure comprises a cobalt-iron alloy, the cobalt-iron alloy is represented as $Co_xFe_y$, wherein $0.1<x<0.4$, $0.5<y<0.8$, $x+y=1$.

20. The memory device according to claim 16, wherein the synthetic free layer further comprises:
a superparamagnetic layer between the spin hall electrode and the synthetic antiferromagnetic structure; and
a third non-magnetic spacer layer between the superparamagnetic layer and the synthetic antiferromagnetic structure, wherein the superparamagnetic layer comprises a tungsten-cobalt alloy, the tungsten-cobalt alloy is represented as $W_{1-x}Co_x$, wherein $0.01<x<0.5$.

* * * * *